US006260033B1

(12) United States Patent
Tatsuoka

(10) Patent No.: US 6,260,033 B1
(45) Date of Patent: Jul. 10, 2001

(54) METHOD FOR REMEDIATION BASED ON KNOWLEDGE AND/OR FUNCTIONALITY

(76) Inventor: Curtis M. Tatsuoka, 21 Crown Rd., Trenton, NJ (US) 08638

(*) Notice: Subject to any disclaimer, the term of this patent is extended or adjusted under 35 U.S.C. 154(b) by 0 days.

(21) Appl. No.: 09/192,815

(22) Filed: Nov. 16, 1998

Related U.S. Application Data

(63) Continuation-in-part of application No. 09/712,110, filed on Sep. 13, 1996, now Pat. No. 5,855,011.

(51) Int. Cl.[7] .................. G06F 17/00; G06F 17/60; G09B 7/00
(52) U.S. Cl. .................. 706/45; 706/50; 434/322; 705/7; 707/501
(58) Field of Search .................. 706/45, 50; 705/7; 434/322; 707/501

(56) References Cited

U.S. PATENT DOCUMENTS

| | | | |
|---|---|---|---|
| 4,847,784 | * 7/1989 | Glancey | 706/50 |
| 5,002,491 | * 3/1991 | Abrahamson et al. | 434/322 |
| 5,259,766 | * 11/1993 | Sack et al. | 434/362 |
| 5,574,828 | * 11/1996 | Hayward et al. | 706/45 |
| 5,692,906 | * 12/1997 | Corder | 434/156 |
| 5,727,950 | * 3/1998 | Cook et al. | 434/350 |
| 5,749,736 | * 5/1998 | Griswold et al. | 434/322 |
| 5,797,753 | * 8/1998 | Griswold et al. | 434/322 |
| 5,870,768 | * 2/1999 | Hekmatpour | 707/501 |
| 5,875,431 | * 2/1999 | Heckman et al. | 705/7 |
| 5,966,541 | * 10/1999 | Agarwal | 717/11 |
| 5,980,447 | * 11/1999 | Trudeau | 600/3 |
| 6,064,856 | * 5/2000 | Lee et al. | 434/350 |

OTHER PUBLICATIONS

Lahlaf et al, "Value of Information in Dam Remediation Decision–Making", IEEE Proceedings of the 1st International Symposium on Uncertainty Modeling and Analysis, Dec. 1990.*

Gonzalez et al, "Automated Exercise Progression in Simulation–Based Training", IEEE Transactions on Systems, Man, and Cybernetics, Jun. 1994.*

Lu et al, "Interactive Simulation of Branch Outages with Remedial Action on a Personal Computer for the Study of Security Analysis", IEEE Transactions on Power Systems, Aug. 1991.*

* cited by examiner

*Primary Examiner*—George B. Davis
(74) *Attorney, Agent, or Firm*—Robert E. Malm

(57) ABSTRACT

The invention is a method for remediation comprising steps (a) through (g). Step (a) consists of compiling a collection of one or more topics where a topic is a set of facts, a set of values, or a combination of a set of facts and a set of values that characterize knowledge and/or functionality. The set of facts that characterize knowledge is any set of facts. The set of facts that characterize functionality is a set of facts relating to the functionality of a test subject. Step (b) consists of compiling a collection of one or more treatments for each topic where a treatment comprises materials intended to teach a test subject. Step (c) consists of specifying a plurality of question blocks for each of the one or more treatments of step (b) where a question block consists of one or more questions. Response distributions are assigned to the questions in the question blocks. Step (d) consists of selecting one or more topics from those in the collection of step (a) for remediation. Step (e) consists of selecting one or more treatments from those specified in step (b) for the topics selected in step (d). Step (f) consists of obtaining responses to one or more question blocks associated with the treatments selected in step (e) from a test subject after exposure to the one or more treatments of step (e). Step (g) consists of obtaining a measure of the effectiveness of the treatments of step (e).

88 Claims, 5 Drawing Sheets

METHOD FOR REMEDIATION BASED ON KNOWLEDGE AND/OR FUNCTIONALITY

CROSS-REFERENCE TO RELATED APPLICATIONS

This application is a continuation-in-part of application Ser. No. 09/712,110, filed Sep. 13, 1996, Pat. No. 5,855,001.

BACKGROUND OF THE INVENTION

This invention relates generally to methods and systems for testing humans and systems and the subsequent classification of humans into knowledge states and systems (including human systems) into functionality states. More specifically, the invention relates to computer-implemented testing, classification, and remediation systems.

The process of testing and classification requires meaningful and accurate representations of the subject domains in terms of domain states. A domain state that a test subject is in is determined by sequentially administering to the test subject test items involving different aspects of the subject domain The responses of the test subject to the test items determines the state of the test subject in the subject domain.

The implementation of such a testing and classification process by means of a computer has the potential of providing an efficient and effective means for identifying the remedial actions required to bring the test subject to a higher level of knowledge or functionality.

The partially ordered set ("poset") is a natural model for the cognitive and functionality domains. Two states i and j in a poset model S may be related to each other in the following manner. If a test subject in state i can respond positively to all the test items to which a test subject in state j can, but a test subject in state j may not be able to respond positively to all the test items to which a test subject in state i can, we say that i contains j and denote this by the expression $i \geq j$. Note that a positive response on any item should provide at least as much evidence for the test subject being in state i as in state j.

Thus, the domain states are partially ordered by the binary "i contains j" relation. Note that the cognitive level or the functionality level of a test subject in state i is equal to or higher than that of a test subject in state j. Similarly, the cognitive level or the functionality level of a test subject in state j is equal to or lower than that of a test subject in state i. Accordingly, state i is said to be equal to or higher than state j and state j is said to be equal to or lower than state i.

Poset models in an educational context have been proposed before. However, they have either been Boolean lattices or posets closed under union in the sense that the union of any two members of the poset is also in the poset. This restriction is undesirable in that it leads to models that can be quite large. For example, allowing the number of test items to define the model can lead to models with as many as $2^N$ possible states where N is equal to the number of test items. With this approach the responses to the test items permits immediate classification with very little analysis. However, having such overly large models ultimately results in poor classification performance.

When sequential item selection rules have been used in classifying states in a poset, the approach has not been accomplished in a decision-theoretic context. Consequently, there was no assurance that the classification process would converge rapidly nor, in fact, that it would converge at all.

There is a need for a testing and classification system which is based on sound scientific and mathematical principles and which, as a result, can accurately and efficiently determine the domain states of humans and systems. It is reasonable to base such a system on poset models, but it should be possible to use general, even non-finite posets rather than the specialized posets that are typical of present-day systems. It is important that model selection and fitting for any particular domain be based on appropriate analysis rather than simply a result of the choice of test items. Similarly, the selection of test items should be based on appropriate analysis with reference to the domain model rather than being a more-or-less ad hoc process that ultimately gives birth to its own domain model.

SUMMARY OF THE INVENTION

The invention is a method for remediation comprising steps (a) through (g). Step (a) consists of compiling a collection of one or more topics where a topic is a set of facts, a set of values, or a combination of a set of facts and a set of values that characterize knowledge and/or functionality. The set of facts that characterize knowledge is any set of facts. The set of facts that characterize functionality is a set of facts relating to the functionality of a test subject. Step (b) consists of compiling a collection of one or more treatments for each topic where a treatment comprises materials intended to teach a test subject. Step (c) consists of specifying a plurality of question blocks for each of the one or more treatments of step (b) where a question block consists of one or more questions. Response distributions are assigned to the questions in the question blocks. Step (d) consists of selecting one or more topics from those in the collection of step (a) for remediation. Step (e) consists of selecting one or more treatments from those specified in step (b) for the topics selected in step (d). Step (f) consists of obtaining responses to one or more question blocks associated with the treatments selected in step (e) from a test subject after exposure to the one or more treatments of step (e). Step (g) consists of obtaining a measure of the effectiveness of the treatments of step (e) utilizing one or more of the response distributions assigned in step (c).

DETAILED DESCRIPTION OF THE INVENTION

The first objective of the present invention is to provide meaningful and accurate representations of a cognitive domain in the case of humans and a functionality domain in the case of systems (where "systems" includes humans considered as systems) through the use of partially ordered sets (posets). The second objective of the present invention is to provide a method for efficiently and accurately testing and classifying humans into cognitive domain state and systems into functionality domain states. The third objective is to provide a remediation program keyed to a domain state and designed to bring a human or a system to a higher domain state.

The classification process consists of administering a sequence of response-generating test items to the test subject. The responses to the test items provides the means for classifying the test subjects into particular domain states. In the case of humans, the test items might be questions or problems relating to particular subject matter such as arithmetic, chemistry, or language. In the case of a system, a test item might consist of (1) causing a system to be in a particular operating state and (2) causing certain inputs to be entered into the system, the response to be observed being the operating state of the system after the specified inputs have been entered into the system. The operating state and the functionality state of a system are two different concepts. For example, if the system is an aircraft, the operating state could be defined as its position and attitude and the time rate of change of its position and attitude. Its functionality state is a measure of the degree to which each of the functions that must be performed within the aircraft system to maintain it in an operating state are being performed.

The classification capability of the system provides the means for prescribing remedial programs aimed at propelling humans and systems into higher and higher states in their respective cognitive and functionality domains.

The poset models which provide the basis for the present invention may be either finite or non-finite. In many educational applications, it can be assumed that the poset is finite with top and bottom states denoted by 1 and 0 respectively, 1 denoting complete knowledge or functionality in a particular domain, and 0 denoting essentially no knowledge or functionality. However, this invention applies just as generally to poset models without a top and/or bottom state. For much of the material to follow, it will be assumed that the underlying model is a discrete poset. Later, a non-discrete poset model will be described.

Figure 1:
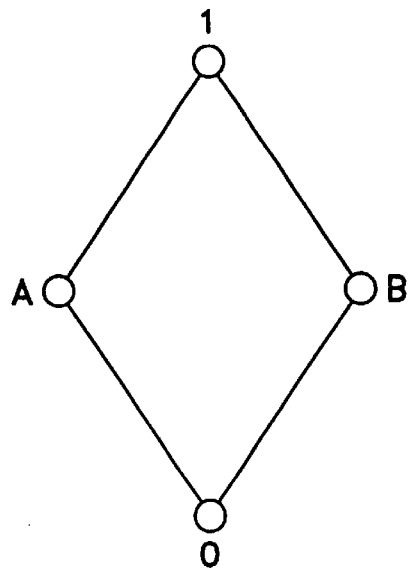
FIG. 1 depicts an example of a simple poset model as a Hasse diagram.

A formal definition of a partially ordered set and a partial order is as follows. Let P be a set with a binary relation $\leq$. P is said to be a partially ordered set, and the binary relation $\leq$ a partial order if for all elements i, j, and k in P the following conditions hold: $i \leq i$, $i \leq j$ and $j \leq i$ implies i=j, and $i \leq j$, $j \leq k$ implies $i \leq kL$ an example of a poset is in FIG. 1, depicted as a Hasse diagram. Note $A \leq 1$, $B \leq 1$, $0 \leq A$, $0 \leq 1$, etc. If $i \nleq j$ and $j \nleq i$, i and j are said to be incomparable, and the relation "strict inequality" is said to occur on P when $i \leq j$ and $i \neq j$.

Associated with each test item and each domain state of a test subject is a class conditional density $f_i(x|s)$ which is the probability of a state-s test subject providing the response x to a test item i. For simplicity, test items are assumed to be conditionally independent in the sense that responses to previously administered items do not affect the response to a presently-administered item. It should be noted, however, that this assumption can be relaxed, and all the techniques to be described below can be applied to the case where the test items are not conditionally independent. Moreover, response x can be viewed as multi-dimensional without loss of generality.

For a properly structured poset model S and properly designed test items, a test item will partition S into subsets according to the class conditional densities associated with the test item. It will be assumed for now that a test item partition consists of the subsets of states which share the same class conditional density. In practice, an expert must initially specify the partitions according to how he believes the response distributions should be structured and possibly shared among states. Specification and/or estimation of the class conditional densities can then be conducted. (The estimation process will be described below.) Modification of the partitions is possible after feedback from data analysis, as will also be described below.

One of the subsets may be a principal dual order ideal (PDOI) generated by a state in S. The PDOI generated by a state s is the set of states $\{j \text{ in } S: s \leq j\}$, where s denotes the partial order relation. A common partition for an item will have two elements, one being a PDOI, generated say by s in S. Under such circumstances, the test item is said to be of type s or associated with s. A test subject in the PDOI of state s is more likely to provide a response to a test item of type s that is consistent with the knowledge or functionality of state s than a test subject who is not.

More generally, reference to an item's type refers to its partition. Note that one of the partitions could be the union of PDOIs.

The system works best when the response distributions reflect the underlying order structure on the model S. This can be achieved for instance by imposing order constraints on item parameters associated with corresponding item partitions. For example, with Bernoulli response distributions, it may be natural to assume $f_1(X=1|s_1) \leq f_i(X=1|s_2)$ for item i if $s_1 \leq s_2$ in S where X=1 implies a positive outcome where we use the term "positive" in the sense that the outcome is more consistent with the knowledge or functionality of state $s_2$ than that of state $s_1$. The system works most efficiently in applications when such order constraints on the class conditional response distributions are natural for the underlying poset model.

Clearly, each state may have its own response distribution for an item. However, in practice, this may present a difficult estimation problem such as having too many parameters. Hence, using the minimum number of natural partitions for an item is desirable for simplifying the density estimation process.

In the educational application with Bernoulli responses, a natural possible two-element partition for an item is the subset of states in S wherein test subjects have the knowledge or functionality to provide a positive response to the item and the complement of the subset. It is natural to assume that the probability of a positive response by test subjects in this subset of states to be greater than that for test subjects in the complement. Further, specifying one of the subsets as a union of PDOIs can reflect that there exists multiple strategies to obtain a positive response.

The partially ordered set structure of domain states permits great efficiency in classification of test subjects. For example, suppose the set S consists of the states 0, A, B, C, AB, AC, BC, ABC (=1) where the cognitive or functionality domain is divided into three areas A, B, and C. The symbol 0 denotes no knowledge or functionality. The symbols AB, AC, and BC denote knowledge or functionality equivalent to the unions of individual area pairs. And the symbol ABC denotes knowledge or functionality equivalent to the union of all of the individual areas. Assume the item distributions to be Bernoulli, with the probability of positive responses given that the test subject has the knowledge or functionality to provide a positive response to be 1, and the probability of a positive response given that he does not to be 0. Administering a test item of type A partitions the set S into the PDOI of A (i.e. A, AB, AC, ABC) and the complement (i.e. 0, B, C, BC). If the test subject gives a positive response, a test item of type B partitions the PDOI of A into the PDOI of B (i.e. B, AB, BC, ABC) and the complement (i.e. 0, A, C, AC). If the test subject again gives a positive response, we have narrowed down the possible states for the test subject as being the intersection of the PDOI of A and the PDOI of B or the set consisting of AB and ABC. If the test subject now gives a negative response (i.e. not a positive response) to a test item of type ABC, we have determined that the test subject should be classified in state AB. Thus, by administering only three test items, we have managed to uniquely classify a test subject into one of 8 possible states. In general, the classification process becomes more complex as the response distributions become more complex in the sense that there may exist a variety of possible responses, not all of which are statistically consistent with the true state identity.

The basis for the computer-implemented testing and classification process is a poset model S and a test item pool I. The statistical framework used to classify test subject responses is decision-theoretic. This entails selection of a loss function to gauge classification performance. In general, a loss function should incorporate a cost of misclassification and a cost of observation. For a given test subject, an initial state probability set (SPS at stage 0) is assigned as well, and denoted as $\pi_0$. The SPS at stage 0 consists of prior probabilities concerning the test subject's state membership in S, and there exists in the set for each state s in S a prior probability value $\pi_0(s)$. The decision-theoretic objective in classification is to minimize an integrated risk function.

There are three main issues in classification: item selection, deciding when to stop the item administration process, and making a decision on classification once stopping is invoked. We define a strategy $\delta$ to be the incorporation of an item selection rule, stopping rule, and decision rule. What is desired is to find strategies that minimize the integrated risk function $R(\pi_0, \delta)$ which will be defined later. For a description of the framework when S is finite, see J. Berger, *Statistical Decision Theory and Bayesian Analysis, Second Edition*, Springer-Verlag, N.Y., 1985, p. 357.

As mentioned earlier, loss functions should incorporate a cost of misclassification and a cost of observation. Whether a decision rule misclassifies depends on which state is true. Hence, the system assumes that loss functions depend on the true state s in S, a decision rule $d(\underline{x}_n)$ which is a function of the response path $\underline{x}_n$ of length n, and n, the number of observations. Note that $d(\underline{x}_n)$ can be viewed as a function of the final SPS through $\underline{x}_n$ and the initial SPS, $\pi_0$. A loss function may be denoted by L(s,d,n) where d is the action that the decision rule $d(\underline{x}_n)$ takes. Being a function of n includes the case where test items have their own cost of observation.

In order for a loss function to encourage reasonable classification, it will further be assumed that for fixed s in S and fixed number of observations n, when the decision rule takes an action that results in a misclassification, the value of a loss function will be greater than or equal to the value if the classification decision was correct. Similarly, for fixed s in S and fixed classification decision, the value of a loss function will be non-decreasing in n, the number of observations.

Besides serving as objective functions to measure the performance of the classification process, such loss functions are used in stopping rules, generating decision rules, and item selection.

Given a loss function and initial SPS, it is desired to find a strategy $\delta$ which minimizes $$R(\pi_0, \delta) = \sum_{s \in S} \sum_{\underline{x}_N} L(s, d(\underline{x}_N), N|\delta) f(\underline{x}_N|s) \pi_0(s) \quad (1)$$

where $f(\underline{x}_N|s)$ is the response distribution for possible response path $\underline{x}_N$ of length N for a given state s in S, N is random and dependent on the response path, item sequence is selected by $\delta$ and the stopping rule is given by $\delta$, and the classification decision rule $d(\underline{x}_N)$ is given by $\delta$. This quantity is known as the integrated risk of $\delta$ given the initial SPS. It is the criterion on which to base the performance of strategies in the classification process. If the possible responses are continuous, then one would integrate as opposed to sum over all possible response paths. When N=0, equation (1) gives the average loss with respect to the initial SPS.

A linear version of a loss function is given by the equation $$L(s, d, N) = \begin{cases} A_1(s) + \sum_{n=1}^{N} C(i_n); & d = s \\ A_2(s) + \sum_{n=1}^{N} C(i_n); & d \neq s \end{cases} \quad (2)$$

where L(s,d,N) is the loss function associated with the action of classifying in state d a test subject whose true state is s after administering test items $i_1, i_2, \ldots, i_N$. The constants $A_1(s)$ and $A_2(s)$ are the losses associated with correct and incorrect classifications respectively for state s being true. Assume $A_1(s) \leq A_2(s)$. This relation signifies that the loss associated with a correct assignment is always less than or equal to the loss associated with an incorrect one. The cost of administering a test item $C(i_n)$ suggests that the cost may be a function of the test item. For example, the complexity of items may vary and the cost of developing and administering the items may vary as a result. For simplicity, the cost of administering a test item can be assumed to be the same for all test items.

For purposes of discussion, let us assume that $C(i_n)=0.1$ (a constant) for all test items and that $A_1(s)=0$, $A_2(s)=1$ for all states s in S. Suppose at stage n, the largest posterior value in the SPS is 0.91. The optimal decision rule for this loss function in terms of minimizing the integrated risk given a response path and given that stopping has been invoked is to take the action of classifying to the state with the largest probability value in the final SPS. An optimal decision rule in terms of minimizing the integrated risk is referred to as the Bayes decision rule. With respect to this loss function and the corresponding integrated risk, it is not worth continuing since the reduction in average misclassification cost cannot possibly exceed the cost of taking another observation. If $C(i_n)$ were equal to 0 for all test items, it would presumably be worth continuing the administering of test items indefinitely in order to obtain higher and higher probabilities of a correct assignment since the cost of an incorrect assignment overpowers the nonexistent cost of administering test items. This example gives an indication of how the cost of observation plays a role in deciding when to stop, and how the cost of misclassification and cost of observation must be balanced.

The basis for the computer-implemented testing and classification process is a poset model S and a test item pool I that is stored in the computer memory.

Consider again the poset model in FIG. 1. For the cognitive domain of arithmetic, state A might represent a mastery of addition and subtraction, state B might represent a mastery of multiplication and division, and state 1 might represent a mastery of arithmetic, the union of states A and B. For the functionality domain of an AND gate, state A might represent the proper functioning of a NAND gate, state B might represent the proper functioning of an inverter which inverts the output of the NAND gate, and state 1 might represent the proper functioning of both the NAND gate and the inverter (i.e. the AND gate).

Figure 2:
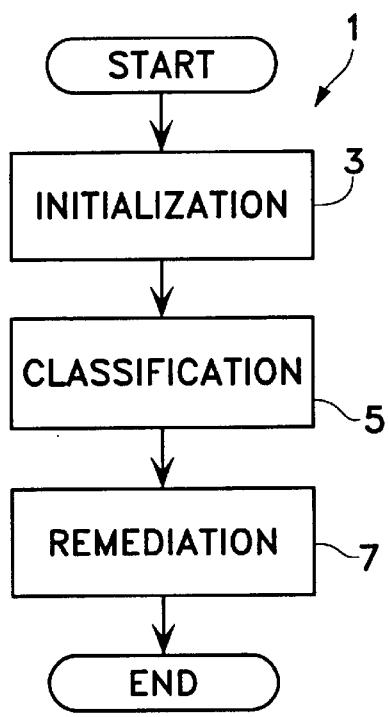
FIG. 2 shows a flow diagram for the process executed by a computer in classifying a test subject and providing remediation in the case of a human test subject or remediation guidance in the case of a system test subject.

The flow diagram 1 for the process executed by the computer in classifying a test subject and providing remediation in the case of a human test subject or remediation guidance in the case of a system test subject is shown in FIG. 2. The process begins with the initialization step 3 whereby the poset A model, the test item pool, and the test subject's initial state probability set are stored in computer memory.

The poset model is defined by a list of states, the PDOI for each state, information about the costs of correct and incorrect classification for each state (given that the state is the true state of the test subject), and a forwarding address to a remediation program for each state.

A test item pool is a collection of test items. A test item pool is always linked to a particular poset model. Associated with each test item in the test item pool are class conditional densities. The expression $f_i(x_n|s)$ denotes the class conditional density associated with the n'th administered test item i, $x_n$ being one of the possible responses to the n'th test item given that the state s is the true state of the test subject.

The test subject's initial state probability set (SPS) includes a member for each state in the poset model and is denoted by $\pi_0$. The notation $\pi_0(s)$ denotes the probability value in the collection of probabilities $\pi_0(S)$ for the system's prior belief that the test subject belongs to state s, where s represents any one of the states. There are a number of possible choices for the test subjects initial SPS. One possibility is to assign a non-informative initial SPS which does not take into account subjective information about the test subject and thus treats all test subjects the same. An example of such an initial SPS is a uniform set in which all of the probabilities are equal. This choice is attractive in that there is no need for prior information about the test subject. Another example of a non-informative initial SPS is one in which the probabilities are derived from the distribution of prior test subjects among the poset Ideally, the initial SPS should be tailored to the test subject. An initial SPS which heavily weights the true state of the test subject will lead to fast and accurate classification. Individualized initial SPSs can be constructed by using prior information concerning the test subjects domain state. In the case of humans, performance on examinations, homework, and class recitations can provide guidance. In the case of systems, previous operating performance would provide useful information for tailoring an initial SPS.

After the initialization step 3 has been performed, the classification step 5 takes place. Information necessary to classify a test subject into a domain state is obtained by successively calculating the test subjects SPS at stage n, denoted by $\pi_n$, after the test subject's response to each of a sequence of N administered test items, n taking on values from 1 to N. Additionally, denote the probability at stage n that the test subject belongs to state s to be $\pi_n(s)$, for any i in S. The determination of the value of N depends on the stopping rule. Note that N is random, and that its value is dependent on the current SPS and the remaining available item pool at each stage. The determination of the value of N will be described later.

The test subject's posterior probability $\pi_{(n+1)}(s|X_{n+1}=x, It_{n+1}=i)$ for membership in state s at stage n+1 is obtained from the equation $$\pi_{(n+1)}(s \mid X_{n+1} = x, It_{n+1} = i) = \frac{f_i(x \mid s)\pi_n(s)}{\sum_{\text{all } j \in S} f_i(x \mid j)\pi_n(j)} \quad (3)$$

where $X_{n+1}=x$ denotes that the test subject's observed response at stage n+1 is x, $It_{n+1}=i$ denotes that item i is the (n+1)th administered item and $f_i(x|s)$ is the class conditional density associated with state s evaluated at x for item i. The symbol $f_i(x|s)$ denotes a class conditional density associated with either a discrete or continuous random variable X (see e.g. Steven F. Arnold, *MATHEMATICAL STATISTICS*, Prentice-Hall, Englewood Cliffs, N.J., 1990, pp. 44–46).

The updating rule represented by the above equation is known as the Bayes rule, and it will be the assumed updating rule. Note that it applies generally when the class conditional density functions are joint densities and/or conditional densities dependent on previous responses. Other updating rules for obtaining $\pi_{(n+1)}(s|X_{n+1}=x, It_{n+1}=i)$ from $\pi_n(s)$ may be used by the system. For alternative updating rules, it will be assumed that the updated state posterior probability value be a function of the SPS at stage n and the class conditional densities for all the states in S evaluated at observed response x. They should also have the property that for observed response $X_{n+1}=x$ for any item i and fixed conditional density values for all states not equal to s, $\pi_{(n+1)}(s|X_{n+1}=x, It_{n+1}=i))$ is non-decreasing in $f_i(x|s)$. This should hold for all s in S and possible responses x. Of course, Bayes rule is an example of such an updating rule.

After N test items have been administered to the test subject, the test subject is classified. After a test subject is classified, the remediation step 7 can take place by providing the human test subject with the knowledge he does not have or by providing a technician the necessary information to repair at least some of the functional defects existing in the test subject.

Figure 3:
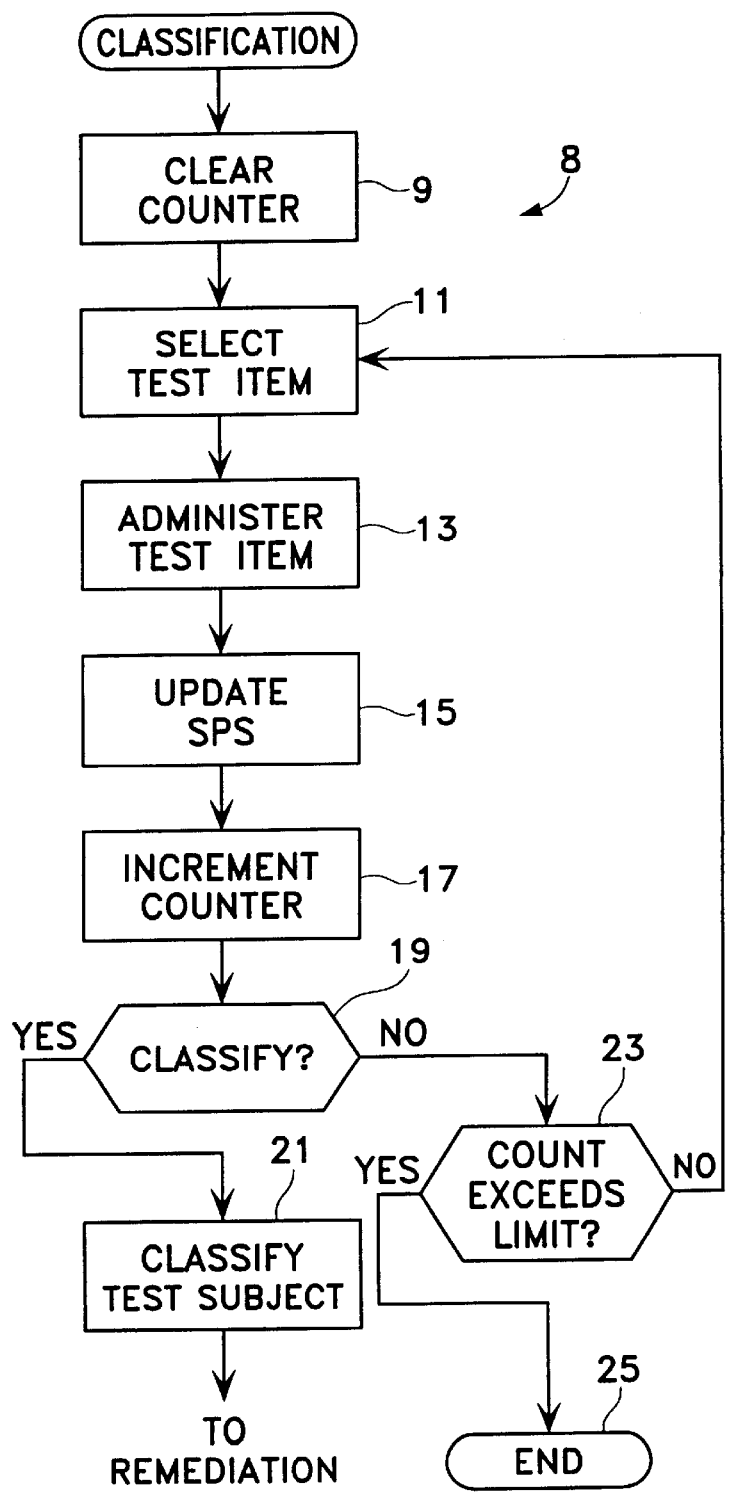
FIG. 3 shows the flow diagram associated with one embodiment of the classification step shown in FIG. 2.

The flow diagram associated with one embodiment 8 of the classification step 5 is shown in FIG. 3. The first step 9 is to clear the test item counter which keeps track of the number of test items administered to the test subject. In step 11, the test item to be administered to the test subject is selected. A test item is selected from the test item pool by applying an item selection rule.

A useful approach to developing item selection rules is to employ an objective function to measure the "performance" or "attractiveness" of an item in the classification process. In practice, this objective function may be dependent upon an item's characteristics such as how it partitions the poset model, what the corresponding distributions are within the partitions, an SPS, and/or the observed item response. Clearly, the probability values in the SPS and the item responses can vary. The objective function can be weighted, usually by a class conditional density, and the weighted objective function summed/integrated over all the possible values for the inputs used by the objective function. In this way, one can obtain an "average" or "expected" value of the objective function which can, for instance, systematically take into account the variation in the SPS and/or the variation of the possible item responses.

This is done by summing/integrating over all possible input values the product of the objective function and the corresponding weighting function. Examples are given below. For the examples, it will be assumed that the system is at stage n, and that the current SPS is $\pi_n$.

An important class of objective functions are uncertainty measures on an SPS. These are defined to be functions on an SPS such that the minimum value is attained when all but one of the values in the SPS has value zero. This minimum may not be unique in that other SPS configurations may attain the minimum as well.

A subset of item selection procedures which employ uncertainty measures as an objective function are those that gauge the uncertainty among the mass on an item's partitions with respect to an SPS. For such procedures, it is desirable for the item partitions to have a high level of (weighted) uncertainty. The idea is that the more the mass is spread across an item's parfitions, the more efficiently the item can discriminate between states that have significant mass in the SPS ("the more birds that can be killed by one stone"). This is important because in order to build a dominant posterior probability value in the SPS, item sequences must discriminate between or separate all states with significant mass. Conversely, note that if all the mass is on one partition, there will be no change in the SPS if the updating rule is Bayes rule. The motivation of these procedures is to avoid this scenario as much as possible as measured by an uncertainty measure. Assuming that all items have a partition corresponding to a PDOI generated by a state in S, consider the simple example below, which selects item i in the available item pool that minimizes $$h(\pi_n, i) = |m_n(i) - 0.5| \qquad (4)$$

and where $$m_n(i) = \sum_{j \geq e(i)} \pi_n(j) \qquad (5)$$

and e(i) is the type of test item i. For this criterion, as with all others, ties between items can be randomized. Note $m_n(i)$ is the mass on one of the partitions of item i at stage n, and the objective function $|m_n(i)-0.5|$ measures uncertainty among the item partitions with respect to the SPS at stage n, $\pi_n$. Actually, to satisfy the earlier definition of an uncertainty measure, we need to multiply the objective function by (−1).

This rule is based on a very simple criterion which is an advantage in terms of computational complexity. However, the rule is not very sophisticated. It does not take into account the response distributions of each test item. Also, the rule may not perform well when the test items have more than two partitions.

Another motivation for classification is that it is desirable for the SPS to have mass concentrated on or around one element. Using the uncertainty measures with the defining property should encourage selection of items that on average lead towards the ideal SPS configuration of mass on one point.

An important example of an uncertainty function is Shannon's entropy function $En(\pi_n)$ where $$En(\pi_n) = \sum_{i \in S} [-\pi_n(i) \log(\pi_n(i))] \qquad (6)$$

Note that the minimum is indeed attained when one element in the poset model has value 1 in the SPS.

A weighted version of this objective criterion is $sh_1(\pi_n, i)$ where $$sh_1(\pi_n, i) = \int En(\pi_{(n+1)}|X_{(n+1)}=x, It_{(n+1)}=i) P(X_{(n+1)}=x|\pi_n, It_{(n+1)}=i) dx \qquad (7)$$

where i now denotes any test item in the test item pool that has not yet been administered to the test subject. The symbol $En(\pi_{(n+1)}|X_{(n+1)}=x, It_{(n+1)}=i)$ denotes En as a function of π calculated after the test subject responds to the (n+1)'th administered test item given the response by the test subject to the (n+1)'th administered test item $X_{(n+1)}$ equals x and the (n+1)'th administered test item $It_{(n+1)}$ equals i. The symbol $P(X_{(n+1)}=x|\pi_n, It_{(n+1)}=i)$ denotes the mixed probability that $X_{(n+1)}$ equals x given $\pi_n$ and given that item i was chosen to be the (n+1)'th administered item.

Note that the equation is based on $\pi_{(n+1)}|X_{(n+1)}=x, It_{(n+1)}=i$ which denotes the SPS at stage n+1 given the observed response for the item administered at stage n+1 is x and the item selected for stage n+1 is item i. This criterion selects the item i in the available item pool which minimizes the right-hand side of the equation. Note that the weighting function in this case is $P(X_{(n+1)}=x|\pi_n, It_{(n+1)}=i)$ which is given by $$P(X_{(n+1)} = x|\pi_n, It_{(n+1)} = i) = \sum_{s \in S} f_i(x|s)\pi_n(s) \qquad (8)$$

It is a function of the values in the SPS for each state in S multiplied by the density values of the corresponding response distributions associated with each state. Indeed, it is a mixed probability distribution on the space of possible response values given $It_{(n+1)}=i$ and $\pi_n$ and on the poset model S.

If the class conditional density $f_i(x|s)=f_i(x)$ is associated with the response by a state-s test subject to a test item of type e(i) when e(i) is less than or equal to s and $f_i(x|s)=g_i(x)$ is otherwise associated with the response, then $sh_1(x,i)$ is given by the following equation $$sh_1(\pi_n, i) = m_n(i) \int En(\pi_{(n+1)}|X_{(n+1)}=x, It_{(n+1)}=i) f_i(x) dX + (1 - m_n(i)) \int En(\pi_{(n+1)}|X_{(n+1)}=x, It_{(n+1)}=i) g_i(x) dx \qquad (9)$$

An alternative to $sh_1(\pi_n, i)$ is $sh_1'(\pi_n, i)$:

$$sh_1'(\pi_n, i) = Sh_1(\pi_n, i) - E_n(\pi_n) \qquad (10)$$

Minimizing $sh_1'(\pi_n, i)$ with respect to i is equivalent to minimizing $sh_1(\pi_n, i)$.

The use of the alternative formulation sh' can lead to a reduction in computational complexity since in the two-partition case, it can be viewed as a convex function of $m_n(i)$. Employing computationally simple item selection rules aids in the feasibility of employing large poset models and employing k-step extensions (see below).

A generalization of this class of selection rules in one that selects a test item to be administered to a test subject which minimizes the expected value of an SPS function after taking into account the possible responses to the next k administered test items, k being an integer. Item selection rules which look ahead k steps are attractive in that they are better able to exploit the potential of the items remaining in the test item pool.

The expected value $sh_k(\pi_n, i)$ of $En(\pi_n)$ after administering k test items can be calculated in a straightforward manner using the recursive formula $$sh_k(\pi_n, i) = \int \{ \min_j \{ sh_{(k-1)}[(\pi_{(n+1)}) \mid X_{(n+1)} = x, It_{(n+1)} = i), j] \times \quad (11)$$
$$P[(X_{(n+1)} = x \mid \pi_n, It_{(n+1)} = i)] \} dx$$

where "min overj" means the value of the quantity in brackets for an item j from the preceding available item pool which minimizes the value. The version of the equation where P can be represented by $f_i$ and $g_i$ is $$sh_k(\pi_n, i) = \sum_{s \geq e(i)} \int \{ \min_j \{ sh_{(k-1)}[(\pi_{(n+1)}) \mid X_{(n+1)} = x, It_{(n+1)} = i), j] f_i(x) \quad (12)$$
$$\pi_n(s) \} dx + \sum_{s \neq e(i)} \int \{ \min_j \{ sh_{(k-1)}[(\pi_{(n+1)}) \mid X_{(n+1)} = x,$$
$$It_{(n+1)} = i), j] g_i(x) \pi_n(s) \} dx$$

where $e(i)$ is the type of test item i.

The same framework for constructing item selection rules applies to distance measures on two different SPSs: for instance, $\pi_n$ and $\pi_{(n+1)} \mid X_{(n+1)} = i$. Let a distance measure between two SPSs be such that, given SPSs a and b, the distance measure is a function of a and b that attains its minimum given a when a=b. Note that this minimum may not necessarily be unique. The motivation behind such a measure is that it is undesirable for an item not to lead to change between successive SPSs. An example of such a distance function is the sum over all of the states of the absolute difference of corresponding SPS elements associated with each state. Consider the item selection rule based on this objective function which selects item i in the available item pool that maximizes $Kg(\pi_n, i)$ where $$Kg_1(\pi_n, i) = \sum_{s \in S} \int |\pi_{(n+1)}(s \mid X_{(n+1)} = x, It_{(n+1)} = i) - \quad (13)$$
$$\pi_n(s) \mid f_i(x \mid s) \pi_n(s) dx$$

The version of this equation that is obtained when item i has two partitions represented by $f_i$ and $g_i$ and is associated with type $e(i)$ is $$Kg_1(\pi_n, i) = \sum_{e(i) \leq s} \int |\pi_{(n+1)}(s \mid X_{(n+1)} = x, It_{(n+1)} = i) - \quad (14)$$
$$\pi_n(s) \mid f_i(x) \pi_n(s) dx +$$
$$\sum_{e(i) \neq s} \int |\pi_{(n+1)}(s \mid X_{(n+1)} = x, It_{(n+1)} = i) -$$
$$\pi_n(s) \mid g_i(x) \pi_n(s) dx$$

Note that each term in the sum comprising the distance function on the SPSs is weighted correspondingly by the weighting function $\pi_n(s) f_i(x \mid s)$ for each s in S and possible response x given $It_{(n+1)} = i$ and $\pi_n$.

The k-step version of the above equation is $$Kg_k(\pi_n, i) = \quad (15)$$
$$\sum_{s \in S} \int \{ \min_j Kg_{(k-1)}[(\pi_{(n+1)}) \mid X_{(n+1)} = x, It_{(n+1)} = i), j] \} \cdot f_i(x \mid s)$$
$$\pi_n(s) dx$$

where "min overj" means the value of the quantity in brackets for an item j from the preceding available item pool which minimizes the value.

Yet another important class of item selection rules are based on objective functions that measure the "distance" or "discrepancy" between class conditional densities associated with the various states in S. The term "distance" or "discrepancy" is to be interpreted as a measure of the discrimination between the class conditional densities. Formally, it is assumed that a discrepancy measure is a function of two class conditional densities such that, for class conditional densities c and d, the discrepancy measure takes on its minimum given c when c=d. This minimum may not be unique. The motivation of adopting such objective functions is that items become more desirable for classification as the discrepancy between its class conditional densities increases. Conversely, if class conditional densities are equivalent, then statistically there will be no relative discrimination between the respective states in the subsequent SPS.

An example of item selection rules based on such objective functions include those that select the item i in the available item pool which maximizes the weighted discrepancies $wd(\pi_n, i)$ where $$wd(\pi_n, i) = \sum_j \sum_k \pi_n(j) \pi_n(k) d_{jk}(i) \quad (16)$$

where $d_{jk}(i)$ is a discrepancy measure between the class conditional densities of states j and k for item i. Note that each distance between a pair of states is weighted by the product of the corresponding probability values in the current SPS. A particularly simple $d_{jk}(i)$ is the one which equals 0 if $f_i(x \mid j)$ equals $f_i(x \mid k)$ and 1 otherwise.

As an illustration, suppose item i partitions the set of states into two subsets with item type denoted by $e(i)$. Suppose $f_i(x \mid j)$ equals $f_i$ when $e(i) \leq j$ and equals $g_i$ otherwise. Examples of discrepancy measures for $f_i$ and $g_i$ include the Kullback-Liebler distance given by $$d_{jk}(i) = \int \log[f_i(x)/g_i(x)] f_i(x) dx; \quad j \geq e(i), \quad k \not\geq e(i) \quad (17)$$
$$d_{jk}(i) = \int \log[g_i(x)/f_i(x)] g_i(x) dx; \quad j \not\geq e(i), \quad k \geq e(i)$$
$$d_{jk}(i) = 0 \quad\quad j, k \geq e(i), \quad j, k \not\geq e(i)$$

and the Hellinger distance given by $$d_{jk}(i) = \begin{cases} \sqrt{1/2 \int (\sqrt{f_i(x)} - \sqrt{g_i(x)})^2 \, dx}; & j \geq e(i), k \not\geq e(i) \text{ or } j \not\geq e(i), k \geq e(i) \\ 0; & \text{otherwise} \end{cases} \quad (18)$$

Still another class of item selection rules are the k-step look-ahead rules. These rules employ as objective functions loss functions such as those described earlier. Again, the objective functions will usually be weighted over the possible input values. The motivation behind such criteria is to reduce the average cost of misclassification while balancing the average cost of observation. There are a variety of of possible loss functions that one might use. Importantly, the loss function used in item selection may differ from that used in the integrated risk determination (see above). If the same loss function is used, then the k-step look-ahead rule selects the best k-step strategy which leads to the greatest reduction in the integrated risk within a k-step horizon. Note that it is possible that less than k items may be administered in a k-step strategy.

A one-step look-ahead rule can be based on the expected loss LA, defined by the equation $$LA_1(\pi_n, i) = \sum_{s \in S} \int L(s, d(x), 1) f_i(x|s) \pi_n(s) dx \quad (19)$$

where $L(s,d(x),1)$ is the loss function, and item i is selected from the available test item pool. Of the remaining yet to be administered items in the test item pool, the one which is associated with the smallest value of $LA_1$ would be chosen as the (n+1)'th item to be administered. It may be assumed that $d(x)$ is the Bayes decision rule after response x is observed.

If the class conditional density $f_i(x|s)=f_i(x)$ is associated with the response by a state-s test subject to a test item i of type e(i) when e(i) is less than or equal to s and $f_i(x|s) =g_i(x)$ is otherwise associated with the response, then $LA_1(\pi_n,i)$ is given by the following equation $$LA_1(\pi_n, i) = \sum_{e(i) \leq s} \int L(s, d(x), 1) \pi_n(s) f_i(x) dx + \quad (20)$$
$$\sum_{e(i) \leq s} \int L(s, d(x), 1) \pi_n(s) g_i(x) dx$$

where $L(s,d(x),1)$ can be viewed as a function of $\pi_{(n+1)}|X_{(n+1)}=x, It_{(n+1)}=i$. If the loss function has constant cost of observation and 0–1 misclassification cost, this criterion reduces to choosing the item that will give the largest expected posterior value in $\pi_{(n+1)}$.

A k-step look-ahead rule utilizes the expected loss $LA_k$ in administering the next k test items. The quantity $LA_k$ is defined recursively by the equation $$LA_k(\pi_n, i) = \sum_{s \in S} \int \{\min_j LA_{(k-1)}[(\pi_{(n+1)} | X_{(n+1)} = x, It_{(n+1)} = i)j]\} \cdot \quad (21)$$
$$f_i(x|s)\pi_n(s) dx$$

where "min overj" means the value of the quantity in brackets for an item j from the preceding available item pool which minimizes the value. The version of the equation when item i has two partitions represented by $f_i$ and $g_i$ and is associated with type e(i) is $$LA_k(\pi_n, i) = \quad (22)$$
$$\sum_{e(i) \leq s} \int \{\min_j \{LA_{(k-1)}[(\pi_{(n+1)} | X_{(n+1)} = x, It_{(n+1)} = i), j] f_i(x)\pi_n(s)\}\}$$
$$dx +$$

$$\sum_{e(i) \leq s} \int \{\min_j \{LA_{(k-1)}[(\pi_{(n+1)} | X_{(n+1)} = x, It_{(n+1)} = i), j] g_i(x)\pi_n(s)\}\}$$
$$dx$$

Not all reasonable item selection rules need be based directly on objective functions. Fiist, let us begin with the definition of an important concept in item selection. An item i is said to separate the states $s_1$ and $s_2$ in S if the integral/sum over all possible responses of the class conditional density $f_i$ given $s_1$ and/or $f_i$ given $s_2$ of the absolute difference of the class conditional densities is greater than zero. In other words, states $s_1$ and $s_2$ are separated if, with positive probability with respect to one of the densities, the respective two-class conditional densities are different. This definition can be generalized to: an item is said to separate two states if for a discrepancy measure such as in equations (18) or (19) for the corresponding class conditional densities, the resultant value exceeds a predetermined value. The class of discrepancy measures utilized in the invention coincides with those utilized in item selection rules based on weighted discrepancy measures. Indeed, the criterion for separation can be generalized further by considering a plurality of discrepancy measures, and establishing the separation criterion to be satisfied if for instance two or more measures exceed predetermined values, or all the measures exceed a predetermined value, or other such conditions.

Let us now introduce the function $\Phi$ which, given a separation criterion and two states in S, determines if an item from a given item pool indeed separates the two states. The outcome "yes" can be assigned the value 1 and "no" the value 0. An application of $\Phi$ is to generate for two states the subset of items which separates them from the available item pool.

Figure 6:
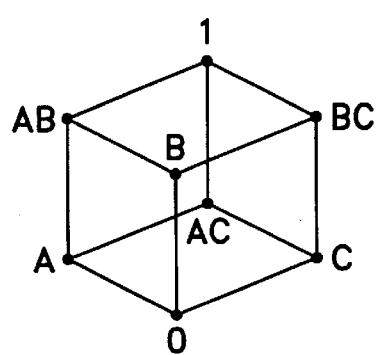
FIG. 6 depicts a poset model as a Hasse diagram.

As an illustration, suppose the poset in FIG. 6 is the underlying model S. Further, let the corresponding item pool contain four items, each with two partitions, of types C, AC, BC, and 1 respectively and whose corresponding class conditional densities satisfy the given property of separation. Then, for states AC and RC for instance, given this item pool, $\Phi$ can be used to generate the subset of items which separate them, the items of types AC and BC. All this involves is to group together all items for which their $\Phi$-values are equal to 1.

The function $\Phi$ can also be used to generate reasonable item selection rules. One procedure is as follows:

1. Find the two states in S with the largest values in the current SPS at stage n;
2. Use $\Phi$ to identify items in the available item pool that will separate these states;
3. Select the item in the resultant subset of items provided by $\Phi$ with the largest discrepancy value with respect to a discrepancy measure such as in equations (18) and (19) of the class conditional densities of the two states, or, allow the system to randomize selection among those items, thus avoiding use of an objective function altogether. The class of discrepancy measures that can be used in this item selection procedure is equivalent to the class that can be used in the item selection rules based on discrepancy measures on class conditional densities.

All the rules discussed above can be randomized. This involves introducing the possibility that the item selected by a given rule at a given stage may, with positive probability be exchanged for another item. This randomization may be weighted by the relative attractiveness of the items with respect to the item selection criterion.

One technique which implements such randomization of item selection is simulated annealing I(see S. Kirkpatrick et al., "Optimization by Simulated Annealing", *Science,* 220, pp. 671–679). The inclination to "jump" to another item is regulated by a "temperature" (i.e. the probability distribution associated with the randomization process is controlled by a "temperature" parameter). The higher the temperature, the more likely a jump will occur. An item selection rule used in conjunction with simulated annealing can be run at various temperatures, with each run referred to as an annealing.

Specifically, one implementation of simulated annealing would be to regulate jumping with a Bernoulli trial, with the probability of jumping a function of the temperature parameter. The higher the temperature, the higher the probability that a jump will indeed occur. Once a jump has been decided upon, the probability distribution associated with alternative items could for instance be proportional to the respective relative attractiveness of the items with respect to the item selection criterion in question.

The motivation for employing such a modification to an item selection rule is that sometimes myopic optimization may not necessarily lead to item sequences with good overall performance as measured for instance by the integrated risk. Several annealings can be run and the corresponding strategies analyzed to see if improvement is possible.

Another technique for possibly improving upon a collection of item selection rules is to hybridize them within a k-step horizon. This procedure develops new item selection rules based upon collections of other rules. For each rule in a given collection, a k-step strategy is constructed at each stage in the classification process. The hybridized rule selects the item which was used initially in the best of the k-step strategies as judged by a criterion such as the integrated risk with respect to the current state SPS. (A different loss function to judge the k-step strategies than the one used for the general classification process may be used.) Hence, the hybridized rule employs the item selection rule which is "best" at each particular state in terms of a k-step horizon, so that overall performance should be improved over just using one item selection procedure alone.

Other hybridizing techniques are possible. As an example, given a plurality of item selection rules, an item can be selected randomly from the selections of the rules. Alternatively, each test item in the available test item pool can be assigned a relative ranking of attractiveness with respect to each selection rule: for instance "1" for the most attractive, "2" for the second most attractive, etc. The test item with the highest average ranking among the selection rules is selected. Clearly, the ranking values can also be based on the relative values of weighted objective functions. In general, criteria based on weighted relative rankings of attractiveness with respect to a plurality of item selection rules will be referred to as relative ranking measures, with the higher the weighted relative ranking, the more attractive the item.

After selecting the next test item in step 11 of the classification process 5 shown in FIG. 3, the selected test item is flagged which indicates that the selected test item is not available for future selection The selected test item is then administered to the test subject and the test subject's response is recorded in step 13. The test subject's SPS is then updated in step 15 in accordance with equation (3) and the test item counter is incremented in step 17.

The decision is made in step 19 as to whether at this point the administering of test items should be stopped and the test subject classified. The simplest criterion for making this decision is whether or not any of the members of the test subject's SPS exceeds a classification threshold. If any of the members of the test subject's SPS does exceed the threshold, the test subject is classified in step 21 in the state associated with the member of the test subject's SPS having the greatest value and the remediation process 7 begins.

If none of the members of the test subject's SPS exceeds the classification threshold, the test item count recorded in the test item counter is compared with a test item limit in step 23. If the test item count is less than the test item limit, the classification process returns to the item selection step 11 and the process continues. If the test item count exceeds the test item limit, it is concluded that the classification process is not succeeding and the classification process is terminated in step 25. The classification process may not succeed for a variety of reasons. For example, if the responses provided by the test subject are inconsistent with respect to any state in S (i.e. no dominant posterior probability emerges in the SPS functions), it would be impossible to properly classify the test subject.

Another possible stopping rule that may be employed is the k-step look-ahead stopping rule. It involves the same calculations as with a k-step look-ahead item selection rule and results in a k-step strategy $\delta^k$ with respect to the classification decision-theoretic loss function.

Given a current SPS, the system must decide whether to continue or stop. The k-step look-ahead stopping rule will favor stopping if $R(\delta_n, \pi_k)>=R(\pi_n, \delta_0)$, where $\delta_0$ is the strategy that stops at the current position. The strategy $\delta_k$ may be represented by a strategy tree (see below). Of course, other item selection criteria can be used to construct $\delta_k$ besides that of the equation for $LA_k$ given above. Additionally, the loss function used in the k-step look-ahead stopping criterion may differ from those used in other contexts.

The k-step look-ahead stopping rules can be based on other weighted objective criteria besides a loss function. Consider the uncertainty and distance measures on SPS vectors. After constructing $\delta_k$ at a given stage, if the weighted (expected) reduction in an uncertainty measure is less than a predetermined value, or the increase in the distance between the weighted (expected) SPS at stage n+k and the current SPS is not greater than a specified value, stopping may be invoked.

Stopping rules do not necessarily have to look ahead k steps. A stopping rule may be a function of the current SPS. For instance, if a weighted uncertainty measure on the current SPS is less than a predetermined value, stopping can be invoked. Similarly, if a weighted distance measure, for instance, between the initial SPS and the current one is larger than a predetermined value, it would be attractive to stop, and stopping can be called. Using loss functions, a stopping rule could depend on whether or not a weighted loss is less than a predetermined value. A stopping rule could be based on such a criterion as well. Weighting for these stopping rule criteria could for instance be with respect to the class conditional density values corresponding to the test item responses administered up to the current stage and the initial SPS.

Consider the following examples. Suppose a loss function has a cost of observation of 0 until n>10 then becomes 1 with no misclassification cost. The corresponding stopping rule for this loss function will invoke stopping if and only if the number of observations reaches 10 (cf. FIG. 3, step 23).

Note how this loss function belongs to the class of loss functions described earlier. Also note that this loss function is tailored for developing reasonable stopping rules and may not correspond to the loss function used in the integrated risk function.

Consider now the uncertainty measure which calculates the quantity (1 minus the largest posterior probability in the SPS). The corresponding stopping rule could then be the simple one described above, which stops if the largest posterior probability in the current SPS exceeds a threshold value. Note that the two examples described above can be used in conjunction to develop a stopping criterion, such as invoking stopping if and only if one or both of the rules calls for stopping. An alternative would be to invoke stopping if and only if both rules call for stopping. Clearly, with a plurality of stopping rules, various such combinations can be used in constructing a new stopping rule.

Recall that the decision rule which minimizes the integrated risk with respect to a loss function and initial SPS is called the Bayes decision rule. The decision rule is a function of the observed response path and its corresponding response distributions. Due to computational difficulty, it may sometimes be easier to use a Bayes decision rule from a different context (i.e. different initial SPS and different loss function). For example, if misclassification costs vary among the states in S, it may not always be the Bayes decision rule to select the state with the largest posterior probability in the final SPS, yet it may still be attractive to do so.

Moreover, when the underlying poset model has an infinite number of states, it is possible for purposes of deriving a decision rule to let the initial SPS have infinite mass. The best decision rules in terms of miniing the integrated risk with respect to such initial SPS prior distributions are called generalied Bayes rules. These rules also may be useful. Once again, note that the loss functions used in the decision process may differ from those used in the classification process (integrated risk criterion) and those used in item selection and/or stopping. As in item selection, when using stopping or classification decision criteria, ties between decisions can be randomized. For emphasis, it should be noted that item selection and/or stopping rules can vary from stage to stage and decision rules from test subject to test subject.

Figure 4:
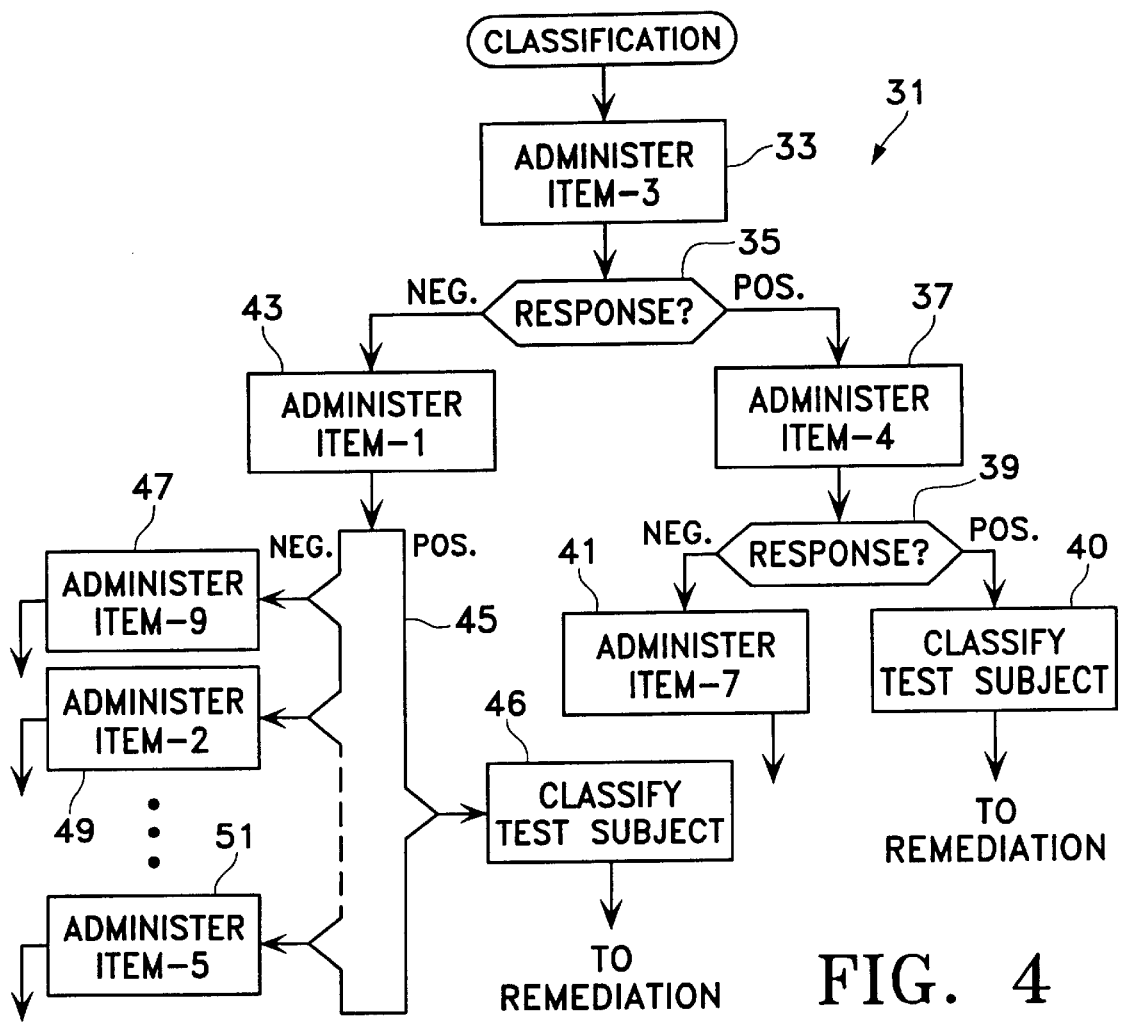
FIG. 4 shows a portion of a strategy tree embodiment of the classification step shown in FIG. 2.

A portion of a strategy tree embodiment 31 of the classification step 5 is shown in FIG. 4. A strategy tree specifies the first test item to be administered together with all subsequent test items to be administered. Each test item in the strategy tree after the first is based on the test subject's response to the last test item administered and the updated SPS. Strategy trees are representations of strategies. A strategy tree is a plurality of paths, each path beginning with the first test item to be administered, continuing through a sequence alternating between a particular response to the last test item and the specification of the next test item, and ending with a particular response to the final test item in the path. The classification of the test subject, based on the final updated SPS for each path, is specified for each path of the strategy tree. Note that strategy trees can be used when the response distributions are continuous if there are a finite number of possible response intervals associated with an item choice. Also, multiple branches emanating from a node in the tree indicates multiple possible response outcomes.

Thus, the identity of the next test item in the strategy tree can be determined d by referencing a memory location keyed to the identity of the last test item administered and the response given by the test subject to the last test item. The last test item to be administered for each path in the strategy tree is identified as such in the memory, and each response to that last test item is associated in memory with the appropriate classification of the test subject who has followed the path that includes that particular response. Directions for remediation are also stored in memory for each path of the strategy tree.

It is assumed in FIG. 4 that the test subject's response to a test item can be either positive or negative. The first item to be administered is specified by the strategy tree to be item-3 and is administered in step 33. The response is analyzed in step 35. If the response to item-3 is positive, the next item to be administered is specified by the strategy tree to be item-4 which is administered in step 37. The response to item-4 is analyzed in step 39. If the response to item-4 is positive, the administering of test items ceases, classification of the test subject occurs in step 40, and test subject transitions to the remediation step 7 (FIG. 2). If the response to item 4 is negative, item-7 is administered in step 41 in accordance with the strategy tree specification. The process continues in a similar manner after step 41 until a stopping point is reached and classification occurs.

If the response to item-3 is determined in step 35 to be negative, item-1 is administered in step 43 as specified by the strategy tree and analyzed in step 45. If the response to item-1 is positive, the administering of test items ceases, classification of the test subject occurs in step 46, and the test subject transitions to the remediation step 7 (FIG. 2). If the response to item-1 is negative, either item-9, item-2, . . . , item-5 is administered in steps 47, 49, . . . , 51, as specified by the strategy tree. The process continues after these steps until a stopping point is reached and classification occurs.

Such strategy trees are developed starting with the initial SPS and the test item pool, and determining the sequence of test items to be administered using the test item selection procedures described above. A strategy tree branches with each administration of a test item until stopping is invoked by a stopping rule.

It may be possible to create a more efficient strategy tree from an existing one by evaluating a weighted loss function one or more test items back from the final test item in a path and determining whether the additional test items in the strategy tree are justified by a reduction in the weighted loss function.

Figure 5:
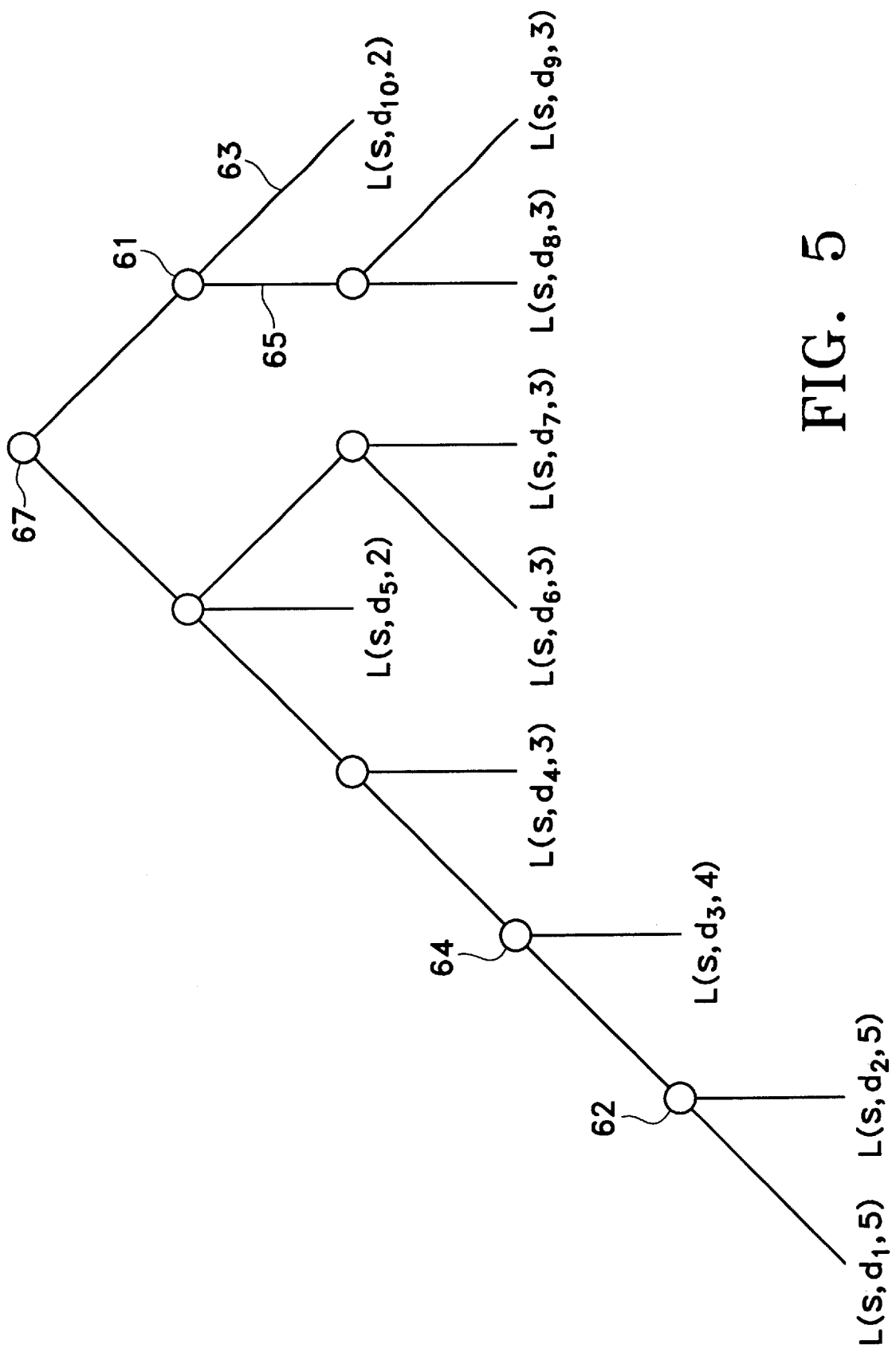
FIG. 5 shows the relationship between the loss function and a strategy tree.

The relationship between the loss function and a strategy tree is illustrated in FIG. 5. A circle 61 denotes a test item and line segments 63 and 65 denote the possible responses to the test item. Test item 67, the first test item in the strategy tree, is the beginning of all paths in the strategy tree. Each path terminates with a line segment such as line segment 63 which does not connect to another test item. The loss function L(s,d,n) for each path can be determined after classification occurs at the end of each path, assuming the test subjects true classification is s, as indicated in FIG. 5.

The loss function cannot be used directly in refining a strategy tree since one never knows with absolute certainty the true classification of a test subject. Instead, the weighted loss function (i.e. integrated risk) $R(\pi_0, \delta)$ is used for this purpose.

As mentioned above, a strategy tree can be refined by using the weighted loss function. Suppose the weighted loss function of the strategy tree $\delta_1$ of FIG. 5 is $R(\pi_0, \delta_1)$. Now eliminate test item 61 and call this revised tree $\delta_2$ with an weighted loss function $R(\pi_0, \delta_2)$. If $R(\pi_0, \delta_1)$ is less th $R(\pi_0, \delta_2)$, the reduced weighted loss function suggests that strategy tree $\delta_2$ is preferable to original strategy tree $\delta_1$.

Rather than eliminating only one test item, one might choose to eliminate test items 61 and 63, thereby obtaining strategy tree $\delta_3$. Again, if $R(\pi_0, \delta_3)$ is less than $R(\pi_0, \delta_1)$, the reduced weighted loss function suggests that strategy tree $\delta_3$ is preferable to original strategy tree 67 $_1$. There are obviously many possible modifications of the original strategy tree that might be investigated using the weighted loss function as the criterion of goodness. A systematic approach would be to employ a "peel-back" approach. This entails "growing" the tree with a computationally-simple stopping rule such as the one which decides to stop when one of the states in S has a posterior probability value which exceeds a threshold value or when the number of observations exceeds a threshold. Then, the system can "peel-back" the tree and refine the stopping rule in terms of the weighted loss function by applying a k-step look-ahead stopping rule only to all the sub-trees at the end of the tree with a branch at most k steps from termination (k>=1). This approach becomes attractive when applying the k-step look-ahead stopping rule at each stage in the strategy tree is computationally expensive.

An important application of the technology used to generate sequential test sequences is in the development of fixed sequence tests. A fixed sequence test (fixed test) is a sequence of items that are to be administered to all test subjects, with no sequential selection involved. A test length may be predetermined or can be determined during design given a decision-theoretic framework as used in the sequential setting. Indeed, the same classification framework can be used in the fixed test context as well (use of loss functions with costs of misclassification and observation, integrated risk functions, an initial SPS, etc.). The objective for this problem then is to choose the fixed sequence from an item pool which minimizes the integrated risk for a given loss function and initial SPS. Note that choosing the test length (i.e. deciding when to stop) may be an issue since the loss function may include a cost of observation. Also, note that during actual administration of a given fixed test, it is possible to allow test subjects to stop before completing all of the test items in the fixed sequence, using stopping rules as described earlier. Decision rules are analogous in the fixed test context in that their objective is to make a classification decision which minimizes a weighted loss function.

All the previous item selection rules such as those based on weighted objective functions can be adapted to this application as well, along with the techniques of extending them for k-step horizons, hybridizing a collection of them, and introducing randomization to the selection process. As an example, items can be selected iteratively via the sh-criterion by choosing at stage n+1 the item i from the remaining available item pool which minimizes $$\int_{x_{n+1}} \cdots \int_{x_1} E_n(\pi_{n+1} | X_1 = x_1, It_1 = i_1, \ldots, X_{n+1} = x_{n+1}, It_{n+1} = i) \cdot \quad (23)$$
$$P(X_1 = x_1, \ldots, X_{n+1} = x_{n+1} | \pi_0,$$
$$It_1 = i_1, \ldots, It_{n+1} = i) dx_1 \ldots dx_{n+1}$$

where $i_1 i_1, \ldots, i_n$ are the previously selected items at stage 1 up through stage n respectively and $$P(X_1 = x_1, \ldots, X_{n+1} = x_{n+1} | \pi_0, It_1 = i_1, \ldots, It_{n+1} = i) \quad (24)$$
$$= \sum_{s \in S} f_{i_1, \ldots, i_n, i}(x_1, \ldots, x_n, x_{n+1} | s) \pi_0(s)$$

The function f is the joint class conditional density for responses $x_1, \ldots, x_n, x_{n+1}$ given state s and item sequence $i_1, \ldots, i_n, i$. In addition, the probability of a test subject being in a particular test item partition can be calculated for instance by weighting the probability values that would be given by the possible SPSs that could result from administration of the fixed test items up to state n. Recall that the probabilities of a test subject being in a test item's partitions are quantities used by certain item selection rules.

Item selection criteria based on the function $\Phi$ can also be used in this context as well. First, list all pairs of states that need to be separated, optionally giving more weight to certain separations (e.g. requiring that a certain separation should be done twice). The objective in selecting a fixed sequence would then be to conduct as many of the desired separations as possible, using for a given pair of states and a given separation criterion the function $\Phi$ to determine whether an item results in a separation between them. An item selection criterion would be to choose an item which results in as many of the remaining desired separations as possible. Once an item is administered, the list of desired remaining separations is updated by removing the resultant separations.

In the strategy tree context, the restriction that the same item sequence be administered to all test subjects is equivalent to requiring all branches in a tree to be equivalent. In general, one can view the process of selecting a fixed test as a special case of the general sequential analytic problem. At each stage n of the tree-building process, n>=1, instead of allowing each node to be associated with its own item, developing a fixed test is equivalent to requiring that all nodes at the same stage n of the test share the same item selection. Note that the "peel-back" approach to constructing a stopping rule can still be applied.

Conversely, developing fixed test sequences has application in sequential testing. Recall k-step look-ahead item selection and stopping rules, which require development of a k-step horizon strategy at each stage. This can be computationally costly if k is large and the poset model and item pool are complex. As an alternative, one can instead calculate a fixed test sequence within a k-step horizon in place of a k-step strategy. Criteria for item selection and stopping based on using a k-step horizon fixed test are analogous.

For both the sequential and fixed test settings, the above techniques can be used to design the item pool (fixed test) in terms of what type of items should be constructed. To gain insight, classification is conducted on hypothetical items with hypothetical item types and item response distributions. Since the classification process is being simulated, an infinite number of each of the item types of interest within a range of class conditional densities that reflect what is to be expected in practice can be assumed. From the hypothetical item pool, strategy trees or fixed sequences can be constructed for various initial SPS configurations. The composition of these constructions in terms of the hypothetical item types selected gives guidance as to how to develop the actual item pool or fixed sequence. Hypothetical item types that appear most frequently on average and/or have high probability of administration for instance with respect to SPSs and class conditional densities are candidates to be constructed. Analyzing the item composition of a number of simulated classification processes is an alternative approach to gaining insight into item pool design. Note that these approaches can be applied to actual test item pools as well. Actual test items that are not administered with high frequency on average and/or do not have high probability of administration, for instance with respect to SPSs and class conditional densities, are candidates for removal.

An important consideration in the implementation of the invention is the development of a model of the domain of interest and the associated test item pool. Concerns in developing the model include whether the model has too many or too few states. Desirable properties of the test item pool include having accurately specified items which strongly discriminate between states and having a sufficient assortment of item types to allow for effective partitioning of the states.

A model is too large when some of the states are superfluous and can be removed without adversely affecting classification performance. A model is too small when some of the important states are missing. An advantage to having a parsimonious model is that for test subjects in states that are specified, it doesn't require on average as many test items to reach the classification stage and to classify with particular probability of error as it does for a larger model which contains the smaller one. The disadvantage is that test subjects in states that are not present in the model cannot be appropriately classified.

A good model gives useful information concerning the remediation of test subjects. Each state should be meaningful in assessing the knowledgeability or functionality of the test subject. Moreover, the model should be complex enough to be a good representation of all the relevant knowledge or functionality states in a given subject domain. Hence, balancing parsimony while accurately representing the subject domain is the primary challenge of model development.

The selection of items for the test item pool entails determining how effective a test item is in distinguishing between subsets of states. The effectiveness of a test item is determined by the degree of discrimination provided by the response distributions associated with the test item and the subsets of states. The degree of discrimination provided by response distributions can be measured in a variety of ways. Two possibilities are illustrated by equations (18) and (19), with larger values indicating a larger degree of discrimination. In general, discrepancy measures from the same class as employed in item selection can be used.

The starting point for the development of a domain model and its associated test item pool is the postulating of model candidates by experts in the field of the domain and the generation of test item candidates of specified types for the test item pool. Within each model, the experts may have an idea as to which states may be superfluous and where there may be missing states. Further, the experts may have an idea as to which items do not discriminate well between subsets of states or whose association with the domain states may be vague and need to be investigated. These prior suspicions are helpful in that they allow the user to experiment through design of a training sample of test subjects in order to gain information necessary to make decisions about item performance and model structure.

With respect to the relationship between domain models and the test item pool, it is of considerable importance that the item pool can discriminate among all of the states. Whether this is true or not can be determined by a mapping on the poset model, given a test item pool with fixed item partitions. In general, the item partitions may be specified such that they do not necessarily correspond to the subsets with shared class conditional response distributions, and in fact can be specified without taking into consideration actual estimated class conditional response densities. Moreover, separation criteria can be used for specifying alternative partitions, such as grouping together states whose class conditional density discrepancies are small. These alternative partitions can be used below and in item selection rules. Hypothetical items with hypothetical partitions can be used as well. The mapping consists of the following sequence of operations: partitioning the domain set of states by means of a first item in the test item pool into its corresponding partition, partitioning each of the subsequent subsets in the same manner by means of a second item, resulting in the further possible partitioning of each partition of the first item; continuing the partitioning of the resultant subsets at each stage of this process by means of a third, fourth, . . . , nth type of item until either there are no more items left in the item pool or until each state in the original poset is by itself in a subset. The latter situation implies that the item pool can discriminate between all of the states in the domain in relation to the fixed item partitions. If the final collection of subsets contains one subset that has more than one member, the implication is that the test item pool cannot discriminate between those states in that subset, again in relation to the fixed item partitions. The image of this mapping can be partially ordered, with the partial order induced in the sense that $x' \leq y'$ for $x'$ and $y'$ in the image if there exists $x$ and $y$ in the original poset such that $x \leq y$ and the images of $x$ and $y$ are $x'$ and $y'$ respectively.

Figure 7:
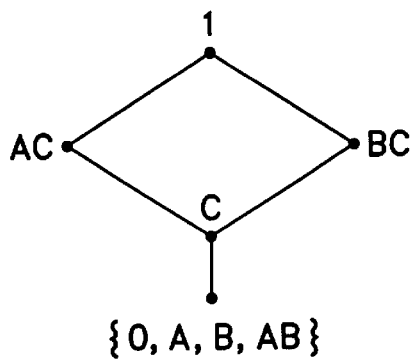
FIG. 7 shows the image of the mapping, of a test item pool on the poset model of FIG. 6.

FIGS. 6 and 7 give an illustration of this mapping. Suppose the item pool contains 4 items, each with two partitions and associated respectively with states {C,AC,BC, 1}. FIG. 6 shows the original poset model. FIG. 7 is the image of the mapping on the poset model of FIG. 6. The image shown in FIG. 6 indicates that the test item pool was unable to separate states 0, A, B, and AB.

A resultant image poset can be viewed as the effective working model for classification in relation to the item pool and given item partitions and is a reduction from the original poset model. In practice, this reduction in the number of states can be substantial, depending on the item pool. States that are not discriminated by the mapping are effectively viewed as one state in the image. Also, if classification is to be conducted on the image poset, note that an item's partition must be updated in relation to the new model. If the partial order on the image is induced as above, then an item's partition in the image is just the image of the partition, and the system can automatically update the item type specification.

The unavailability of item types is a natural constraint for the model. Certain item types may be awkward, such as an item requiring exactly one skill. Item construction constraints are a factor in the type of models that can be used in classification. Thus, the mapping described above gives important information about the type of models that can be constructed and whether the item pool needs to be augmented in order to better separate states. It can be used to analyze the performance of a fixed test, to see which states may not be separated by the fixed test.

The mapping on the domain model should be performed immediately after candidate domain models and candidate test item pools have been defined in order to provide insight as to possible constrains imposed on the model and possible flaws in the process for selecting candidate items for the test item pool. The mapping should be repeated for any modifications of the candidate models and test item pools.

Sometimes it is of interest to generate ideal response patterns. Consider the following example from the educational application. Given a poset model, suppose that the responsedistributions for Me items are Bernoulli, and that each item has two partitions. Then, given each item, it can be determined whether a test subject in a specified state in the poset model has the knowledge or functionality to give a positive response, in which case a "1" is used to denote the response. Otherwise a "0" is used to denote the response. The final sequence of 1s and 0s, ordered in the same way as the test items, is referred to as the ideal response pattern. For this case, the ideal response pattern for a test subject in the specified state are the responses that would be observed if the test subject's responses perfectly reflected the test subject's state.

In general, an ideal response for an item given a specified state can be any representative value of the class conditional density for the item. In the continuous response case, this could be the mean of the density. Further, instead of an ideal response value, the ideal response can be represented by an ideal set if values possibly including ideal intervals of values (depending on whether the class conditional density is discrete or continuous). An example of a possibly useful ideal response interval for an item given a specified state is the set of values within a specified distance from the class conditional density mean for that state. When the response is multi-dimensional, an ideal response could be a value or set of values in the multi-dimensional space of possible responses. Ideal response patterns will contain information about each item in a given item sequence.

Given a test subject response pattern g and an ideal pattern h, distance measures on the patterns can be used to gauge whether the ideal pattern is "close" to the test subject pattern. For the example above, a reasonable distance measure would be to count the number of discrepancies between patterns, with an ideal pattern said to be "close" to a test subject pattern if that number is less than a certain specified number, or, equivalently, if the percentage of discrepancies is less than a specified percentage. In general, we will consider distance measures between a test subject pattern g and an ideal pattern h given an administered sequence of test items such that, given a test subject pattern g, a distance measure will attain its minimum when g=h, where g is said to equal h, when h has ideal responses that are a value or set of values, when test subject responses are equal to or contained within the corresponding ideal responses. This minimum may not be unique.

These ideal response patterns can be used in model development in the following way. Given an exploratory sample of test subject response patterns, a state associated with an ideal pattern that is not "close" with respect to a given distance measure to any test subject's actual response pattern suggests that the state may be illusory and should be removed from the domain model. Conversely, if there are a number of test subject response patterns not "close" to any ideal patterns, this suggests that more states may need to be specified. Note that each test subject may have hi; own sequence of items, which would entail generating ideal responses for each state for each sequence. Also, as with combining a plurality of stopping rules to develop a new stopping rule, a plurality of distance measures can be combined to develop a distance criterion.

An essential step in the test subject classification process is the determination of the parameter values that characterize the class conditional densities associated with each test item and with each test subject state. Bayesian estimation of the class conditional density parameters is a standard statistical approach for obtaining parameter estimates and is analogous to the decision-theoretic framework used in classification (see Steven F. Arnold, *MATHEMATICAL STATISTICS*, Prentice-Hall, Englewood Cliffs, N.J., 1990, pp. 535–570). Bayesian estimation treats an unobserved parameter (such as the probability that a test subject in a given state will provide a positive response to a test item) as a random variable. The first step is the selection of an initial marginal density for the parameter of interest. This initial marginal density, called the prior distribution, represents a prior belief about the value of the parameter. Data is then collected and the prior distribution is updated using the Bayes rule to obtain a posterior distribution. A decision rule is employed that analyzes the posterior distribution and determines an estimate of the parameter. The "best" decision rule, provided it exists, is called the Bayes decision rule if it minimizes the integrated risk. The integrated risk is the expected value of a risk function with respect to the prior distribution, the risk function being the expected value of a loss function, and the loss function being a measure of the discrepancies between an estimate and the true parameter value. If the loss function is squared error loss for a continuous parameter, then the penalty in inaccuracy is measured by squaring the discrepancy between an estimate and the true value. For this particular loss function the Bayes decision rule is to take as the estimate the mean of the posterior distribution.

Bayesian estimation is just one way of obtaining parameter estimates. There are many other viable approaches to parameter estimation that do not necessarily involve specifying prior distributions, loss functions, etc.

It may be appropriate, depending on the situation, to perform trial classifications of a sample of test subjects using the candidate domain models and candidate test items. Such preliminary trials may reveal problems with the domain model (i.e. too many or too few states), problems with specifying item type, and problems with item discrimination between subsets of states. The preliminary trials may also be helpful in specifying the response distribution parameters for the test items and the initial SPS. A mapping of how well the items in the test item pool discriminate among the states of the domain model may suggest additional types of test items. Finally, a loss function for use in generating strategy trees must be specified.

Further development of the domain model and test item pool depends on tests of this initial configuration using a training sample of test subjects. The focus of the training sample experiments is to collect data concerning model fit and item effectiveness and to do so as efficiently as possible. Item selection for the training sample can be accomplished sequentially as previously described. For this purpose, a training sample strategy tree can be generated. The initial configuration is then exercised with the training sample.

Item types or states that are of particular concern should be the subject of replicated observations. For items of questionable utility insofar as discriminating among states, the updating of the gig can be deferred so that the observation conditions for a sequence of test items remains the same. Sequences conditional on specific response patterns can be inserted into the item selection sequence/strategy tree and used to test the presence of hidden states or to see if a state is superfluously included.

It is important that every parameter be estimated with enough data to insure accuracy. Items that might not be administered very often should possibly be inserted into the item sequence/strategy tree. Moreover, classification can be delayed by administering more test items to insure classification accuracy.

Data resulting from tests of the training sample are used to refine the estimates of response distribution parameters, and adjustments are made in the model and in the test item pool. Such adjustments may include respecifying item types and condensing models. The adjusted configuration is then exercised, possibly resulting in further adjustments in the domain model and the test item pool.

An estimate of the average classification performance expressed as the weighted value of the loss function in relation to various values of the initial SPS is then obtained through simulation based on the estimated results from the test item pool. This information is useful in deciding upon a final model and test item pool that will be used in classifying future test subjects.

Using the initial estimated item parameter values as specified by the prior distributions, classification of the test subjects in the training sample can be accomplished. A classifying function of the test subject's SPS is used to classify the test subjects. Based on these classifications, the item parameter values are updated. The classifications can then be updated using the new parameter estimates. This iterative process continues until there is reasonable confidence that estimation has been accomplished correctly, such as having the estimated values from iteration to iteration appearing to converge, e.g. the estimated values from iteration to iteration after a certain stage are within a predetermined difference.

An approach to choosing a test subject's classification is one which randomly selects a state in accordance with the current SPS values. One example of this approach is the estimation technique known as Gibbs sampling which utilizes an iterative framework (cf. A. Gelfand and A. Smith, "Sampling-Based Approaches to Calculating Marginal Densities, *Journal of the American Statistical Association* 85, 398–409 (1990)). For the system, it will many times be of interest to impose order constraints among the parameters associated with an item's partitions. Estimation in this context can also be conducted via Gibbs sampling (cf. A Gelfand, A. Smith, and T. M. Lee, "Bayesian Analysis of Constrained Parameter and Truncated Data Problems Using Gibbs Sampling", *Journal of the American Statistical Association,* 87, 523–532 (1992)).

Classification is very important to item parameter estimation because it is used as the basis of the estimates. More precisely, the classification information is used to represent test subjects' state membership. Estimation of the item parameters would be simple if the true states were known. The difficulty arises precisely because the test subjects' states are unknown. The sequential process of administering test items to the training sample of test subjects results in "sharp" posterior probabilities for state membership near 1 or 0, which in turn results in "sharper" item parameter estimates. Discrepancy measures such as those defined by equations (18) and (19) can be used to gauge sharpness. As in developing a separation criterion, a plurality of these measures can be combined for a sharpness criterion. For Bernoulli or multinomial distributions, "sharp" probabilities are those near 1 or 0 with one dominant response for each state.

After item parameter estimation for the training sample of test subjects has been completed, items that are not sharp are removed. Such items have a relatively greater likelihood of giving contradictory evidence as to the identity of the hue state because they do not differentiate between states very well.

A measure of an item's effectiveness is how the performance of classification changes overall when it is removed from the item pool. Responses to items that are not sharp have a relatively higher likelihood of giving contradictory information which decreases the sharpness of the posterior values of the SPS and is expensive in terms of the cost of observation needed to rectify the "damage". This in turn has an adverse effect on the sharpness of the other item parameter estimates. Removal of such items thus improves classification performance.

Before removing an item from the test item pool, the item should be checked as to whether it is properly specified as to type. For example, suppose an item is distributed as Bernoulli within both its partitions. Further, suppose that the item type is specified as AB in the poset model of FIG. 8 and the probability of a positive response for test subjects in the PDOI of state AB is significantly less than 1. It may be that the proper specification is actually a state higher than AB in the domain model such as ABC, ABD, or the union of ABC and ABD. On the other hand, suppose that the probability of a positive response for test subjects in a state lower than AB in the model is suspiciously high. The proper specification may actually be a state lower than AB such as A or B. The proper procedure to follow in such situations is to vary the type specification of the test item with the objective of finding a specification for which test subjects in the PDOI of the type designation provide a positive response with a probability reasonably close to 1 and test subjects in states less than the type designation provide a positive response reasonably close to 0.

Another possibility to be considered before removing an item from the test item pool is whether the response distribution itself may be misspecified. If certain erroneous responses occur frequently, it may be appropriate to consider more complex response distributions. For example, a Bernoulli distribution might be extended to a multinomial distribution. Responses from the training sample of test subjects provide information as to frequencies of occurrence of the different responses. Histograms of these response frequencies can be constructed based on the classification results. Distributions can then be reformulated and the new parameters estimated.

Analysis of erroneous responses can speed classification. Suppose initially that an item has a two-element partition (one a PDOI) and that the response distributions are Beroulli. Further, suppose that a certain erroneous response gives strong evidence that a test subject has a particular lack of functionality and/or lack of possession of a particular set of facts. The response distribution for test subjects in the complement of the PDOI may be respecified to a multinomial to take into account this particular erroneous response. The response distribution for states not in the complement does not necessarily have to be changed as well. A third partition within the complement set may be created to reflect that the particular erroneous response strongly suggests membership in it. Hence, rather than grouping all erroneous responses as negative, information about such responses can be exploited in the classification process. The above scenario illustrates the utility in being able to repacify item type and/or the type of response distributions.

If a test item is under suspicion initially, then a well-designed training sample should replicate the item's type in question to directly compare performance of the estimates. Examining similarly constructed items should help in verifying both the type specification and assessing relative performance.

Model fitting and item analysis are very much intertwined. An important consideration in evaluating item performance is the possibility that the model itself may be misspecified. A misspecification in the model may lead to parameter estimates for an item that are not sharp when they actually should be. This can happen if a state representing an important cognitive ability or function is hidden and a misspecified item involves that ability or function. The misspecified item may in fact be very good in terms of differentiating knowledge or functionality levels. By correcting the model, this may become apparent. On the other hand, models may not appear to fit well due to poor items. Thus, both possibilities must be examined simultaneously.

A way of determining whether a model is a good fit is to analyze the classification performance assuming that the items are all good discriminators having sharp distributional properties and that they are specified correctly. Consider the description below as an illustration. For the sake of discussion, suppose that the items are associated with a state and have two partitions.

Figure 8:
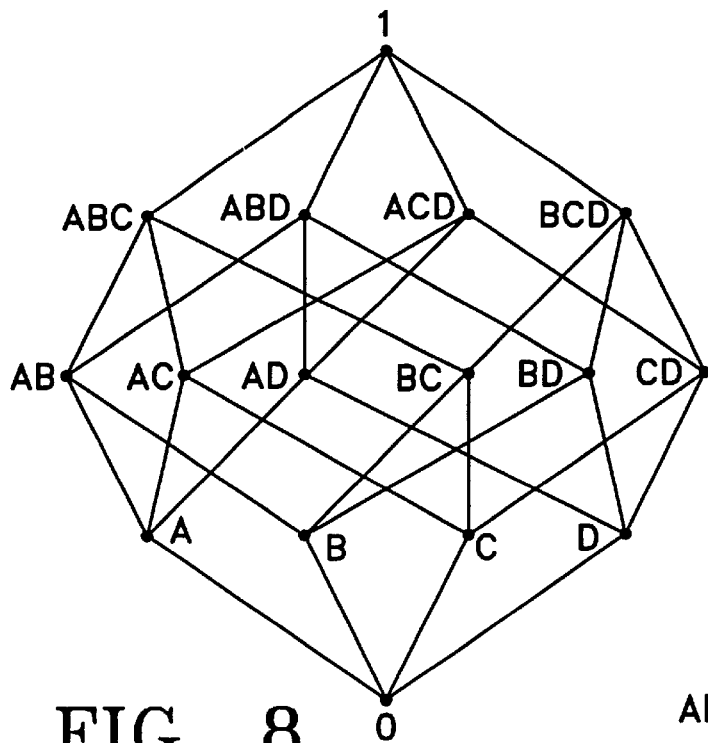
FIG. 8 depicts a more complicated poset model as a Hasse diagram.
Figure 9:
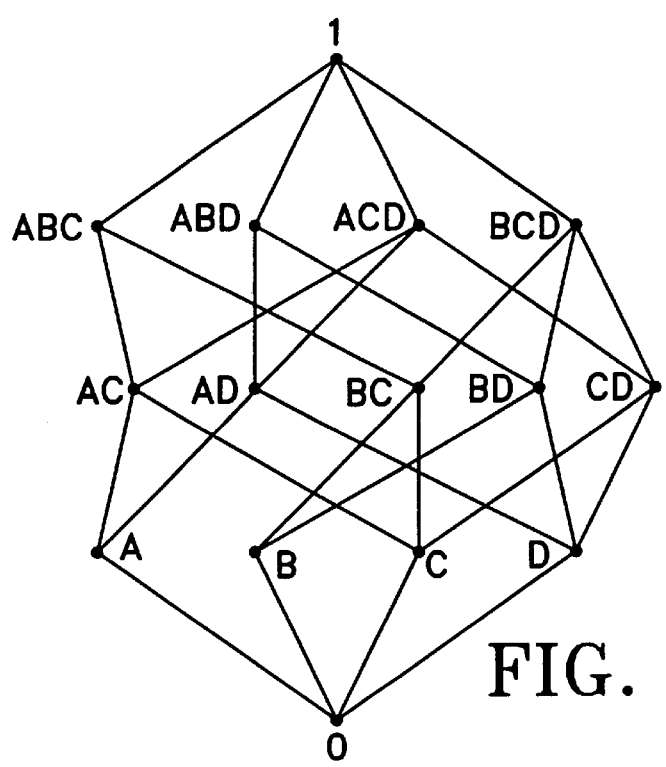
FIG. 9 depicts the poset model of FIG. 8 with a missing state.

For example, let the true model be the poset shown in FIG. 9 and the specified model be the poset shown in FIG. 8. In this situation state AB is superfluous. Suppose the items specified as type AB (if they exist) are really of type {ABC,ABD}, the union of ABC and ABD. Test subjects should then be correctly classified and few will be classified to state AB.

For a second example, suppose that the poset in FIG. 8 is the true model and the one in FIG. 9 is the specified model. The state AB is hidden insofar as the specified model is concerned. Let the items truly of type AB be specified as {ABC,ABD}. Eventually, the mass will be distributed among the states that act as "covers" of AB and those states that are "covered" by AB, i.e. ABC, ABD, A, and B, provided the appropriate item types are administered. If the item pool does not contain an item truly of type AB, test subjects not in AB will be classified without problems. If the test subjects are in AB, again mass will eventually be distributed to the states directly above and below AB, depending on the item selection sequence.

For a third example, when a hidden state from the poset shown in FIG. 8 is a cover of 0 such as A and there are no A-type items, test subjects in state A will most likely be classified to 0. If items truly of type A are present in the test item pool and specified as {AB,AC,AD}, the same phenomenon as in the second example may occur.

Figure 10:
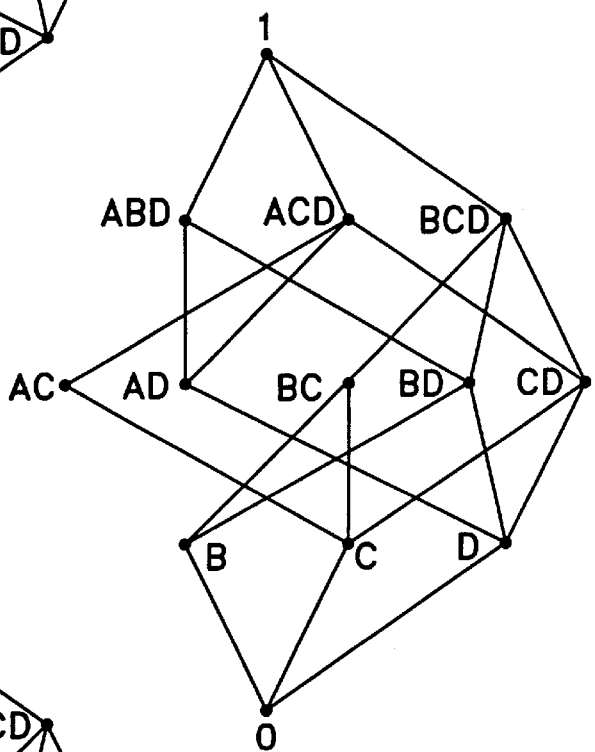
FIG. 10 depicts the poset model of FIG. 8 with many states missing.

For a fourth example, let the poset shown in FIG. 10 be the specified model, again assuming the true model is the poset shown in FIG. 8. With a large missing section as illustrated in FIG. 10, it is more difficult to discover the true model. The conclusions about mass distribution with states missing from the poset can be generalized to apply to specified models having large missing sections. It is necessary to identity what the covers would be for each missing state among the states within the specified model and the states within the specified model that would be covered by each missing state if it were included in the model. Building up large missing sections may require several steps in model fitting.

For a fifth example, assume that a test subject is meandering, i.e. his or her response pattern is erratic involving a genies of responses that are contradictory. This situation cannot be explained either by improper type-specification of the test items or by an ill-fitting model.

It follows from the above examples that if items are sharp and correctly specified for the model at hand and if the model is overspecified with too many states, those that are not really valid in a practical sense should have few test subjects classified to them and should be removed from the model. On the other hand, if a state is missing, then classification should in most cases not be strong to any state for test subjects belonging to that missing state.

Erratic response patterns should be carefully examined. A significant number of test subjects sharing similar aberrant patterns (i.e. patterns that do not lead to a dominant posterior value emerging) strengthens the evidence that a state may be missing and should indicate its location in the poset. Test subjects that meander with inconsistent response patterns may need to be eliminated from the trial sample.

The description of the invention has thus far focused on domain models based on discrete posets as exemplified in FIGS. 1, 5, 8, 9, and 10. Domain models can also be based on a combination of a discrete poset and a subset of Euclidean space. In the combination model, test subject states are represented by both a state s in the poset and the value of a continuous parameter t which may be multi-dimensional. For example, the parameter t might correspond to the intelligence quotient of the test subject. A sensible partial order for elements in the combination model would be to let $(s_1,t_1)$ be lower than or equal to $(s_2,t_2)$ if and only if $s_1 \leq s_2$ in the discrete poset and $t_1 \leq t_2$ in the subset of Euclidean space. Items not involving the cognitive or functionality attributes represented by t still partition the discrete component as before. Items involving the attributes represented by t can partition the discrete poset component according to whether the discrete state class conditional densities given a value of t coincide for all values of t. Thus, the mapping to determine separation of the states in the discrete poset component given a pool of test items can be applied in the context of the combination model as well.

The responses for a finite poset model might be distributed discretely or come from a continuous distribution such as a normal distribution. Moreover, the distributions within the same item's partitions may vary. For example, one partition may be multinomially distributed, while the other may be a Bernoulli trial. For combination models, the responses given a state in those models may also be discrete or continuous. Again, distribution Vpcs between an item's partitions may be different for the combination model. An example of a continuous response distribution is a normal distribution with mean t and variance $\sigma^2$.

The class conditional densities $f_i$ and $g_i$ for a combination poset-Euclidean space model might be $$f_i(X=1|s,t)=H(t-\alpha_1) \text{ if } e(i) \leq s$$

$$g_i(X=1|s,t)=H(t-\alpha_2) \text{ if } e(i) \not\leq s \quad (25)$$

where $X=1|s,t$ denotes a positive response given s and t and $$H(t) = \frac{pe^t}{1 - p + e^t} \quad (26)$$

The parameter p is a known quantity in the range from 0 to 1 and t is real-valued. Note how the distributions associated with the densities $f_i$ and $g_i$ reflect the underlying order structure of the combination model.

The same statistical framework applies as before. The initial SPS (prior distribution) is a probability density function and is given by $$\pi_0(s,t)=\pi_0(t|s)\pi_0(s) \quad (27)$$

where the first term of the product is the conditional probability density value of t given s and the second term is the marginal probability of s.

Posterior distributions $\pi_n(s,t|\underline{x}_n)$ can be calculated by Bayes rule given response path $\underline{x}_n$. An example of a loss function for a combination model is $$L(s_0, t_0, d, n) = \begin{cases} A_1(s_0) + K(t-t_0)^2 + \sum_{n=1}^{N} C(i_n); & s = s_0 \\ A_2(s_0) + K(t-t_0)^2 + \sum_{n=1}^{N} C(i_n); & s \neq s_0 \end{cases} \quad (28)$$

where the state d resulting from the application of a particular decision rule is a function of the final $\pi_n(st|\underline{x}_n)$ and implies the values s and t. The constant K is a scaling parameter greater than 0.

Strategy trees are applicable to combination models as well. Quantities which can provide a computationally simple basis for stopping in the "peel-back" context described above are the posterior variance(s) of t:

$$\sum_s \int (t - u_n(s))^2 \pi_n(t|s) \pi_n(s) dt \qquad (29)$$

where the mean of the conditional distribution is given by $$U_n(s) = \int t\pi_n(t|s) dt \qquad (30)$$

and the marginal posterior values for s in S are given by $$\pi_n(s) = \int \pi_n(s,t) dt = \int \pi_n(t|s) \pi_n(s) dt \qquad (31)$$

Note that the probabilities of test subjects being in partitions of the discrete poset component can be calculated using the marginal posterior values. These probabilities can be used in item selection rules such as in equation (4). Also, the mapping $\Phi$ can still be applied on states in S as well as for elements in the combination model, for instance, by employing weighted discrepancy measures on the class conditional densities given values of t.

The equation for $sh_1(\pi_n)$ becomes $$sh_1(\pi_n, i) = \qquad (32)$$
$$\int En(\pi_{(n+1)} | X_{(n+1)} = x, It_{(n+1)} = i) P(X_{(n+1)} = x | \pi_n, It_{(n+1)} = i) dx$$

where $$P(X_{(n+1)} = x | \pi_n, It_{(n+1)} = i) = \sum_{s \in S} \int f_i(x|s,t) \pi_n(s,t) dt \qquad (33)$$

The equation for $Kg_1(\pi_{n,i})$ becomes $$Kg_1(\pi_n, i) = \sum_{s \in S} \int \int |\pi_{(n+1)}(s, t|X_{(n+1)} = x, It_{(n+1)} = i) - \qquad (34)$$
$$\pi_n(s, t)| \cdot f_i(x|s, t) \pi_n(s, t) dx dt$$

where $f_i(x|s,t)$ is the response distribution density value at x of item i given s and t. The quantity $\pi_{(n+1)}(s,t|X_{(n+1)}=x, It_{(n+1)}=i)$ is proportional to $f_i(x|s,t)'n(s,t)$.

The k-step version of the above equation is $$Kg_k(\pi_n, i) = \sum_{s \in S} \int \int \{\min_j Kg_{(k-1)}[(\pi_{(n+1)} | X_{(n+1)} = x, It_{(n+1)} = i), j]\} \cdot \qquad (35)$$
$$f_i(x|s, t) \pi_n(s, t) dx dt$$

where "min over j" means the value of the quantity in brackets for an item j from the preceding available item pool which minimizes the value.

In general, all of the item selection, stopping, decision, and updating rules generalize straightforwardly for use with the combination model. Also, fixed tests can be designed, and ideal patterns can be employed.

An important application of the system and of the combination model in particular is in medical diagnosis. The application of the above classification framework and techniques is completely analogous. Items can be viewed as experiments or tests, and the underlying model can represent various conditions related by a partial order structure. For instance, three states can be used to represent a diabetes condition, with one state representing no condition, another state representing Type I diabetes (insulin-dependent), and a third state representing Type II diabetes (non-insulin-dependent). The ordering between these states is natural in relation to the no-condition state, and for the sake of discussion, the states representing Type I and Type II respectively will be assumed to be incomparable. Further, the corresponding class conditional response distributions of experiments such as measuring glucose levels in blood should reflect that ordering, in the sense that the higher the observed responses, the more likely a diabetes condition exists. It is when the response distributions reflect the underlying order structure of the model that the system works most effectively, so that medical applications are well-suited for the system. Of course, it is likely that the class conditional response distributions for the Type I and Type II conditions differ. Other experiments which separate states may be necessary to increase the accuracy in diagnosis. As an example of a multi-dimensional continuous response, an experiment may measure the levels of glucose and ketones together, where ketones are small fragments from the breakdown of fatty acids. The corresponding class conditional densities would then be multivariate. If the levels of glucose and ketones are interrelated, then it may indeed be more informative to measure them together.

Perhaps the diabetes condition or other medical conditions could more appropriately be modeled as a continuous variable within a discrete state such as in a combination model. In general, the poset or combination model can get more complex as various auxiliary conditions are introduced which may or may not be present in conjunction with other conditions, and each of which may have their own natural ordering. Note how the auxiliary conditions may themselves have an effect on experiment responses. This can be modelled by specifying an appropriate partition for an experiment in terms of class conditional densities.

Various types of experiments having a variety of class conditional response distribution types can be administered sequentially which may have different objectives in terms of what they measure. Costs of observation for the experiments can be incorporated into the analysis, as before. Hence, not only cm this system be used to conduct actual medical diagnosis, but it can be used to gauge the cost-effectiveness of the experiments. Experiments whose contribution to the classification process do not on average overcome their cost of observation can be identified as they will not be selected with a high weighted frequency and/or probability of administration for instance with respect to SPSs and class conditional densities.

In an adaptive testing system of the type described herein, a test subject is given a test item selected form a pool of test items on the basis of how the test subject responded to prior test items in the test sequence. A great gain in efficiency in terms of the number of test items that need to be administered to a test subject can be obtained by a strategic selection of test items, since test items vary in the knowledge or functionality needed to answer them. Adaptive testing can keep advanced test subjects from being tested redundantly on material that they have already demonstrated a knowledge of, and less advanced test subjects can be kept from being discouraged by not being tested on material which they clearly lack the knowledge to deal with.

As we indicated earlier, the first objective of the present invention is to provide meaningful an accurate representations of a cognitive domain in the case of humans and a functionality domain in the case of systems (where "systems" includes humans considered as systems) through the use of partially ordered sets (posets) and subsets of EUCLIDEAN space. The second objective of the present invention is to provide a method for efficiently and accurately testing and classifying humans into cognitive domain states and systems into functionality domain states. The third objective is to provide a remediation program keyed to a domain state and designed to bring a human or a system to a higher domain state.

When the test subject is human, it is often desirable to classify the test subject as to its knowledge and also as to its functionality where functionality may refer to intelligence, ability, creativity, imagination, or some other such attribute of the human being. It should be emphasized at this point that both the cognitive model and the functionality model for a human being could in general be the combination of a poset and a subset of EUCLIDEAN space. Thus, to classify a human as to knowledge and functionality would require two separate models.

In the case of standardized tests, it is also important to determine a "score" associated with a test subject's performance. This score can be used as a representation of the test subject's intelligence, ability, creativity, or some other such attribute and is usually a single or multi-dimensional number. Importantly, this score can be used to determine whether a test subject is likely to succeed in particular endeavors or as a guideline for admission into programs or schools. Hence, accurately estimating such a score in an adaptive testing context is an important practical issue. The invention described herein provides an efficient and accurate means for conducting cognitively diagnostic adaptive testing while simultaneously estimating a score.

The objective for a scoring model is to assign to a test subject a value in a predetermined subset of Euclidean space. Moreover, it is assumed that every test subject can be assigned a value in this subset. Let us call this value $\theta$ and note that $\theta$ may be multidimensional. A possible interpretation of $\theta$ is that a test subject's intelligence, ability, creativity, or some other such attribute is represented by the test subject's $\theta$ value. A natural ordering would be that a test subject with higher intelligence, ability, or creativity is associated with larger values of $\theta$. In the k-dimensional setting (k>1), a natural ordering of the elements would be that $$(x_1, \ldots, x_k) \leq (y_1, \ldots, y_k) \text{ if } x_j \leq y_j \quad (36)$$

for each coordinate j=1, 2,. . . ,k. This is known as coordinate-wise order. Minor modifications of coordinate-wise order are possible (cf. Davey and Priestly, *Introduction to Lattices and Order*, Cambridge University Press, 1990). Classification (i.e. assigning a score) is accomplished as previously described in connection with poset models— through a test subject's responses to test items. Here also, item selection, stopping rules, and classification rules are involved.

The combination model described above is applicable here by assuming that the discrete states of the model denote intelligence, ability, creativity, and any other attribute one might be interested in scoring. The EUCLIDEAN components of the model provide measures of the degree of intelligence ability, creativity, et cetera. Thus, the techniques of the combination model for item selection, stopping and classification can be used in the scoring model context when SPS functions are being employed. This includes rules based on uncertainty measures and other types of measures. It should be noted that an alternative model for a unidimensional subset of Euclidean space is a discrete model with linear order (i.e. a poset $x_1 < x_2 < x_3 \ldots < x_n$, n total elements). An alternative model for a multidimensional subset could also be a set of discrete points, this time with coordinate-wise order.

In the case of the EUCLIDEAN component of the scoring model, items in the item pool are assigned a response distribution function such that conditional on each possible value of $\theta$ there is an associated response distribution. Examples of such response models include Item Response Theory MM models such as the one used for illustration below. See Frederick M. Lord, *Applications of Item Response Theory to Practical Testing Problems*, Lawrence Erlbaum Associates, Hillsdale, N.J. (1980) for a detailed discussion of IRT models, which include the 1-, 2- and 3-parameter logistic response models. A commonly used model is the Rasch model (the 1-parameter logistic model). Unless stated otherwise, in this preferred embodiment, the Rasch model will be the response distribution model of choice. Suppose that $\theta$ is unidimensional, e.g. $\theta$ belongs to an interval in a real line. Also suppose that the possible responses are Bernoulli, i.e. that they are either "correct" or "incorrect". For the 3-parameter logistic response model, the probability of success $P_i(X=1|\theta)$ for observation X (X=1 denotes success) for item i as a function of $\theta$ is given by $$P_i(X = 1 | \theta) = c + \frac{1-c}{1 + e^{-1.7a(\theta-b)}} \quad (37)$$

where a, b, and c are constants.

The Rasch model (1-parameter logistic response model) can be obtained from this more general formula by setting c equal to zero and a equal to one. The 2-parameter logistic response model can be derived from the above equation by setting c equal to zero. It is important to note that the probability of success increases as $\theta$ increases. Further, in the Rasch model, items can be associated with a difficulty parameter b, where b is real-valued.

Note that as b increases, it becomes less likely that a test subject associated with a given $\theta$ value will get an item correct. More generally, the set of possible values of outcomes for the responses can be more complex than just "correct" or "incorrect".

Multinomial or even continuous response distributions which are functions of $\theta$ can be assigned to items. Also, the "score" may be a transformed value of $\theta$. For instance, sometimes it is of interest for the distribution of the test-subject-estimated $\theta$ values to have certain characteristics, such as having certain mean and/or standard deviation values. Affine transformations can be applied to estimated $\theta$ values in order for the transformed $\theta$ values to possess desired population characteristics.

In the case of the scoring model, as in the cases of the discrete and combination models, a prior probability distribution over the possible values of theta that a test subject may be associated with can be assigned to each test subject, and the posterior probability distribution $\pi_n(\theta_0|X_i, \ldots, X_n)$ can be updated after each response where $X_1, \ldots, X_n$ are observations after item administrations of items $i_1, \ldots, i_n$, and $\theta_0$ in a the in the underlying model.

$$\pi_n(\theta_0 | X_1, \ldots, X_n) = \frac{P_{i_1}(X_1 | \theta_0) P_{i_2}(X_2 | \theta_0) \ldots P_{i_n}(X_n | \theta_0) \pi_0(\theta_0)}{\int P_{i_1}(X_1 | \theta) P_{i_2}(X_2 | \theta) \ldots P_{i_n}(X_n | \theta) \pi_0(\theta) d\theta} \quad (38)$$

where $\pi_0(\theta)$ is the density value of $\theta$ for the prior distribution. For clarification, note that if there is statistical dependency between items, the joint density of the items given $\theta_0$ could be used in the above equation. Also note that in general an SPS can be updated after a set of responses are observed, and not just after each time a response is received. Such updating may be particularly useful when fixed sequences of items are being administered. Item selection, stopping add classification rules also can be applied.

A standard loss function for the scoring model is squared error loss. Formally, this loss function takes the form $$L(\theta \theta_0) = (\theta - \theta_0)^2 \qquad (39)$$

where $\theta_0$ is the true score value. Given a prior distribution $\pi_n$ and observations $X_1, X_2, \ldots, X_n$, the Bayes classification decision rule selects the value $\theta_{est}$ that minimizes the expression $$\int L(\theta_{est}, \theta) \pi_n(\theta | X_1, X_2, \ldots, X_n) d\theta \qquad (40)$$

Let us define an original poset model as either a discrete or combination poset model such as those described earlier. Unlike the original poset models, the structure underlying the scoring model is predetermined to be a subset of Euclidean space. However, the range of the $\theta$ values may need to be determined.

The difficulty parameters in the Rasch response models corresponding to each item can be estimated with a training sample using standard MLE estimation (cf Lord, p. 179). Gibbs sampling and related approaches could be used as well. In the preferred embodiment, a single Rasch model per item is assumed to describe all the possible class conditional response distributions for an item in the scoring model. Usually we assume that the responses are statistically independent and the likelihood function for $\theta$ is just the product of the density values of the observations for each item and test subject. When the items are not independent, the likelihood can be the joint density evaluated at the response values. A more general definition of likelihood would be that it is a function of the likelihood function just described.

Now the item difficulty parameters and each test subject's theta value are unknown in the training sample. One approach to maximum likelihood estimation of all these parameters is to iteratively estimate the test subject $\theta$ values, fixing the item parameter values in the likelihood equations, then estimating the item parameter values fixing the new estimated $\theta$ values, etc., until convergence of the parameters is attained. The estimates at each iteration could for instance be the values that maximize the likelihood functions. For the Rasch model, the values that maximize the likelihood functions are unique. Standard numerical techniques such as the Newton-Ralphson or conjugate gradient methods can be used to find the estimates. After the estimation process, the resultant estimated item parameter values can be assigned to the respective items and treated as the "true" values during subsequent classifications.

Once again, a concern of this invention is to obtain detailed cognitive information as provided by classification to knowledge states in an original poset model while simultaneously determining functionality, a simple example of the latter being the determination of a real-valued, possibly multi-dimensional score. Adaptive testing is an efficient means of obtaining this information simultaneously.

One approach to achieving this objective would be to use a combination model as described above. Recall that within the combination model system, the item response distributions may be conditional only on the discrete states in the model, states and values in both the respective discrete and continuous components, or on a value in the continuous component only. The classification objective of the system when the underlying model is a combination model is to identify to which state in the discrete component a test subject belongs while also identifying a value for the test subject in the continuous component. A classification rule will thus assign a test subject to a state in the discrete component and a value in the continuous one. This type of model can thus be used for obtaining a score for q test subject by treating the continuous component value as the "score" while still providing cognitive information as embodied in the discrete component of the model. Again, as described earlier, the prior probability structure could take the form $$\pi_0(s,t) = \pi_0(t|s)\pi_0(s) = \pi_0(t)\pi_0(s) \qquad (41)$$

where s is a state in the discrete component and t is a score value in the continuous component.

When a combination model already is the natural classification model, another possibility is to add a dimension to the continuous component of the model. This added dimension (or dimensions) would represent the score value. In order to complete this incorporation for classification purposes, at least some of the items would need to have item response distributions conditioned on the score value. In other words, the response distribution will be a function of the score value. Otherwise, item responses would not give any statistical information concerning the scoring dimension (i.e. marginal posterior probability distributions for the score value won't change from stage to stage). As for identifying partitions of a discrete component of a model when items have response distributions that depend on a continuous component, recall that partitions can be states that share the same response distributions as a function of the continuous value over all continuous values. For instance, a partition could be the discrete states that share the same IRT curves as in equation (38). Note that once a discrete model has been generated, a continuous component can be attached. Once again the idea of ideal response patterns can be extended to combination models. For instance, the same ideal pattern can be assigned to a resultant intersection of partitions, where partitions for combination models could be as described directly above.

It is important to note that the combination model does not require separate parallel statistical item information specifically based on a scoring model, and relies only on the specifications for the combination model described above. Only one prior distribution is assigned on the classification model, and items have response distributions assigned only with respect to the combination model. In a sense, kilo the scoring model is incorporated within the combination model.

It is possible that it may be natural to specify items with conditional response distributions based only on the discrete states. An alternative would then be to employ a discrete model while at the same time employing a parallel scoring model. In such a situation, selection of test items can be conducted( in a dual, parallel fashion. The main pieces of information used for classification into a knowledge state or estimation of a score are the responses to items. With this approach each item is assigned response distributions based dully on both of the parallel models. In other words, items would have response distributions as in the original formulation and would also be assigned response distributions in the scoring model separately.

In the material that follows, the term "within model" refers to procedures conducted within one particular model. The term "between model" refers to procedures conducted between parallel models such as described above. Thus, a "between model" operation involves information from parallel mode A "within model" operation involves information from one model only. The term "parallel models" refers to models that may share an item pool or have separate item pools, yet classification is conducted within each model and items have parallel response distribution information assigned to each of the models.

Item selection rules could be employed concurrently at each stage within the context of each model. If two real-valued criteria are used respectively as item selection criteria, in order to combine these selection rules, they can be combined into one value. This can be done by taking the two criterion values and plugging them into a function, in order to obtain a single value. This new value could then be used as a new criterion on which to base item selection. An example is given below.

First, let us give a brief summary of the steps involved in implementing this approach of using parallel models. As before, an item pool must be assembled. Also as before, a discrete model (or combination model) is generated as well. The scoring model of the preferred embodiment is unidimensional, although clearly it could be more complex, such as a multi-dimensional or a combination model with a non-trivial discrete component. For both the original model and the scoring model, a prior probability distribution (SPS) should be assigned to each of the models. The new step here (as opposed to implementing the combination model described above) is to assign a completely separate SPS to the scoring model as well, in addition to the one assigned for the original model.

For each item, as before, a class conditional response distribution is assigned to each state in the model (e.g. f(x|s) for all states s if S is a discrete model). Recall that in the combination model some items may have class conditional response distributions with respect to the discrete states only, both discrete and continuous states, or continuous states only. The new step here is to also assign to each item another, separate conditional response distribution function. This one is based on a scoring model only, and is conditioned on a score value. The result is that an item has two sets of response distribution information, one for the discrete-state model and one for the scoring model.

As before, a single sequence of items is to be administered to a test subject. One objective of the testing is to classify a test subject to a state in the original model. A second objective is to accurately estimate a score using the separate, parallel statistical information on the items and the separate SPS for the scoring model. Items are selected by first using criteria within each model (the poset or combination models and the scoring models), using the corresponding item response distribution information and SPS functions. In other words, each model is treated as if it were the only one. The system proceeds within the context of each model separately using item selection rules as if each model is the only one that exists. These steps are conducted in isolation within each model. Thus, this new approach runs two parallel systems at the same time instead of just one.

Still, at each stage, only one item can be administered to a test subject. The item selection criteria for the original model may suggest an item different from the one suggested by the item selection criteria for the scoring model. Both suggestions will usually be based on criteria that are functions of the respective item response distribution information and SPS functions. An important function of this approach is to integrate the item selection information of the two systems.

In other words, a compromise is struck between the items found desirable within each model. Again, at a given stage, only one item can be administered. Information from both of the parallel systems is used to make a decision on the item selection. Item selection can be randomized, such as through simulated annealing. Randomization at this stage will be referred to as between-model randomization. See also the discussion below about randomization based on exposure rates. Note that randomization can be conducted in the context of within-model item selection and/or between-model item selection. Once an item is selected and the test subject's response is obtained, the SPS functions are updated in each of the systems. Stopping rules can be treated the same way, using information from both of the systems.

Finally, classification is conducted within each system, thus resulting in an estimated score and at the same time classifying to a state in the discrete model. Note that separate classification rules are applied within the discrete (or combination) model and the scoring model.

It should be recognized that in general, the unidimensional scoring model can be viewed as a simple version of the combination model (the discrete component consists of only one state). Hence, all item selection (and stopping and classification rules) can be applied directly within the scoring model.

Recall now the halving algorithm described above, a heuristic which selects the item that has posterior probability mass on the states representative of the knowledge that a test subject must have to get the item correct closest to one-half. Denote this item selection rule by $h(\pi_n, i)$ (see above). As usual ties are randomized. Note that this algorithm can be applied to the scoring model as well when a SPS function is being used to embody the uncertainty of a test subject's true score value.

In the unidimensional-score setting, the halving algorithm will select an item that has the difficulty parameter value corresponding to a point in the scoring dimension such that the posterior distribution's mass above that point is closest to one-half. We denote this rule as $h'(\pi'_n, i)$. Precisely at stage n, an item is selected that minimizes $$h'(\pi'_n, i) = \left| \int_{b_i}^{\infty} \pi'_n(\theta) d\theta - 0.5 \right| \tag{42}$$

where i is an item with difficulty parameter $b_i$ and $\pi'_n$ is the posterior probability distribution of $\theta$ up to stage n.

Corresponding halving algorithms can thus be applied simultaneously within the poset/combination model and the scoring model. Two objective function values result, and these can be combined into one value (or treated as a vector of values). An obvious approach would be to add the two values or weighted versions of the two values. An item which minimizes the sum of the two objective function values would be the most desirable with respect to such a criterion. Such a combined measure has the desirable property of increasing as one of the values increases, the other being held fixed. Moreover, if an item is unattractive by both criteria, note that it is unattractive in the combined measure. Clearly, more than two objective function values from either of the models may be combined in a similar manner.

Formally, letting h and h' denote the halving criterion values in the poset or combination model and scoring model respectively, an item is selected from the remaining item pool which mnimizes $$\alpha h(\pi_n, i) + \alpha' h'(\pi'_n, i) \tag{43}$$

where $\alpha$ and $\alpha'$ are weights.

Multiplying the two objective-function-based values and considering their product is another possible approach.

Note that this technique of combining item selection rules based on objective functions can be applied within the discrete poset/combination model as well. In other words, various objective-function values based on the same combination model can be combined into one value, as above.

A method for ranking items for selection according to a given set of item selection rules was described previously. The idea is to rank items in effectiveness relative to each criterion within a given set of criteria. Each ranking within a given criterion is represented by a numerical value (e.g "1", "2", etc.). A weighted average of these rankings can then be used to combine the rankings into one selection criterion. Clearly such a method can be applied within each of the models that are being considered in parallel. Moreover, this ranking approach can be used between parallel models as well. In other words, items from the same item pool can be ranked after item selection criteria have been applied within each model. After, these rankings of item effectiveness within each model can then be weighted and averaged between models, in order to obtain a combined measure of the relative effectiveness of the items between models. Randomization of item selection based on the rankings can be conducted within models, as described previously, and/or between models. For instance, item selection could come from randomizing selection among the highest ranked items from each model.

Note that this ranking approach is related to the method for combining item selection rules between models as described for instance by equation (43). In that case, the ranking values with respect to a given criterion is just the item criterion value itself.

Alternatively, instead of employing item selection rules based on the scoring-model system, item selection can be conducted strictly within the original model. Suppose the model is discrete. Once a classification is made, the test subject can then be assigned a value within the scoring model. This can be done for instance by generating an ideal response pattern for each state, as described previously. For instance, an ideal response pattern of a state for Bernoulli responses can be a vector of 0's and 1's representing idealized responses to items, with an idealized response being 1 if a test subject in the state has the knowledge or functionality to get the item correct, 0 otherwise. From this ideal response Pattern, once item response distributions for the scoring model are assigned to each of the items, a value of theta can be estimated. A test subject's estimated $\theta$ value could be the average value of these associated $\theta$ values with respect to the student's final posterior probability distribution. Specifically, $$\theta_{est} = \sum_{all\ states\ s} \theta_s \pi_n(s) \qquad (44)$$

where $\theta_{est}$ is the estimated value, $\theta_s$ is the $\theta$ value associated with the state s, and $\pi_n(s)$ is the posterior probability value for the state s.

Similar modifications on item selection and stopping rules can be employed. For instance, another possible approach to obtaining an accurate score while classifying within the discrete poset/combination model is to employ rules that are based on the discrete poset/combination model until certain conditions are met, such as stopping criteria. As long as these criteria are met, rules solely based on the scoring model or combined criteria from both models such as above could then be employed. Other possibilities are to employ discrete poset/combination model or scoring model rules exclusively, and then after stopping is invoked, classify the test subject in the discrete poset/combination and scoring models using the same item responses.

As for the combination model discussed previously, a natural stopping rule for the scoring model based on the SPS function would be to stop if the variance of the posterior distribution is less than a given value. Of course, other stopping rules can be used in conjunction, such as those based on objective functions of SPS values (see above). It is also natural for instance to employ the Bayes classification decision rule, which minimizes the average loss with respect to the final posterior distribution.

Standard methods exist for adaptive testing in the scoring model which do not specifically rely on loss functions or SPS functions. For item selection rules and response distributions based on the Rasch model, this includes choosing items for which the value of the difficulty parameter is closest to the maximum likelihood estimate (MLE) of theta based on the items administered up to the current stage (cf. Lord, 1980). Many methods are based on a likelihood function. Note that the SPS function is a function of the likelihood function as well. Formally, given observations $X_1, \ldots, X_n$ and corresponding item difficulty parameters $b_1, \ldots, b_n$, the (n+1)'th item selection for this rule is the item remaining in the item pool with item difficulty parameter in its Rasch model whose value is closest to the current maximum likelihood estimator value for $\theta$ for the test subject. This item selection rule for the Rasch model is equivalent to maximizing the Fisher information function evaluated at the MLE for $\theta$ (see below). Formally, the MLE of $\theta$ is the value that maximizes the expression $$L(\theta \mid X_1, \ldots, X_n) = \prod_{i=1}^{n} \left(\frac{1}{1+e^{-1.7(\theta-b_i)}}\right)^{X_i} \left(1 - \frac{1}{1+e^{-1.7(\theta-b_i)}}\right)^{1-X_i} \qquad (45)$$

with respect to $\theta$ given $X_1, \ldots, X_n$, and $b_1, \ldots, b_n$. Note that the MLE is just the Bayes decision rule when the original prior distribution is uniform and 0–1 loss is used. The 0–1 loss function takes the value 0 if the decision rule selects the true state in the scoring model, the 0–1 loss function otherwise taking on the value 1. When 0–1 loss is used, it is well known that the Bayes decision rule is the mode of the posterior distribution. Hence, the MLE can be formulated in the context of SPS and loss functions, and item selection, stopping and classification rules based on MLE can be described in such terms.

The Fisher information for the Rasch model for theta, given item difficulties $b_1, \ldots, b_n$, is given by $$I(\theta) = \sum_{i=1}^{n} \frac{[dP_i(X=1 \mid \theta)/d\theta]^2}{[P_i(X=1 \mid \theta)][1 - P_i(X=1 \mid \theta)]} \qquad (46)$$

where $P_i(X=1|\theta)$ is the response distribution function of item i as a function of $\theta$. See for instance Lord (1980). The formulas of the Fisher information for the 2- and 3-parameter logistic response models can be derived from equation (46) as well. In general, the Fisher information can be calculated straightforwardly for a wide variety of response distribution models.

It is well known that the asymptotic variance of the MLE of $\theta$ where $\theta_0$ is the true value of $\theta$ for the test subject whose responses are being sampled is the reciprocal of the Fisher information evaluated at $\theta_0$. A reasonable stopping rule would be to invoke stopping if $$\frac{1}{I(\theta_{est} \mid X_1, \ldots, X_n, b_1, \ldots, b_n)} < c \quad (47)$$

where c is a constant and $\theta_{est}$ is an MLE of $\theta$.

This rule has theoretical justification, since asymptotically the variance of the MLE under the above item selection rule can be approximated by this quantity (cf. H. H. Chang and Z. Ying, *A Global Information Approach to Computerized Adaptive Testing*, Applied Psychological Memurement, Vol. 20, 213–229 (1996)). Clearly, other stopping rules can be used in conjunction (or separately), such as stopping if a certain number of items have been administered, or a stopping criterion is satisfied in the original system.

Note that the inverse of the Fisher information has the following properties for any given value of $\theta$, it is non-increasing as a function of the number of items administered and it tends to its minimum value (zero in this case) as the number of items administered gets large enough. Let us refer to the class of such functions as precision functions. Clearly the above techniques for item selection and stopping based on the Fisher information can be generalized to the class of precision functions. For item selection, it would be of interest to select an item whose item difficulty parameter value has a minimum precision function value with respect to all the other items remaining in the item pool. For stopping, it would be of interest to stop if the precision function value for instance evaluated at an estimated score value (e.g. MLE) were less than a predetermined value. Note that precision functions are functions of values of a score value (e.g. $\theta$).

An obvious classification rule would be to assign the MLE value of $\theta$ to a test subject after stopping is invoked as the test subjects score value. More generally, a Bayes decision rule with respect to some SPS and loss function also could be used. Also, other estimates of $\theta$ (e.g. given fixed item parameters), obtained through estimation approaches such as least squares or method of moments also could be used as classification rules (see any standard statistics textbook for a description of these estimation methods).

Parallel model techniques can also be employed as parallel representations of knowledge for the same subject domain. The parallel models in such cases could be original models, with one of the models not necessarily being a scoring model. Again, while the corresponding item pools can be shared in the sense that the same items may belong to the respective item pools of each model, response distribution information is assigned to such items in relation to each of the models.

This application could be of use for instance if two different populations do not have significant overlap in terms of knowledge states. An example of such a situation is when one of the populations is thought to be a group having cognitive learning disabilities that lead to difficulty in acquiring certain skills. Importantly, such students could be more efficiently classified if the underlying model was developed with the characteristics of the given disabilities in mind, and/or if the data-analysis and model-fitting process were based on response data from students believed to have the disabilities in question.

For a given test subject, there may be no prior knowledge as to which of the parallel models may be more appropriate. The techniques for parallel models described above such as for item selection and stopping are applicable to this scenario as well. Particularly, for instance, an SPS uncertainty measure applied to the respective SPS of parallel models can be used to decide if item selection should be based on a smaller subset of the models. An example could be when one of the parallel models has much less uncertainty with respect to an SPS uncertainty measure as compared to the others. This could indicate that this model is more appropriate for a test subject, and hence that emphasis in item selection and stopping should be given to this model. In terms of classification, it may be of interest to determine among the parallel models which one is (or which ones are) most appropriate for the test subject after administering test items. Natural criteria would be based on the classification results within each model such as the respective resultant SPS. One instance for basing subsequent remediation on one model is when a dominant posterior probability value emerges for one of the states in the model that exceeds a threshold level, and for the over models the largest posterior probability value within each corresponding SPS does not exceed that threshold level. Note that parallel models used in this fashion may themselves also have attached a parallel model such as a scoring model.

A secondary criterion that could be incorporated into the item selection process is that of exposure rates (both SPS and non-SPS instances). For standardized computer-based tests, for instance, it is a concern not to administer an item too frequently between test subjects, as the item would become vulnerable to being memorized by test-takers and this knowledge passed on to subsequent test-takers. For a given item selection rule and given set of item response distributions, an exposure rate would be the probability that an item is administered for a random test subject. This value could be estimated empirically, or by simulation (see below). Alternatively, a state-specific exposure rate of an item for test subjects belonging to particular knowledge states could also be analyzed. Let us define a state-specific exposure rate of an item to be the probability that the item would be administered given a test subject belongs to a particular state.

One way to estimate a state-specific exposure rate would be to simulate responses of a hypothetical test subject based on the item response distributions of the items in the pool, and use these simulated responses to simulate the classification process. Repeating this simulation a large number of times should give a clear indication of an item's state-specific exposure rate given a test subject belongs to a particular state. An estimate of the probability of administration would be the number of times it is administered divided by the total number of item administrations during the simulations. Clearly then, the overall exposure rate of an item, given that it is being administered to a random test subject, could be estimated by averaging the state-specific exposure rates by an SPS function on the classification states. Items which exceed a threshold value based on its exposure rate and/or state-specific exposure rates could be withheld from administration with a certain probability. This probability could be based on the exposure rate. This would reduce an item's actual exposure frequency in practice.

Exposure rates can be employed when parallel models are being used. For example, respective overall exposure rates can be weighted, so that a combined overall exposure rate calculated. This probability could then be used as the basis for randomizing actual administration, as described above. Moreover, randomization of item selection based on exposure rates can be employed for within-model item selection and/or for between-model item selection.

Strategy trees can be used to describe within-model item selection, stopping and classification. Strategy trees can be used to represent between-model item selection, stopping and classification as well, when there are parallel models being employed.

Also, in generating discrete model components for poset/combination models and/or parallel models, the model generation techniques described above can be applied as before. Similarly, so can techniques for model fitting and item analysis.

Sometimes items will be grouped together into a block. This stuation could arise when either one model or parallel models are being used. For instance, a test may contain a reading passage or a word problem. Several items may be based on the same passage or word problem. Hence, it may be natural to consider the administration of items in terms of blocks of items, taking into account the statistical and cognitive information of each item within a block all at once.

Consider the following approaches to dealing with item blocks. All items will have their own statistical and cognitive specifications. One approach would be to calculate a block-level criterion value for each block based on the statistical and cognitive information of each item within the block. For instance, if k>0 is the number of items in a block, k-step look ahead rules based on a loss function which includes a cost of observation can be used. Costs of observation can be assigned to the individual items within each block as before, and/or to the item blocks themselves. Another possibility is to calculate an average criterion value from the items in a block, or to determine the average number of desired separations that are conducted by the items in the block. This latter approach involves use of the function $\Phi$, and is analogous to the proposed item selection rule based on $\Phi$. Techniques such as simulated annealing can be used with item blocks as well. The partitions of a multi-item block will be assumed to be the intersection of the partitions of the items within the block.

Note that these formulations for dealing with blocks can be used in selection of item blocks versus other item blocks or item blocks versus single items. Also, note how the item selection rules as described previously can be extended to blocks, for instance by averaging criterion values of items within an item block. Multi-item block versus block selection could be of use when the number of multi-item blocks to be administered is predetermined. Finally, it should be pointed out that items within blocks may be statistically dependent. These dependencies could be modeled into the joint response distributions.

Concepts such as sharpness, the frequency of administration and exposure rates generalize straightforwardly for item blocks. For instance, the sharpness of an item block could be obtained by taking the average of sharpness measures among the items within the given block. As for updating an SPS, Bayes rule still applies for item blocks.

For stopping rule considerations which incorporate a cost of observation, note that the items within an administered item block can be treated as if they were given as single items, with each item possibly having its own cost of observation. Item block cost of observations can also be treated as an aggregate quantity, on the same scale as single item costs of observations when single items are being administered an well in a testing sequence.

A more general formulation of the scoring model could be as another discrete model, or a combination model. Also, it is possible that more than two systems could be used in a parallel manner, again with ultimately only one sequence of items administered based on information from all of the parallel systems.

Also, note that adaptive testing can be conducted simultaneously among a number of subject domains. Specifically, during a single testing sequence, items from different item pools can be administered in a single stream of questions. As an illustration, suppose that cognitive models/item pools have been constructed for a corresponding number of subject domains. Instead of administering items consecutively from only one subject domain, testing sequences of items can be "mixed" among the various item pools. In other words, an item can be given from one item pool, the posterior probability updated within the particular corresponding model/system, an item from another item pool then given, etc.

This approach would be of interest for large standardized tests that cover a variety of subject domains. Rather than build one large cognitive model, several smaller models based on sub-domains could be constructed. For example, for a standardized math test, sub-domains could be algebra, geometry and arithmetic. Clearly, this approach could be applied to poset models, combination models, scoring models, and parallel models. While classification would he conducted within each of the smaller models, it is possible that rather than attach a parallel scoring model to each smaller model, that only one scoring model be used in parallel with all the other models. Specifically, items from all the item pools would be assigned parallel statistical response distribution information based on one scoring model. This might be of interest when only one "overall" score is desired to describe the performance of a test subject on the various sub-domains. After an item is administered, regardless of which item pool it originated from, it would be processed within the one scoring model as well as within its corresponding model. Hence, only one score would be reported after the testing process is terminated. Of course, separate scoring models could be assigned to particular smaller sub-domain models as well.

Deciding when to administer an item from among the item pools can be predetermined. Alternatively, it can be based on objective functions. For instance, the same item selection rules could be used within each model, such as one based on Shannon entropy. Using the same item selection rule would allow for direct comparison of items. The item with the most attractive objective function value would be selected (e.g. the one which minimizes the expected Shannon entropy within its respective model/system to the largest degree as measured by its criterion value). Note that objective functions could be applied to specific collections of item pools. Randomization of the item pools to be selected from also could be restricted to specific collections. The number of multi-item blocks to be administered from each item pool and/or in total could be predetermined, randomized, or based on objective functions as well.

Clearly, different objective functions could be used between item pools as well, and selection of which item pool to administer from could be made based on a different, separate criterion. One way to select an item pool would be to measure the uncertainty of a test subject's true state identity within a corresponding model as reflected by the test subject's current SPS for that model. Items could thus be selected from item pools corresponding to models with higher levels of uncertainty, as measured for instance by an uncertainty measure such as the Shannon entropy of the SPS for each model. Item selection in this context could be randomized and/or ranked as well, within item pools and between item pools.

Also note that the just described methods for selecting items among non-parallel models, each with their own item pool, can be used for parallel models sharing one item pool. The methods apply straightforwardly to the latter situation.

When deciding whether to remove a state in the model, a criterion based on ideal patterns have been suggested. An alternative but equivalent approach would be to remove states such that a percentage of students who exceed a given, fixed threshold posterior probability value for that state is less than a predetermined value.

Note that classification does not have to be assignment of the test subject to one particular state in the domain. Decision rules are based on SPS values after stopping has been invoked. Hence, the embodiment of the information ascertained after the item administration process is the final SPS. Instead of then just selecting one state for classification purposes, it is possible to base classification on the SPS in the following manner. For instance, specific attribute probabilities can be obtained. For a particular attribute (skill) A, after stopping has been invoked, the sum of the probabilities from the SPS of sates which represent that a test subject ha mastery of attribute A can be calculated. This sum could then be viewed as the probability that the test subject has mastered attribute A. If this probability does not exceed a predetermined threshold, then remediation can be administered based on the subject matter concerned with this attribute. Clearly, this process can be repeated for each attribute associated to a domain.

It should be noted that speech and handwriting recognition technologies can be applied within the classification system, such as for processing responses to items. For instance, if responses can be viewed as multivariate vectors, the system can be applied without modification.

Partial credit models can be employed when estimating a score value. For instance, certain erroneous responses may be "worth" more than others, but not "worth" as much as a correct response. Hence, responses can be assigned a score through a function of the responses. Distributions of responses associated with partial credit will be functions of a state in a model. Note that scores can be a function of values assigned to responses, such as the sum of the values corresponding to the observed responses.

Use of extraneous variables can be incorporated into response distributions. For example, response distributions may be viewed as dependent on background information. This extra information may help in leading to more accurate estimation of how a test subject responds to items. Possible background information could be previously obtained test scores or a grade point average. Gender, socioeconomic and/or ethnic backgrounds could be variables as well. Let $p(x,s)$ represent the probability of success for an item given an extraneous variable value x and a true state s, $p_0(s)$ a function of s, and $g(x,s)$ a monotone function in x. A possible model is to consider $p(x,s)$ to be equal to $p_0(s)+g(x,s)$, where $p_0(s)$ can be viewed as a baseline probability value. The quantities $p_0(s)$ and $g(x,s)$ would be constrained so that $p(x,s)$ is bounded between 0 and 1. Such modeling could used with scoring models. In addition, response distributions could be functions of several extraneous variables, and could be of more general form.

Once again, an important feature of the classification system is the ability to incorporate error analysis. In the context of the system, error analysis means expanding the scope of erroneous responses to be included into item response distributions beyond just treating all wrong answers in the same manner. This will in many cases involve creating more than two partitions for a respective item. Possession of a misconception can lead to a certain erroneous response being given with high probability. A partition can be associated with a certain erroneous response in the sense that the certain erroneous response is given with relatively high probability for test subjects belonging to one of the states in the partition. It is possible that a misconception can be cognitively identified to a lack of certain skills. This information can in turn be used to identify possible partitions for an item. Multinomial response distribution models are natural models for incorporating error analysis into response models. For instance, outcome categories for an item could be: the right answer, a certain erroneous response, and all other wrong responses. A natural partition for the item's response distributions could then be the subset of states with the knowledge to get the item correct, the states with particular skills lacking that lead to a certain misconception, and the remaining states. Partitions could then be assigned a respective multinomial distribution with the above outcome categories (although not all of the response distributions need be multinomial). Gibbs sampling and related estimation procedures could be applied to estimate these distributions, possibly incorporating order constraints among response distribution parameters between partitions. A natural order constraint to be incorporated into the estimation process could be that the probability of getting the correct answer is larger for test subjects in states with the knowledge to get the item correct than for those in states in other partitions. It is well known that Dirichlet distributions are conjugate priors for the multinomial distribution. Techniques for model fitting, item estimation and item analysis can be applied as described above. When there are more than two partitions, it may be informative to study pairs of discrepancy measures between response distributions associated with partitions as well averaging discrepancy measures over all pairs of partitions.

Note that when there is more than one subject domain under consideration for testing, it may be of interest to decide upon which domains to test, or an order of testing of the domains. This situation can occur when a student needs to be placed into an appropriate level of study within a wide-ranging curriculum. One way to select among domains for testing can be through random selection. Another approach is to select domains for testing based on SPSs or classification decisions obtained through testing of other domains. For instance, it may be found that within a certain first domain in a student is found to be lacking a certain subset of skills. It could be possible that this subset of skills may have relation to a second domain, and that testing of the second domain could give greater detail about the identified subset of skills. Hence, testing of the second domain would be of interest, and selection of this domain could be based on the SPS and/or classification results of the first domain. Attribute probabilities also can be employed in domain selection. For instance, correlations between attribute probabilities can be estimated, giving indication as to the relationship between attributes associated with one domain and attributes associated with another. It is possible to place a collection of domains themselves on a partially ordered set, each state in such a poset being a subset of knowledge states from one of the subject domains, and use responses and an SPS function to identify appropriate domains for testing and possible remediation. Domains for which a student clearly has mastery, or domains for which the student clearly does not have mastery may be less attractive for testing than those domains for which a student has partial knowledge. When a student has partial knowledge of a domain, detailed cognitive diagnosis is particularly useful.

When multiple domains are being tested in parallel or simultaneously, as mentioned before stopping for this testing can be based on one or more stopping rules based on one or more of the ill domains. One such stopping rule for a domain is when the number of items administered from a corresponding domain pool (or subset of a domain pool) exceeds a predetermined number. Such rules can be used in conjunction to stop testing of all the domains in question.

Once classification to a knowledge state is conducted, a second important component of an "intelligent" tutoring system is to efficiently remediate a student based on the classification results. This can be achieved by administering teaching lessons, and indeed such lessons can be given during the testing and classification process. Once a diagnosis is made, remediation can for instance be conducted on two levels. One level could be to prepare a personalized lesson for the student. A student can be routed to specialized teaching modules which focus on the weaknesses that have been identified. As encouragement and reinforcement, a student's strengths could also be reported. Moreover, a corresponding special set of exercises could be compiled for the student. A more intensive level of remediation would be to guide the student through particular examples step-by-step. This can be done in conjunction with the above approach. Specialized instruction of the deficient skills can be given in the context of the types of items on which the student did not perform well. It is useful to have solution methods spelled out in detail, specifically by breaking down the problem-solving process. Audio/video could be used as enhancements, with an actual teacher doing the "teaching".

A lesser investment in programming and development would be to just give a report and description of the skills that have and have not been mastered, and bookmark appropriate sections for the student. Certain sets of exercises could also be presented.

The testing system can also be used to re-test the capabilities of a student after remediation has been conducted. Resultant diagnoses give concise feedback concerning possible improvement, and can be reported to the student. The instructional content can be evaluated through this diagnostic system as well. If students in a training sample consistently perform poorly on certain concepts, this gives indication that instruction on this topic could be improved. When based on the classification system, instruction is given focus, and this should lead to concrete improvement in problem solving.

An important situation of interest is when there are two or more types of teaching methods that can be employed in the remediation process. As an example of when this situation may arise, consider a mathematics domain for which one treatment type could emphasize a geometric/graphical approach, while another could emphasize algebraic techniques. An attractive and useful feature of an "intelligent" tutoring system would be to determine as quickly as possible which of the teaching methods is more effective for a particular student. Such a feature could particularly be useful if a student has trouble grasping certain concepts, or if a student has a learning disability which makes it difficult to learn by certain teaching approaches. It is an important aspect of this invention is that these determinations can be done in a statistical manner, allowing for the possibility of random "noise" in the information being received about the student. This greatly enhances the flexibility and practicality of the "intelligent" tutoring system.

Let us refer to teaching and remediation lessons, teaching modules on a computer, or materials that are presented for teaching as treatments. More generally, let us define a treatment to be an interaction with a student, with the objective of the interaction being to teach a student about a particular subject matter or topic. A collection of treatments will be considered as a treatment type. Again, assume that there are two or more treatment types to select among during the remediation process. Note that the concept of comparing treatment types can also refer to different technologies or mediums, such as audio/video teaching technologies versus text-oriented instruction. It could also for instance refer to different approaches using the same technology, different software titles, or even different teachers interacting with students through the internet or other technological mediums used in distance learning. One way to compile and administer treatments is through indexing and accessing lessons via the internet. Another way to generate treatments is to modify or enhance an existing treatment by adding extra material or the modifying existing material.

A natural collection of treatments associated with a treatment type would consist of treatments which share a same general teaching approach. For example, returning to the mathematics illustration, all the treatments associated with a treatment type may share a geometric emphasis as opposed to an algebraic one. It is of interest to determine the effectiveness of treatment types for a particular test subject Note that collections of treatments associated with a treatment type can include a plurality of lessons or teaching modules which can be applied for a same topic, and also could include treatments that are associated across different topics. Hence treatment types can relate to one topic or a subset of topics. Further, it is possible that a treatment is associated with only one topic, or can be administered for more than one topic. Administration of a treatment may be repeated. Note that after a treatment type is selected, a second stage selection among individual treatments could be conducted. Since individual treatments can also be viewed as a collection of treatments, they can be viewed as treatment types in themselves. Hence, methods for selecting among treatment types can be applied directly to the process of selecting among individual treatments themselves. This includes selecting among treatments associated with a particular treatment type. It is also possible that it may be of interest to select among subsets of collections of treatments associated with a particular treatment type that has itself been selected among other treatment types. If treatment types are comprised of only one treatment, then selection of treatment types coincides with selection of treatments. It may be assumed in this embodiment that there is a corresponding preselected treatment to be administered after selection of a treatment type. Without loss of generality, focus of the following discussion with will be on treatment type selection.

The term topic will refer to subject matter on which the remediation is based. For example, topics being administered (i.e. remediated) could be concerned with particular skills found to be lacking with high probability based on classification results. Topics could also be concerned with skills necessary to solve particular problems, or focus on particular misconceptions. The determination of which treatment type is more effective could apply to a particular subset of topics only, with the treatments types associated with different subsets of topics treated independently. Hence, treatment types can be viewed as topic-specific, and not necessarily applicable to all topics. Topics also can be considered as collections of other topics.

In order to determine which treatment type may be more effective, it is necessary to receive feedback from the student. This feedback can take the form of responses to questions. Questions could be actual items, or questions that focus on certain skills used in an item. Questions could actually be administered in blocks, such as item blocks. Further, some questions can be considered "practice" in the sense that corresponding responses may not directly be used in the determination of treatment effectiveness (i.e. they may not be assigned response distributions). In general, any inquiry that illicits a response can be viewed as a question. Response distributions that are functions of a corresponding administered treatment can be assigned to the questions. Note that question responses could be processed from speech or handwriting recognition technologies, with responses from such technologies viewed as real-valued or multidimensional vectors. For the preferred embodiment, it may be assumed that questions are items such as from an item pool, with associated response distributions that are conditionally independent and Bernoulli or multinomial. The discussion below generalizes to general response distributions straightforwardly, and when responses are conditionally dependent. Also, it is possible that some of the questions used in remediation come from a pool reserved for the remediation process, and/or that questions be given across topics.

Questions to be administered can be selected as well as treatment types. Item selection rules can be applied to questions that are assigned class conditional response distributions with respect to a poset, and item block selection rules can be applied to question blocks. Note though that it is not essential that all questions be assigned such distributions. As an example, one such question could ask if the student wants to continue receiving remediation, or ask for preferences on treatment type and/or teaching methods, or ask for feedback from a student concerning steps in a solution. Of course it is possible that the responses to such questions can be conditioned upon for subsequent question response distributions. Stopping rules for question selection during or after administration of a treatment can be employed as well, with stopping invoked if one or more criteria are satisfied. Stopping rules used in classification with respect to poset models can be employed for stopping question selection following administration of a treatment, particularly when questions are assigned corresponding class conditional response distributions with respect to a poset. Note that responses from questions associated with treatments being administered for remediation from one topic can be used as information for question selection, stopping, and for treatment type selection for another topic, in addition to other aspects of the remediation process in general.

As for administration of question blocks, it is possible that once a block is selected, questions within a block can be selected sequentially and indeed not all the questions within the block administered. Question selection rules can be applied for sequential selection within a block in the same manner as process of selection of individual questions, with question selection restricted to questions within the block. The same idea can be applied to item blocks and item selection within an item block as well. More generally, general subsets of questions or items can be selected in a first stage, and individual sequential selection then conducted.

A process for determining treatment type effectiveness for a particular student can thus be conducted as follows. First, a topic is selected for remediation. A remediation treatment type is selected and a corresponding treatment applied, and questions relating to the topic subject matter are administered. Questions and/or blocks of questions themselves could be selected for administration, such as the way items and/or item blocks are selected in the classification system. Questions can be given during and/or after a treatment is given. How a student responds to a treatment can be measured in tens of how the student responds to the questions. Responses are used to update information about the effectiveness of the treatment type just applied, such as through a posterior distribution (cf Bayes rule, Equation (3)). It must then be determined whether to repeat the treatment type selection process for the same topic, remediate a new topic, or stop the remediation process altogether. At some point during remediation, it may also be of interest to determine which treatment type appears to be most effective, and to stop the treatment type selection component of the process. FIG. 1 describes a possible formulation of the remediation system. Unless stated otherwise, for the sake of discussion it will be assumed that after a remediation treatment is applied, a single question (item) is administered and its response recorded. Of course in practice this assumption can be relaxed, as will be pointed out below. Indeed, along with treatment type selection, selections of treatments associated with a treatment type can be conducted, as can selection of questions to be administered among questions associated with treatment.

Figure 11:
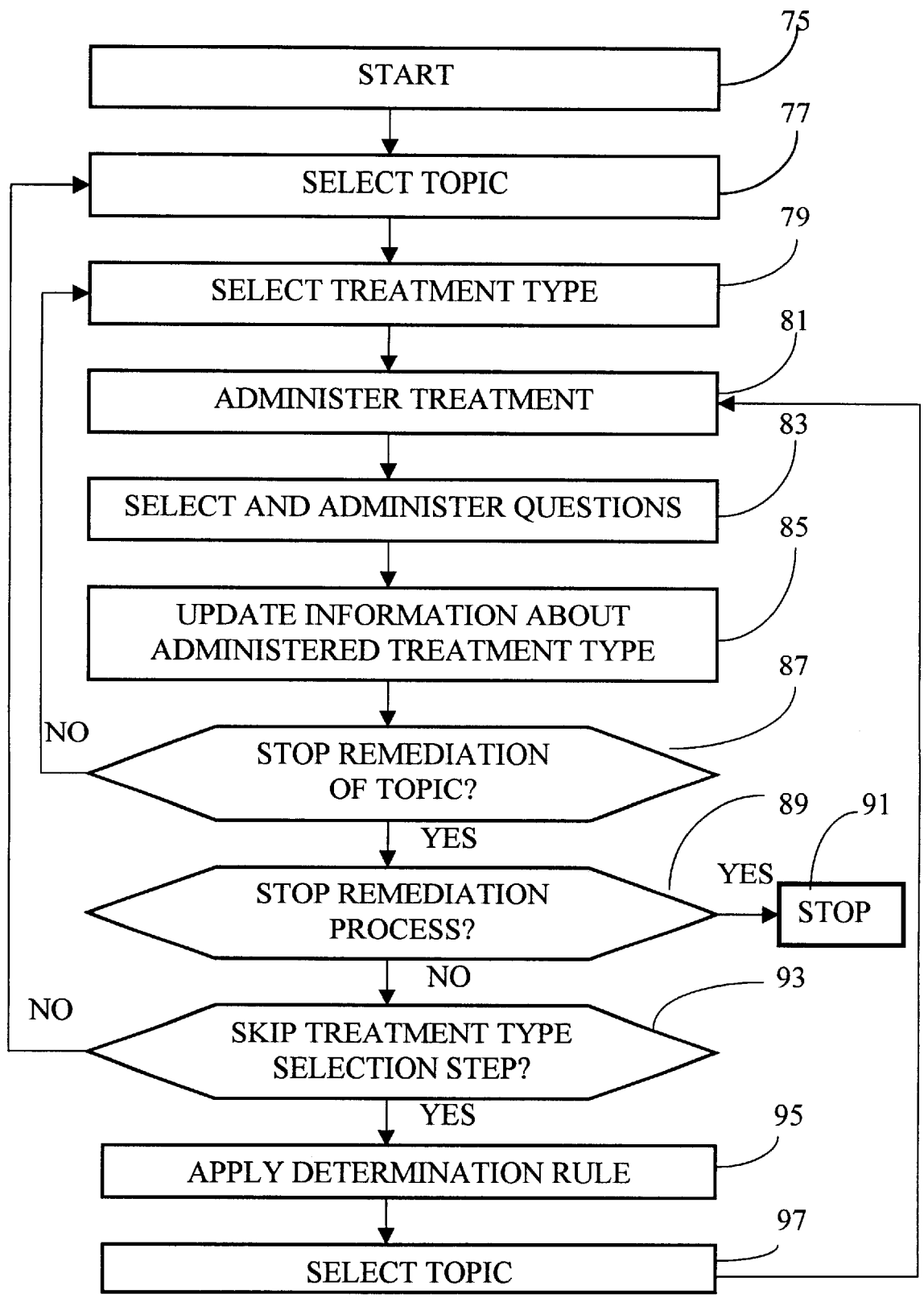
FIG. 11 shows an example of the sequence of steps performed in executing the remediation process.

An example of the sequence of steps performed in executing the remediation process is shown in FIG. 11. The process begins 75 with the selection 77 of a topic for remediation. A remediation treatment type is selected 79 and an associated treatment is administered 81. Questions relating to the topic subject matter are selected and administered 83. How a test subject responds to that treatment is measured in terms of how the test subject responds to the questions. Responses are used to update information 85 about the effectiveness of the treatment type just applied, such as through a posterior distribution of a parameter associated with the treatment type (cf. Bayes rule, Equation (3)). It must then be determined whether to stop remediation of the topic 87, stop the remediation process 89, 91, or remediate a new topic with an accompanying decision 93 as to whether to continue performing the "select treatment" step 79. At some point during remediation, it may be appropriate to determine which treatment type appears to be most effective, in which case, the treatment type selection step is skipped in subsequent executions of the process, determination rules are applied 95, and the selection of the new topic is made 97.

Let us refer to an item as being "easier" than another item if the latter item requires at least the skills or knowledge that the former item requires to be answered correctly. Note that it is not necessary that one item be "easier" than another, and that items that require the same set of sills or knowledge can both be "easier" with respect to each other. An alternative definition could be derived relative to a state (such as one a student is classified to), with items having the higher class conditional probabilities of success relative to the state viewed as the "easier" items. The standard generalization for basing this definition relative to an SPS is to analyze the class conditional probabilities of success for an item for corresponding states in the classification poset averaged with respect to the SPS values. This same type of generalization comes up throughout this preferred embodiment in many contexts. Also, the concept of "easier" items extends to general questions, and to general response distributions, for instance by analyzing the probabilities that a response is greater than a certain value. Class conditional items of the same type can be averaged, and item types can be referred to as "easier" too.

Since topics may be associated with the skills involved in solving a particular item, topics can be identified with (collections of) items or item types. For determining topics to be remediated, it can thus be of interest to identify for a student items (or item types) it appears that he/she does not have the knowledge to answer correctly. Skills involved with solving particular items could then be the subject matter of a topic. An obvious approach would be to directly analyze responses to particular items and/or item types. Such identifications can also be based on the classification decision results or a final SPS by determining if corresponding class conditional probabilities of success are below threshold values. The advantage of basing such an identification on the classification results is that precise diagnostic information about the exact skills associated with an item that need to be remediated can be provided. Another criteria could be to identify such items as the ones for which the probability that the student belongs to a state with the knowledge to answer an item is below a threshold relative to his/her SPS. Another could be to base that determination on the state specifically classified to by a classification decision rule.

A general guideline for selecting topics associated with items (or item types) to be remediated is to first select "easier" items that a student appears not to have the knowledge to answer correctly given the student's classification results, and then to address topics related to more difficult items once remediation is successful for the "easier" items. This approach keeps a student from being discouraged. Once again, remediation can focus on teaching skills necessary to solve particular items, and particularly could focus on certain skills determined to be deficient by the classification results. In other words, remediation can be based on a resultant SPS. Attribute probabilities are functions of SPSs, and hence can be used in topic selection as well.

Topics also can be selected in a random manner. For instance, if classification results about a student are not clearly informative, it may be useful to resort to randomly selecting among topics. Random topic selection can be based on an SPS as well. It should be pointed out that topics do not have to be administered in a linear fashion; i.e. topics do not have to be remediated one at a time in the sense that a topic is administered, then associated treatments and questions given until certain criteria are met, then another topic is administered, etc. Indeed, topics and associated treatments and questions can be administered simultaneously, and responses from questions from one topic used to update information about a treatment type relating to another topic, particularly if a treatment type is associated with both of those topics.

As will be noted below, topics can be associated with topic specific poset models. For instance, topics can be related to skills or facts associated with a specific subset of knowledge states. Hence, methods for selecting among domains for testing can be directly applied to the selection of topics for remediation by treating the topic specific poset models as domains in themselves.

Let us now consider approaches to determination of treatment type effectiveness. For a given test subject, one approach is to associate with each treatment type i a corresponding parameter $p_i$, the index i ranging from 1 to the total number of treatment types. This parameter can be viewed as reflecting how effective a treatment type is in remediating a particular student (e.g. for an "easier" item for which he/she needs remediation). If $p_i$ is constrained to have a value between 0 and 1, an interpretation could be that $p_i$ represents a probability of success for a question after application of a treatment associated with treatment type i in relation to a topic. Below, we may at times indeed give that interpretation. It should be pointed out that in general $p_i$ can take on values over any set of values or even be multidimensional. Note that its value gives a measure of effectiveness of treatments associated with treatment type i. Moreover, the response distributions to questions may be a direct function of this parameter. Hence, we can assign a prior distribution on each $p_i$ corresponding to each treatment type and update the prior distribution via Equation (3) after observing responses to questions. Updated prior distributions are referred to as posterior distributions. As an example, let the left hand side of the equation below be the posterior probability density function of $p_i$, and the right hand side be the product of the joint response density evaluated at observations $x_1, \ldots, x_n$ and the prior density for $p_i$. These quantities are proportional with respect to a constant.

$$\pi(p_i|x_1, \ldots, x_n) \, f(x_1, \ldots, x_n|p_i)\pi(p_i) \qquad (48)$$

Response distributions of questions can be direct functions of treatment parameters. For instance, the probability of observing a correct response on a question during or after application of a remediation treatment could be modeled by a logistic function depending on a corresponding treatment parameter value. Logistic functions can be parameterized by a difficulty parameter, which gives indication as to the relative difficulty of a topic (cf. the alpha parameters from Equations (25) and (26)). The form of the logistic function or any other function employed can be estimated with data. These treatment parameter values can be averaged with respect to prior (posterior) probability distributions.

Note that this updating will depend on the response distribution(s) to a corresponding question, or questions related to the subject matter. It is also possible to condition all of the above densities on a state in a poset model, or on a function of an SPS. An example of a prior probability distribution for $p_i$ is a beta distribution if the responses to questions are Bernoulli and $p_i$ is a value between 0 and 1. Indeed, specification of a prior distribution of a treatment parameter for a particular student could be a function of a classification decision, or more generally a final SPS with respect to a classification model. Students classified to certain states or with similar resultant final SPSs can be assigned the same or similar prior distributions for $p_i$. Each initial prior distribution could be estimated from a population of students classified to a same (or similar) state. This can be conducted by administering treatments associated with a treatment type and observing corresponding responses to questions. Note that a prior distribution corresponding to each parameter $p_i$ can be carried over and updated from topic to topic, as long as the treatment types for each of the topics are identified to a same parameter $p_i$. Treatment types can be associated with a subset of topics through treatments which are related to the topics in the subset. A subset could include only one topic.

Prior distribution assignment could also be a function of responses to an initial set of questions, the objective of the questions being to ascertain the preferences among teaching methods. Such initial questions can be given throughout the remediation process, including before certain topics we administered. Such questions may not necessarily be assigned response distributions.

Consider approaches to treatment type selection for remediation of a topic based on such treatment parameters and their associated prior distributions. One approach Is to apply a myopic rule, which involves choosing the treatment type with the highest (or smallest) average functional value based on the possible responses during or after a hypothetical administration of a treatment. Averaging can be conducted with respect to corresponding posterior probability distributions for treatment parameters and response distributions for questions. In general, a function which assigns a value to each possible response will be denoted as a response function. Examples of an average response functional value (or values) with respect to a given distribution include its mean, median, or a mode value. Partial credit models can be employed based on a response function. Moreover, k-step extensions can be employed, where up to k treatments are hypothetically administered, and possible responses to questions averaged according to response distributions. Multiple questions could also be hypothetically administered at each stage of question administration. Another approach could be to randomize selection, for instance based on the respective posterior (prior) probability distributions. From each respective posterior probability distribution for parameter $p_i$ corresponding to a respective treatment, a value can be randomly selected from the distribution. The treatment type with largest corresponding sampled value could then be selected for administration. Simulated annealing can be implemented on treatment type selection as well, as can randomization among treatment type selection procedures.

At some point, it may be of interest to make a determination as to which treatment type appears to be most effective for a subset of topics. Such a subset of topics could include the set of all topics associated with a collection of subjects, or the set of all topics deemed to be in need of remediation for a test subject of a particular subject. Different determinations could be made on different subsets of topics, as the various subsets of topics could have different cognitive requirements. Note that it is possible to terminate the treatment type selection process while continuing remediation, such as continuing to administer treatments. These determinations can be based on a rule, generally based on one or more functions of the respective posterior distributions of treatment parameters (e.g. such as evaluating means). It is also possible that evaluation of certain treatment types may be abandoned if they do not appear relatively effective, for instance relative to the posterior distributions. For example, if with high posterior probability one treatment type is much more likely to be successful in remediation than another, the latter treatment type could be dropped from consideration. It could be that this type of abandonment could apply within a particular topic or set of topics only.

Another formulation for sequentially selecting among remediation treatment types would be to assume that there is a cost per treatment application, for instance specified in terms of the time it will take a student to complete a particular lesson. The cost of allocating treatments for remediating a particular topic may not be the same across treatment types, and for a given treatment, this cost may vary from topic to topic, and even from application to application within the same remediation of a topic.

These costs of administration could be incorporated into loss functions, herewithin referred to as treatment loss functions to differentiate them from the previous discussion concerning classification. One example of a treatment loss function is the sum of the costs associated with administered treatments. In general, treatment loss functions are functions of the number of treatments administered. An objective of treatment type selection with such treatment loss functions would be to minimize the expected cost until a stopping criterion for treatment administration is satisfied. See below for a discussion of treatment stopping rules. An important example would be to incorporate a classification loss function directly into the treatment loss function when a topic itself is represented by a poset model. Such a poset model for a topic could give indication of how well a student is performing with respect to the subject matter of the topic. A resultant treatment loss function could then be the sum of treatment costs plus the posterior probability of a student belonging to a top state (or subset of states) in the poset model. Such a treatment loss function then also incorporates a measure of a student's performance in relation to the topic and to treatment costs. Response functions can also give indication about performance of a student with respect to a topic (even without a poset model), such as the sum of observed response function values. Response function values corresponding to question responses could be scaled such that relatively small sums of response function values could indicate that a student has mastered a topic. Hence, functions of response function values also could be incorporated into treatment loss functions, with costs scaled appropriately with the response function values (small values could be made more attractive in order to correspond with the objective of minimizing treatment loss function values). When treatment loss functions incorporate a measure of student performance in relation to a topic, it is then natural to base a stopping criterion for treatment administration directly on such treatment loss functions. The tradeoff between costs of remediation versus student performance gain can then be calculated.

Look ahead rules of the k-step variety can be employed with treatment loss functions as well, where the treatment type that is selected is the associated with the first selection in a set of up to k (k>=1) hypothetical administrations of treatments which collectively mininize an average loss function. Note that the sequence of treatment type selection is dependent on responses to questions. Also, for k-step look ahead rules of treatment administration, multiple questions can be administered during or after each treatment application, and up to some predetermined number of questions can be administered.

Costs can also he assigned to the items or questions used in remediation, particularly when more than one item or question may be administered after a treatment application. These costs could be put on the same scale as the remediation treatment costs, and incorporated into a treatment loss function. Hence, the objective of treatment type and subsequent question selection could be to minimize the expected value (averaged with respect to an SPS and the response distributions) of a treatment loss function which includes the combined costs of treatment and question administration. Specifically, such a treatment loss function could include the sum of the treatment costs and the question costs that are administered. In general, treatment loss functions can be functions of the number of questions administered as well, Note that costs can be a function of topic, and that costs can be assigned for topic administration. Also, costs can be assigned to treatment types as well. This could be pertinent for instance if multiple treatments are being administered per treatment type selection.

Multi-stage procedures for treatment type selection can be employed. For two-stage procedures, the first stage can be viewed as a learning stage about the treatment types, where for instance each treatment type is assured to be applied at least a predetermined minimum number of times. A motivation for implementing such a stage is to insure that all treatment types are "given a chance", and that posterior probabilities of the $p_i$ are all updated with at least a certain amount of information. After this first stage, a second stage can apply treatment type selection approaches such as myopic rules and their k-step extensions, randomization, minimizing expected treatment loss functions, and/or any other method. A multi-stage procedure could also involve applying different treatment type selection criteria in different stages.

Treatment type selection procedures can be applied in conjunction with the heuristic of "playing the winner". If for instance a treatment application leads to a successful remediation or an attractive response to a question, then a treatment associated with the same treatment type is applied again. Otherwise, treatment type selection procedures can be employed as before. More generally, the "playing the winner" rule can be applied when selection of a treatment type leads to observation of a particular subsets of responses from a set of questions.

For each topic being remediated, treatment types are selected and responses to questions observed until certain criteria are satisfied. Such criteria form the basis for what will be referred to as treatment stopping rules. Treatment stopping rules determine when to stop treatment administration for a topic. Examples of treatment stopping rules are as follows. For instance, a treatment stopping rule could be to administer treatments on a topic until a fixed number of correct answers are obtained on related questions or a set of correct answers obtained for a particular set of related questions. Treatment stopping rules can also be based on response functions. Note that it is possible that an item use in classification or question used in remediation can have more than one response that can be considered as correct. This can occur for instance in linguistics domains, where more than one verb conjugation may be appropriate in a sentence completion task. Another treatment stopping rule could be to stop administering treatments for a topic if the number of treatment types, treatments and/or questions administered on a given topic exceeds a threshold, and stopping has not been invoked by another treatment stopping rule up to that point. Also, it is possible to predetermine the number of treatment types, treatments and/or question administrations to be given for a topic. Such a predetermination can be made once certain criteria are satisfied (such as the criteria associated with a treatment stopping rule) and be applied henceforth from that stage on. In other words, a limit to the number of subsequent treatment types, treatments and/or question administrations (for a topic, subset of topics, or even for the remediation process as a whole) can be applied at any given point in the remediation process, and not just from the beginning of method execution. This idea can also apply to similar stopping conditions used in classification stopping (i.e. in relation to predetermined numbers of items to be administered). Treatment stopping rules can be used in conjunction.

Note that treatment loss functions can be used as the basis for stopping treatment administration for a topic. For instance, in conjunction with a treatment type selection rule, if the expected value of a treatment loss function k-steps ahead exceeds a certain threshold value, stopping can be invoked without further administration of treatments. Note that treatment stopping rules do not necessarily have to be applied after each treatment application.

It may be of interest to conduct remediation within a fixed horizon, so that the number of treatments to be administered is predetermined. This scenario has relation to bandit problems (e.g. Berry and Fristedt, Bandit Problems, Chapman and Hall, 1985). Differences from the general bandit problems a include the selection of a treatment type, the administration of both treatments and questions (or items), the selection of topics, the basing of these selections on classification results and the classification system in general, and the context of application being an "intelligent" tutoring system. A criterion for treatment type selection with a fixed horizon of length n could be to maximize the expected value of a reward function $$\sum_{k=1}^{n} a_k X_k \qquad (49)$$

given a vector of reward values $(\alpha_1, \alpha_2, \ldots, \alpha_n)$, and where $X_k$ is the response to the kth administered question (k=1 ... n), letting for instance $X_k=1$ if a correct response is observed, $X_k=0$ otherwise. A possible vector is to let $\alpha_n = \alpha^k$, where $0<\alpha<1$. In general, a reward function is a function of response values. Treatment type selection procedures such as maximizing the expected value of the reward function k-steps ahead (k>=1) and randomization rules such as described above apply for the fixed horizon case. As a heuristic criterion on which to base treatment type selection, it could be supposed that the vector $(\alpha_1, \alpha_2, \ldots)$ is infnite, even though in practice a stopping criterion is applied. Treatment types would be selected which maximize an expected infinite sum reward function. Strategies for treatment type selection can employ dynamic programming techniques (e.g. Berry and Fristedt, 1985), particularly when the horizons for administering treatments and questions are not long in terms of the total number of administrations. Suppose exactly n treatments, after selection of an associated with a treatment type, will be applied for a given topic, and that after each treatment application a corresponding question is administered and an appropriate prior distribution is updated. It is of interest to opt a given criterion for treatment type selection such as maximizing an average reward function or minimizing an average treatment loss function (e.g. averaged with respect to the prior distributions of the treatment parameters and the response distributions of the questions). An example of a criterion of interest is to maximize the expected number of correct answers on administered questions.

For a given criterion, up through stage n-1 of treatment type selection, all permutations of treatments associated with treatment types under consideration and question responses are generated. Each of these permutations would correspond to a branch in a tree. For each such permutation, the best choice of treatment for the final stage n is selected. Repeat this process for permutations up through stage n-2. Among the permutations that were previously generated up through stage n-1 that share the first n-2 selections and outcomes of a permutation up through stage n-2, the best strategies for treatment type selection for the remaining 2 selections can be determined from the previous determinations of the best choice for stage n for permutations of length n-1. Continue this process through permutations up through stage 2. All permutations of treatments and response to questions up through stage 1 are then considered. From all permutations up through stage 2, optimal remaining n-2 selections will have been determined. Hence, for each permutation up through stage 1, all permutations up through stage 2 that share the treatment selection and response to the subsequent question up through stage 1 and their resultant corresponding optimal strategies for treatment type selection for the remaining n-2 selections are compared. Through comparison, the optimal selection strategy for treatment type selection for the remaining n-1 selections can then be determined. The best overall treatment type selection strategy in terms of a criterion thus emerges from this process again by directly comparing the resultant treatment type selection strategies found for each respective permutation up through stage 1.

It was for the purposes of discussion that it was assumed that only one treatment and one question is administered after selection of a treatment type. Clearly more than one treatment or more than one question could be given and dynamic programming techniques could still be applied. Also, questions may be given during treatment administration. Moreover, it should be pointed out that treatment type and question selection can be conducted across more than one topic. In other words, as was mentioned, topics can be administered simultaneously, and not just in a linear fashion. Hence, dynamic programming techniques can be applied to generate sequences that are "mixed" in the sense that treatments and questions to be considered for administration can be selected across topics.

Dynamic programming techniques can be applied in the context of item selection in the classification process of a student to a knowledge state as well. Collections of item sequences of length horizon length can be generated in the same manner as described above, with the sequence to be administered depending on observed responses.

Note that dynamic programming can be used to generate optimal collections of sequences of treatments and questions of different horizon length, with the sequence of treatments and questions to be administered depending upon responses to questions. From these generated collection of sequences, "peel-back" techniques based on stopping rules (e.g. treatment stopping rules) can be applied to reduce sequences of treatments and questions of a treatment type selection strategy, as well as sequences of treatments and questions selected to augment such strategies. In other words, treatment type selection strategies (i.e. collections of sequences of treatments and questions) that are generated via dynamic programming can be used as the basis of further modification. Resultant treatment type selection strategies can then be compared with respect to an objective function. Note that randomized rules for treatment and question administration can be represented by collections of sequences of treatments and questions as well by including all possible sequences that could be administered. Analysis of such a collection with respect to an objective function can be conducted for instance by weighting sequences by corresponding probabilities of administration.

These optimal strategies for treatment type selection can be stored as a tree (as can other treatment selection strategies). Once generated, various stopping rules can be applied along selected or all stages along branches of the tree, in order to "peel-back" the tree. Also, multiple treatments or multiple questions after (or during) a treatment can be administered and dynamic programming is techniques still be applied.

Importantly, the subject matter of a topic can be represented by its own poset (either a discrete, combination or scoring model), with knowledge states specific to the topic. These states can come directly from an original poset classification model, and indeed could coincide with a classification poset model. Treatments can be applied and questions subsequently administered. Parallel models can be employed for a topic, and models such as a scoring model can be shared across a collection of topics. The classification process within a topic specific poset can then be conducted as in the general case, with questions (which may coincide with items from a classification system) being assigned class conditional response distributions with respect to the topic-specific poset (and possibly with respect to the treatment or treatment type being administered or respective treatment parameters as well). Question response distribution parameters can be estimated in the same manner as item parameters. A main feature of the system is that treatments are administered as well as questions. Note that treatments can be given during classification even if the treatment type selection process is not conducted. If the topic poset is a subposet of another poset, previously estimated parameters can be used. An SPS specific to a topic specific poset can be assigned as well. Importantly, for topic specific posets and for classification models as well, information that has been obtained about a student can be embodied by the SPS. When the models contain a continuous component such as a score or value measure, an SPS can be represented by a continuous density function. Note that an SPS does not necessarily have to be a strict probability density function, and that it may have total mass less than or greater than one, where the total mass may be the sum of the values for discrete models and the "area under the curve" associated with the SPS for models with continuous components. In such cases, as long as the total mass is finite, the values of the SPS can be normalized by dividing all the values by the total mass associated with the SPS in order to obtain a strict probability distribution. From a practical standpoint, it is not necessary to normalize SPS functions. Updating, selection and stopping procedures, decision rules, etc., can still be applied using a non-normalized SPS. Moreover, an SPS may indeed be an improper prior (posterior) distribution in the sense that the area under the curve of the function representing the SPS is infinite. Such SPS functions can be viewed as probability functions in a practical sense in that again the same methods for classification and remediation can be applied as with strict probability distributions. Improper prior or posterior distributions can be associated with treatment parameters and hyperparameters as well, with such distributions being treated as strict probability distributions in practice. In sum, SPS functions which are not strict probability density functions can still be viewed as probability densities for the purposes of the system.

Topic specific posets can be obtained from a classification poset model by assigning an SPS which places positive mass only on states which are related to a specific topic or subset of topics. Again, an SPS is a probability density function associated with state membership for a test subject. Such an SPS can be assigned once classification within the classification poset has been conducted, and questions used in the remediation system can be used to update the SPS. By placing probability mass only on two states, one of which has the knowledge of all the skills/facts associated with a topic, and the other having no knowledge of the same skills/facts, a two-state mastery/non-mastery poset can be generated. Note that a topic specific poset can be one of the poset models (domains) specified for the classification system, and that a classification poset can be viewed as a topic specific poset.

Item selection rules that can be used to select questions during or after treatment administration. Treatment type selection also can be based on classification item selection techniques. For instance, uncertainty and distance measures and loss functions can be used to gauge the effectiveness of a treatment type by determining the change in an SPS within a topic specific domain (on average) after application of an associated treatment with respect to such measures. As for specific illustrations, a loss function can be used to determine what the expected loss would be by classifying to a top state after administration of a treatment, with larger losses being less attractive. Also, distance measures can be used to measure the expected difference between SPSs obtained after treatment administration and a first SPS such as an SPS with value one for the top state, with smaller expected distances being preferred. Uncertainty measures and other item objective functions could be used in a similar manner, where an item objective function is a function of an item.

Another measure of treatment type effectiveness could be an "improvement" metric with respect to a topic specific domain. Let us define an improvement metric on a domain to be a measure of the difference between a first and second knowledge representation associated with two states. A treatment type selection criterion can be based on improvement measures, for instance by selecting the treatment type which on average maximizes such a measure, with averaging perhaps conducted with respect to a function of question response distributions and perhaps SPS functions.

An example could be a function of the difference in the number of mastered skills or facts associated with the two states, a function of the difference in corresponding score values, or a function of these either or both of these differences. An improvement measure takes on its smallest possible value if the knowledge representations coincide. This difference in knowledge representations can be based on two states obtained via classification decisions. More generally a weighted improvement measure can be obtained by averaging measure values over pairs of states, the improvement measure values weighted as a function of corresponding values of states in two SPSs and response distributions. It is possible that an improvement measure depend on which state is the first state, and which is second, as does Kullback-Liebler information. Improvement measures can thus take on negative values, such as when a first state has a corresponding knowledge representation that properly contains the facts or skills associated with a second domain. Importantly, improvement measures can also incorporate a cost component, with costs assigned to treatments, treatment types, questions and/or topics. Hence, the relative gain of improvement within a domain can for instance be gauged with respect to the cost of administration of treatments and questions. Multiple step look ahead rules can be applied in question administration, and also in treatment application as well, in the sense that treatments (and even topics) can be hypothetically administered along with the questions. Averaging can be conducted with respect to treatment parameter posterior distributions, and/or class conditional response distributions that are functions of the treatments and SPS values. In general, treatment types which lead to the most attractive expected improvement measure values within a topic specific poset are preferred. Of course, further averaging can be conducted if there are a plurality of topic specific domains.

Treatment stopping rules can be based on stopping rules from the classification system. For example, stopping can be invoked if the posterior probability that a student belongs to a state which represents full knowledge of a topic specific domain exceeds a threshold value. Such a rule can apply for states which do not represent full knowledge, and a motivation for stopping would be that a student persistently belongs to such a state even with the administration of treatments, and hence that it may be worthwhile to move on with the remediation process. In general, stopping can be based on classification loss functions, uncertainty measures and distance measures as well, and employed in a similar manner as in classification. When useful such as for classification loss functions, classification decision rules can be employed as in classification. Further, for instance, if an uncertainty measure with respect to a current SPS or an SPS obtained by hypothetical administration of questions is less than a predetermined threshold level, stopping can be invoked. Note that classification stopping rules can be tailored towards a student belonging to a certain subset of states, such as a subset consisting of the top state. For instance, stopping can be invoked if the difference in a distance measure of the current SPS and the SPS consisting of value one for the top state and zeros for the other states is less than a given value. Stopping can also be based on improvement measures. For instance, if a weighted improvement measure exceeds a certain value with respect to an initial SPS and an SPS obtained after treatment administration, stopping can be invoked. It also can be invoked by "looking ahead" via hypothetical administration of treatments and questions, and determining if a weighted improvement measure does not exceed a predetermined value. It should be pointed out that such a stopping rule can be applied in conjunction with any treatment type selection procedure, and not just with treatment type selection rule that are based on question selection performance within a poset. Since treatments are being administered, the actual knowledge state within a poset model of a student may change during remediation. Hence, classification within a poset may be based on the latest responses as opposed to using all the responses observed during remediation.

For topic specific posets, the simplest poset is when there are two states, with one state representing mastery of the topic, and the other non-mastery (cf. Macready and Dayton, Psychometrika, 1992). Note that the process of treatment type selection can be conducted when such a simple poset is being employed, and that these simple posets can be used during remediation as criteria for treatment type selection, stopping of treatment administration and/or the treatment type selection process. Of course, more complex posets can be used, and model generation techniques employed for topic specific domains. Indeed, an original classification model, or other posets including combination and scoring models can be used as the basis for treatment type selection and stopping for the procedures described directly above.

Classification decision rules such as those used for the classification system can be employed with topic specific poset models as well. As before, decision rules within a domain are generally depend on an SPS. Decision rules that can be applied to topic specific posets include classifying to a state with the highest value in an SPS, and classifying to a state with the smallest value for a weighted loss function. When more than one topic specific domain is specified for a topic, classification in a second domain can be to states which are considered equivalent to states in a first domain. Such classification decisions are useful for instance for the topic selection process, with classifications to certain states within topic specific posets indicating which subsequent topics may be appropriate for remediation. More generally, topic selection can be based on SPSs. Assignments of SPSs for topic specific domains associated with topics subsequently remediated can depend on the SPS of topic specific domains associated with topics previously remediated and/or SPS obtained from the classification system itself. Assignment of treatment parameter prior distribution also can depend on such classification results, as test subjects with similar classification results can be viewed as responding in similar fashion with respect to treatment types. Again, classification decisions can be based on a latest set of responses.

Topic specific poset models can be generated in the same manner as classification models. For instance, skills or facts can be identified to be associated with a topic, and questions viewed as partitioning the topic specific poset through class conditional response distributions. As described above, the resultant intersection of question partitions with respect to the power set of skills partially ordered by inclusion) can be found to generate a topic specific model.

It is in fact possible that after a treatment application, a student does come to understand the subject matter being remediated, but a careless mistake is made on the response to the question. Conversely, a lucky guess can falsely indicate that the student did understand when in fact he/she did not. Note that these possibilities are incorporated in the updating of $p_i$ when for instance done in the following manner. Letting $P_u$ represent the probability that a student with the knowledge to get an question correct does so, and $p_L$ represent the probability that a student gets the question correct without the knowledge, the probability that a correct response is observed after a treatment application could be considered as $$P_i P_u + (1-P_i) P_L \qquad (50)$$

Other formulations are possible.

Note that it is plausible that if a particular person is receptive to one of the treatment types, even if they do not understand the subject matter after the first remediation attempt, the probability that they understand it after application of a treatment associated with the same treatment type on a second attempt could be higher than for the first attempt. This second stage probability could be a function of a first stage probability $_i$. An example of such a function could have a shape that slowly increases for small values of $p_i$ and then increases faster as $p_i$ approaches 1. This would imply that students with higher values of $p_i$ are more receptive to a second remediation attempt. Responses on the second stage still can update posterior probabilities concerning the corresponding $p_i$. Denoting the functional form by g, note for instance that $g(p_i)$ can be substituted for $p_i$ in the above equation.

This idea can be extended to subsequent stages as well. Also, in practice, a proposed functional form can be empirically validated by seeing if actual data behaves in such a manner and/or by estimating this functional form. For example, for Bernoulli responses, the probability of success after a second administration of a same treatment or treatment associated with a same treatment type can be estimated among students with similar classifications and/or through conditioning on responses to previous treatment applications.

It should be pointed out that the function describing secondary stage probabilities may not always be increasing, and in fact may be decreasing. This may for instance occur in a situation when partial knowledge obtained from remediation may in fact reduce the possibility of making a lucky guess in a multiple choice setting.

Similarly, a transformation function can be applied to response values or response density values during the updating of treatment parameter values. This transformation function can change depending on the topic, treatment type, treatment application, responses to previous treatment applications, and/or class conditional densities. Employing such functions is useful if for instance one topic is more difficult to remediate than other topics. In such instances, a "failure" in remediation (as measured for instance by question responses) after a treatment application for a topic should not penalize the estimated value of a treatment parameter as much as when "failure" occurs with relatively less difficult topics. Responses to questions corresponding to a "failure" for a treatment in remediation could have their response density values transformed to larger values. Applying such functions to transform response values or response density values during the updating of treatment parameters allows the treatment type selection process in an "intelligent" tutoring system to take into account variation in the difficulty in remediation of various topics. An example of a desirable property for transformation functions corresponding to specific topics is that for transformed density values corresponding to responses reflecting similar understanding levels (e.g. "failures" in remediation), these transformed values are approximately equal across topics. These transformation functions can be estimated from data.

Up to now, approaches have been described for finding the most effective treatment type based on assigning an initial prior distribution for a parameter associated with each of the treatment types. Associated prior distributions are updated from treatment application to treatment application across the remediation of topics. An alternative approach would be to assign prior distributions associated to parameters that relate to the effectiveness of treatment types that are specific to a topic or a subset of topics. Treatment type selection based on prior distributions of topic specific treatment parameters can then be applied, as described above. Indeed, assignment of prior distributions for treatment parameters could possibly even vary from question to question.

One way to implement this more complex yet also more flexible approach would be to update from corresponding treatment application to treatment application an estimate of a hyperparameter (or a prior distribution for a hyperparameter) associated to each treatment type. In other words, a hyperparameter can be re-estimated after administration of a corresponding treatment, and/or the prior distribution of a hyperparameter updated. A parameter $P_i$ can play the role of this hyperparameter. Then, for instance, prior distributions assigned to respective topic specific treatment parameters can depend upon a corresponding hyperparameter. These prior distribution assignments may thus vary from topic to topic. These hyperparameters can be viewed as some "global" measure of effectiveness of a treatment type, with larger values indicating more effectiveness. Treatments can be identified to each other across topics through association with a hyperparameter. Moreover, distributions of responses to questions could also directly be functions of a hyperparameter value, responses to certain questions and/or a topic specific treatment parameter. Response distributions could possibly also depend on a student's classification results, and these response distributions can be of general form (i.e. not just Bernoulli or multinomial).

The updating of prior distributions corresponding to topic specific treatment parameters can coincide with that of hyperparameters (e.g. using the same response distributions in the updating rule, possibly with respect to different posterior distributions). It is possible that transformation functions on the responses or response densities can be used in the updating process for either hyperparameters or topic specific parameters. These transformation functions can possibly be different depending on the parameter, and even different response distributing can be employed. It is also possible that once hyperparameters are used to assign the initial prior distribution for the topic specific treatment parameters, they play no further role in the treatment selection process for that particular topic. However, note that respective posterior distributions and/or estimates for hyperparameter could be still be updated via the responses obtained during that topic's remediation. Hyperparameter values could be estimated from their corresponding posterior distributions (if they exist), or could be estimated from responses, for instance such as by a (weighted) proportion of the successful rededications, with successes on more difficult topics possibly being weighted more heavily.

When a new topic is to be remediated, assignment of initial prior distributions can be a function of corresponding hyperparameter values (estimated up to that stage, possibly through its posterior distribution) in the following way. For instance, for large values, the mean of the prior distribution for a topic specific treatment parameter could be relatively large as well (assuming that large values are attractive), and perhaps assigned in some sort of "automated" fashion (i.e. following a predetermined functional form). This functional form could be a linear or logistic function which depends on the topic. The variances of these prior distributions and other moments also could be a function of these hyperparameters. Functions for prior distribution assignment can be estimated from data collected previously.

Once again, then, for each set of treatment parameter prior distributions associated with a topic or subset of topics, the same basic treatment selection and stopping problem as described above can then be conducted. Treatments can be applied and responses obtained from questions until stopping criteria are satisfied. Techniques for treatment type selection, stopping and parameter estimation apply as before. Tree structures incorporating these procedures and decisions also can still be employed. Response distributions in general will be functions of topic specific parameters, responses to questions and/or hyperparameters. Responses can be used to update the respective posterior distributions corresponding to topic specific treatment parameters after treatment administrations for a topic under remediation, and also to update posterior distributions (or estimates) of hyperparameters. Importantly, this approach allows for assignment of prior distributions of remediation treatment parameters to vary from topic to topic, and yet also takes into account responses from previous rededications. Determining which treatment type is more effective can be based on the hyperparameter values or functions of posterior distributions associated with hyperparameters.

It should be pointed out that topic specific treatment parameters estimated from previously remediated topics (e.g. through corresponding posterior distributions) can play the role of hyperparameters in prior distribution assignment. Functions of these estimated treatment parameters can be used. Related treatment parameters can be associated with each other across topics, such as through the dependency of each other through such functions. Topic specific treatment parameter prior distributions can also be assigned as functions of responses to questions, for instance with respect to questions given during or after administration of associated treatments. Also, determination of which treatment type may be more effective can be based on comparing functions of estimated associated topic specific treatment parameters, such as average estimated values.

It is possible to create a set of categories for each treatment type, with each category representing a level of effectiveness for a particular student. These categories can be viewed as an extra set of discrete states. Examples of categories could be "highly effective", "effective", "somewhat effective", "not effective". It can be assumed that each student will belong to one of these categories, and that probability of membership will be measured by an SPS, For a given topic, a class conditional response distribution of an item or question can be dependent on the partition a state belongs to within a topic specific poset and/or also on which category of effectiveness a student belongs to in relation to a treatment type. An SPS relating to which category of effectiveness appropriately describes the student can then be updated after treatment administration and question response. This updated prior distribution can then be used in the treatment type selection process, and for determining which of the treatment types may be more effective. These discrete treatment parameters may be topic specific.

Again, myopic rules or their k-step extensions, randomization rules and dynamic programming techniques can also be employed in determining treatment type selection sequencing, with the objective being to minimize (or maximize) a criterion. These approaches can involve considering the treatment type categories as values of a categorical or discrete treatment parameter. Note that numerical values can be assigned to the categories. For both assessment and treatment type selection purposes it may also be of interest to classify a student to a category for each treatment type over the course of the remediation process. A comparison as to which treatment type may be more effective can then be based on the posterior probabilities of the categories for respective treatment types. Classification is conducted in the usual fashion, as the collection of categories for each treatment type can be viewed as a poset. A product can be taken with other treatment type category posets and an original classification or topic specific poset to form a new poset model (cf. Davey and Priestly, Lattices and Order, Cambridge University Press, 1990). Parallel model methods can be used in this situation. A generalization could be to represent the different categories of treatment effectiveness as a non-linear poset. Note that multiple questions can be administered between treatments, and hence that item selection routines used in the classification system can be employed to select questions for administration.

An example of a stopping rule for classification used in this context could be to stop if with certain probability a student belongs to an attractive category for a treatment such as "highly ecffivey", or a student with high probability responds more effectively to one treatment type as opposed to the others as measured by probabilities of category membership. Note that classification of certain treatment types (possibly topic specific) can be abandoned for certain subsets of topics if they do not appear to be relatively effective, for instance according to an SPS. Of course, other stopping rules used in classification can be employed as well, such as those based on loss functions, those based on information from parallel poset models, and stopping if the posterior probability of a state in a poset (perhaps incorporating information about treatment effectiveness and/or perhaps from a certain subset of states) exceeds a threshold value. Again, once stopping is invoked, a determination as to which treatment type is most effective can be made based on posterior probabilities.

Similarly, the combination model can be used in the remediation treatment selection process. For the different treatment types, a dimension (or dimensions) can be attached to a topic poset model corresponding to each of the treatment types. An SPS can be extended to incorporate these added dimensions, with the SPS on these dimensions representing the prior distributions for the treatment parameters. For questions administered during or after a treatment application, responses to the questions (or items) would have the class conditional response distributions dependent (i.e. conditional) on which partition a state belongs to plus the parameter value associated with the treatment (e.g. such as $p_i$ as described above). There may be several questions related to a subset of topics. As before, then, objectives to treatment administration and testing can be to minimize or maximize an expected value of a criterion until stopping is invoked and/or to classify a student within the combination model. For assessment purposes and to determine which treatment type may be more effective, responses can be used to classify a student to a value in the attached dimensions as well as in an original model. As for a final determination as to which treatment type is more attractive, for instance the posterior mean values of treatment parameters in corresponding dimensions can be compared. Finally, methods for treatment type selection and treatment stopping as used for topic specific posets can be applied to posets based on (or generated by) treatment parameters as well. In other words, posets based on (or generated by) treatment parameters can be treated as a topic specific poset for the purposes of treatment type selection and/or treatment stopping. Note that k-step look ahead measures for question selection and stopping may also include administration of topics as well as questions and treatments.

This remediation system applies to general response distributions, including multinomial responses to questions. Note again that certain responses can imply certain misconceptions. If such an erroneous response is given during the remediation process, this may indicate a shift in the student's knowledge state. Hence, although treatments from a same treatment type may be applied (as in the mathematics example), the focus of the questions may shift, such as to a different sot of skills. It can thus be useful to allow prior distributions of treatment parameters to change from application to application of treatments by methods other than via an updating rule, even when the same treatment is being applied again. Observing certain erroneous responses may at times be viewed as encouraging in the sense that it could be gauged as progress in the understanding of the topic subject matter. In such cases, updated prior distributions for treatment parameters should reflect an increased chance for success on certain questions related to a topic (e.g. the mean of the prior distribution should be higher). This can be achieved by reassigning prior distributions and/or transforming density values. Also, note that responses to questions given to provide feedback during remediation can be used to reassign prior distributions.

Indeed, the responses given during remediation can be used to reclassify a student with respect to the original classification poset. One approach could be to consider a set of the latest responses from the remediation of topics. More than one response from the one or more redecations could be used. Based on these responses, classification can occur as in the classification system. Before such subsequent classifications, a new initial SPS for the original poset model can be assigned based on the resultant SPS after a first round of testing. One method for assigning a new initial SPS could be to uniformly assign probabilities to all states not directly below the state classified to after a first stage, or among the states directly above that state. A generalization could be to disperse the probability of each state in a student's final SPS in a manner as above, and then consider the aggregate sum of these dispersed probabilities that result for a state as being its corresponding value in the new initial SPS.

Associated prior distributions of the parameter of a treatment type based on updated classifications could then be used in treatment type selection. Recall that assignment of prior distributions of treatment parameters can be a function of state membership in a poset model. Information such as responses to questions from previous administrations of treatments can be used to update these prior distributions. For instance, a hyperparameter value can be used. If there is uncertiny (as represented by an updated SPS) about state membership, prior distributions for the treatment parameters associated with states can be averaged. New prior probability distributions can be obtained by summing the associated densities and weighting them by corresponding SPS values. Note that the subsequent sequence of topics to be remediated can be based on reclassification results.

Another approach to reclassifying a student is to retest him or her, again perhaps with an initial SPS derived from a student's final SPS obtained after remediation. With either method of reclassification with respect to a classification poset, it is of interest to gauge the "progress" that has been made. This can be measured for instance in terms of the difference in the knowledge representations of the previous state classified to and the one classified to after a second classification. Such a difference can be in terms of the skills that have been mastered. Another measure could be to identify the difference in skills that have been mastered with a certain probability with respect to the corresponding SPS. Such a report can give encouragement to the student, and provide a detailed assessment of progress to both the student and teacher. Treatment stopping rules can be based on reclassification as well. For instance, based on a given topic specific poset, the treatment administration process can be stopped for one or more topics if the difference in uncertainty or distance measures of a first SPS and an SPS obtained from reclassification exceeds predetermined values. An example of a first SPS could be an SPS which places all probability mass on a top state.

Importantly, treatment type selection can be based on the class conditional response distributions of questions with respect to a poset model that are functions of the treatment type selected and/or specific treatments that have been applied. Consideration of questions can be restricted to those related to a given topic or with respect to class conditional response distributions in relation to a given set of topic specific domains. Treatment types with corresponding conditional response distributions for questions that are most attractive would be selected. Determination rules can be based on such criteria as well. Again, an SPS or a classification decision can be used to represent or determine state membership. Criteria could for instance include choosing the treatment type having the highest probability of success for an associated question for a given state, or the highest average probability of success among a collection of associated questions and/or class conditional probabilities that are is weighted with respect to an SPS. In general, an objective could be to optimize the expected value of a response function or reward function (possibly k-steps ahead) among treatment types, where questions are assigned class conditional response distributions with respect to a poset model. Randomized treatment type selection can be based on class conditional response distributions. For instance, suppose a classification is made within a poset model. A treatment type could be selected based on a response function, where responses to questions that are associated to treatment types are simulated based on corresponding class conditional response distributions, the classified state being the state conditioned upon. Moreover, this kind of randomized selection procedure can be conducted even if response distributions are not functions of a state in a poset model.

Response distributions can be used to randomize the decision of whether to accept or reject a tentative treatment type selection. For instance, once a treatment type is selected, a question response can be simulated based on a corresponding response distribution. If the response is a correct answer, the treatment type selection can be accepted, otherwise it is rejected. These same ideas for tentative selection can be applied to item selection in the classification system as well (and to question selection during the remediation process).

What can mainly differentiate this approach of analyzing class conditional response distributions is that an individual's responses to treatments need not be viewed as functions of a treatment parameter value. Alternatively, a student's responses to treatments can be assumed to be similar to other students which share a similar SPS or classification decision. Such response distributions can be estimated in the same manner as with usual item parameters, using data restricted to responses that follow a particular treatment or treatment type. It may be of interest to further restrict estimation to responses that have followed the same number of treatment applications as well. This approach to treatment type selection is most effective if students classified to the same or similar states have a strong tendency to respond similarly to the same treatments. This is plausible for instance in the mathematics example if certain states are predominantly associated with algebraic skills, while other states are predominantly associated with geometric skills. Assigning an initial SPS to the classification model or a topic specific poset and updating it with responses, it could also be of interest to see which treatment application leads to questions that are most attractive relative to objective functions such as a treatment loss function. Recall also that treatment type selection procedures can be based on item selection procedures (e.g. uncertainty measures, distances measures, k-step look ahead rules based on a loss function). Treatment types, multiple treatments after a treatment-type selection, and even topics may be applied as well as questions in calculating k-step look ahead rules. For such situations, class conditional response distributing can be used in the same manner as response distributions that are functions of treatment parameter values (response distributions can depend on both treatment parameters and a state in a model). It also should be noted that treatment stopping criteria can be weighted with respect to conditional response distributions such as those based on treatments or treatment types. A determination rule could be based on functions of the response distributions or response function values with respect to a classification decision or an SPS. Treatment types which are most attractive with respect to expected response function values of associated questions, expectation taken with respect to class conditional response distributions (and possibly an SPS), would be selected by a determination rule.

Treatments can be administered more than once for a topic or given across topics, possibly being modified from administration to administration. Treatments can be applied in gradations, as measured for instance in terms of time needed for administration, or amount, type or format of material presented. For example, two versions of a remediation treatment may be prepared, such as "short" and "full-length" versions. Clearly more gradations are possible. These gradations may be treated as different treatments or treatment types in terms of prior distribution assignment to parameters or class conditional response distributions for questions. Cost functions for treatments are particularly applicable in this context, where longer, more complex versions could have higher cost of administration. A collection of gradations of a treatment can be viewed as a treatment type. Treatment type selection techniques can be conducted between such gradations of a same treatment as well, for instance once a treatment type is selected versus other treatment types. Perhaps the selection of a treatment type before selection among gradations of a treatment can be conducted on the basis of the average properties of gradations in terms of corresponding prior distributions or response distributing that are dependent upon the various gradations. Moreover, treatment type selection can be directly based not just on information relating to individual treatments associated with a treatment type, but also on information from gradations of a treatment. Also, gradations can be parameterized by a discrete and/or a continuous variable, particularly with response distributions being a function of such variables. It should be noted that it is not necessary to view gradations of a treatment as different treatments.

Note that the above discussion can be generalized straightforwardly to general response distributions beyond Bernoulli or multinomial, and when responses to questions are dependent on previous questions and/or treatment administrations. Distributions for question response can for instance be functions of treatment parameters. Treatment parameters can be updated as responses are observed. Modeling extraneous variables such as previous test scores into the response distributions also is possible, and hybridized rules and relative ranking measures can be employed with treatment type selection procedures in a similar manner as with item selection.

It may be useful to stop the treatment-type selection process completely or for a subset of topics, and apply a rule to determine which treatment may be more effective. Let us refer to a stopping rule relating to the treatment-type selection process as a treatment-type selection process (ISP) stopping rule, and a rule which determines which treatment type may be more effective as the determination rule. Note that stopping the treatment type selection process does not necessarily imply the stopping of the remediation process. Tree structures can be used to represent topic selection, the treatment stopping process, and/or determination rules as well. TSP stopping rules possibly may be applied at selected stages during the remediation process. TSP stopping rules can be applied along selected stages of branches from a tree embodying aspects of the remediation process, as in a "peel-back" proces. Even if a TSP stopping rule and determination rule is invoked, subsequent topic selection sequences, treatment and question sequences and/or treatment stopping rules can still be embodied by a tree structure.

Examples of basic TSP stopping rules are when the number of treatment types, treatments, questions and/or topics administered exceed predetermined thresholds, exceeding treatment type, treatment and/or question administration thresholds for a specified number of topics, when certain sets of responses to questions are seen, and/or when posterior variances of a collection of probability distributions associated with treatment parameters are below threshold values. TSP stopping rules can be based on treatment stopping rules (and vice-versa), with rules perhaps being used in conjunction. Predetermined thresholds can be activated from any stage of remediation, where the thresholds apply beginning from the stage of activation. A straightforward TSP stopping rule is to invoke stopping when all topics deemed to be in need of remediation have been remediated (perhaps in terms of reclassification results). For such cases, determination rules can give information for future possible rededications.

TSP stopping rules can be based on TSP loss functions, where a TSP loss function depends on treatment parameter values, the number of treatment types, treatments, questions and/or topics administered, and an action of a determination. Costs (which possibly vary) can be assigned among treatment types, treatments, questions, and/or topics, and incorporated into a TSP loss function. These costs can vary depending on such factors as treatment type or topic. Also, treatment parameters can be topic specific. Stopping can be invoked if an expected value of a TSP loss function value exceeds a predetermined value based on up to some respective numbers of hypothetical administrations of treatment types, treatments, questions and/or topics. Expectation can be taken with respect to treatment parameter prior distributions (possibly topic specific) and response distributions of questions. An example of a TSP loss function which incorporates a determination rule is the sum of administered treatment costs plus a 0–1 loss function which assigns a 0 if the determination rule selects the most effective treatment type, and a 1 if it does not. Another example of incorporation of a determination rule is when a poset model gives information about treatment type effectiveness, and the determination rule is based on a classification rule or a function of a corresponding SPS. TSP loss functions thus can depend on a state in a poset model as well. Response function values also can be used as a basis for a determination rule, and hence they also could be included into a TSP loss function.

Classification stopping rules in relation to topic specific domains (i.e. stopping rules used in the classification process) also can be employed as TSP stopping rule. Possible instances when such stopping rules may be applied include when classifying to knowledge states containing information about the effectiveness of treatments, within combination models such that continuous components are associated with treatment parameters, and/or to treatment parameter values that are discrete or categorical. Costs assigned to treatment types, treatments, questions and/or topics can be incorporated into classification loss functions on which stopping rules are based. A TSP stopping rule could be to stop the process if classification stopping within a topic specific poset model is invoked with classification occurring to a state among a subset of the topic specific states. Treatment stopping techniques based on classification performance in a classification poset can be employed as TSP stopping rules as well (e.g. weighted uncertainty and distance measures exceeding predetermined values), as can stopping rules used when parallel models are being employed, for instance based on hypothetical responses to questions (perhaps the latest) obtained after hypothetical administration of treatments and topics. TSP stopping rules can also be based on responses to questions already administered (possibly a subset of responses, such as the latest in each remediation of a topic). For instance, for a given poset model, the treatment type selection process can be stopped if the difference in uncertainty or distance measures of an initial SPS and SPS obtained from reclassification exceeds predetermined values. Improvement measures can be used as well. Finally, TSP stopping rules can be used in conjunction.

Importantly, criteria used by TSP stopping rules can be used for stopping the remediation process as well, specifically the administration of further topics. These include criteria based on TSP loss functions, the number of treatment types, treatments, questions, and/or topics administered, classification performance, observing certain sets of responses, and the number of topics that need to be remediated based on reclassification results. Another criteria for stopping the remediation process could be that a set of treatment stopping rules are satisfied for a corresponding subset of topics.

It may be quite natural that multiple questions be given between treatment applications, and that multiple treatments be given between treatment type selections. Such multiple treatments can be selected for instance in a hierarchical manner, viewing treatments as treatment types and applying treatment type selection techniques. Suppose for each treatment there is an associated collection of questions that could be administered during or after the treatment is applied. Subsets of these collections of questions may be shared by treatments. Techniques for selection of treatment types can again for instance be based on prior distributions of corresponding treatment parameters or conditional response distributions of questions that are functions of the treatments. For example, when based on treatment parameter distributions, a treatment type can be selected that within a subsequent k-step question selection horizon attains on average a stopping criterion with as few question administrations as possible, or maximizes an average reward function over a subsequent k-step question selection horizon. Recall that in a k-step question selection horizon at most k questions will be administered, but that it is possible that for certain sequences less than k will be given. Again, treatment types, treatments (and even topics) may be applied along with questions in k-step look ahead calculations. The look-ahead horizon for treatment types, treatments, and/or topics may vary. In general, reference to k-step look ahead rules includes the possibility that questions, treatments and/or topics are administered (with perhaps look ahead horizon lengths varying from stage to stage and with questions, treatments and topics perhaps having different look ahead horizon lengths as well). Item selection criteria as described for the classification system such as uncertainty measures and distance measures can also be used when administering multiple questions, with the underlying poset model being topic specific or a general classification poset. Also, when based on class conditional probabilities of questions, a treatment type could be selected which has an associated question with the largest conditional probability of success or has largest average such value over a collection of associated questions. Treatment type and/or question selection can be randomized in this context as well. Note that item selection stopping rules can be applied during the question selection stage after a treatment is applied, with questions administered until stopping is invoked for question administration. The treatment type selection process can then continue.

Let us refer to tree structures which incorporate aspects of the remediation system as remediation strategy trees. Remediation strategy trees thus can incorporate topic selection, treatment type selection, question selection, treatment stopping rules and TSP stopping rules, and/or determination rules. These aspects form what can be referred to as a remediation strategy, so that remediation strategy trees embody remediation strategies. Tree structures can be used to embody any aspect of a remediation system as well, and may also be referred to as remediation strategy trees. Note that the term treatment type selection strategy also was used to describe the treatment type selection process. Collection of trees can be used to represent randomized remediation strategies, where randomization takes place within a strategy among a collection of associated trees. A portion (or all) of the remediation process can then be conducted based on a selected tree. Similarly, tree structures (strategy trees) can be used to embody any aspect of the classification process as well.

Treatment selection procedures can be used in parallel. For instance, discrete treatment parameters can be updated in parallel fashion with continuous treatment parameters, with both types of parameter representing effectiveness of a same treatment type, In general, more than one treatment parameter can be employed simultaneously to represent effectiveness of a treatment type. Response distributions assigned specifically to the corresponding types of parameters can be used in updating respective posterior distributions. Treatment type selection can then be based on a subset of the parameters. Topic specific poset classification also can be conducted in parallel, with multiple topic specific poset models specified in parallel for the same topic. Note that multiple SPSs for a test subject can be assigned to a same classification or topic specific poset model, and that this can be viewed as employing parallel models. One motivation could be that there may be a number of cognitive representations for a topic that may be appropriate depending for instance on the population of test subjects, with classification conducted in parallel and with an objective being to determine the actual cognitive representation that is most appropriate for a test subject. This same application of parallel models can be used by the classification system. Further, a scoring model may be employed, as it may be of interest to obtain a score value for a particular topic or a set of topics. Conceptually, employing treatment type selection methods in parallel is analogous to employing parallel item selection rules in classification. Hence, similar techniques can be applied in such situations. Information about performance or classification can be obtained in parallel fashion with parallel models, and such information combined in order to be used as the basis for treatment type selection, question selection, treatment and TSP stopping considerations, and determination of treatment effectiveness. Combining information can be done for instance through weighting or randomization.

Recall that individual treatments can themselves be viewed as treatment types. Hence a treatment parameter (possibly topic specific) can be assigned to a treatment as well. Again, such treatment parameters can be functions of a hyperparameter. A treatment parameter corresponding to a treatment type to which an individual treatment is associated with could serve as a hyperparameter. Note that treatment parameters can be functions of response distribution parameters, such as an average of response distribution parameter values for questions associated with a treatment or treatment type. Clearly this can concept can be applied to the case when an individual treatment is viewed as a treatment type, or when an individual treatment is assigned its own treatment parameter. In turn, response distributions of questions can be dependent on one or more individual treatments (or corresponding treatment parameters), and not just dependent on a treatment type. Response distributions can also be functions of hyperparameters.

Treatment type selection when a treatment type has associated with it more than one treatment can be a function of treatment parameters corresponding to a subset of associated individual treatments as well. Indeed, treatment parameters can be assigned to individual treatments even if the individual treatments will not be viewed as treatment types in themselves. Treatment parameters can be assigned to subsets of individual treatments associated with a treatment type as well. Also, treatment parameters associated with individual treatments or subsets of such treatments can be functions of an associated treatment type's treatment parameter, with the treatment parameter associated with the treatment type playing the role of a hyperparameter. Treatment type selection can be based on selecting the treatment type with the most attractive associated individual treatment or collection of treatments, with attractiveness based on an objective function, such a function depending on treatment parameters associated with individual treatments or response distributions of questions associated with individual treatments. Moreover, treatment type selection can be based on functions of parameters or probability distributions associated with gradations of treatments. Reward functions and other response functions of questions associated with a treatment type can be used as objective functions for treatment type selection based on response distributions associated with treatments. Class conditional techniques which assign response distributions of questions as a function of a state in a poset model in addition to treatment or treatment type can be employed in such contexts.

Selection of which treatment to administer after selection of a treatment type can be a random process, with randomization possibly being a function of response distribution parameters such as the probability of success of questions after treatment administration. Treatments with higher subsequent probabilities of success (such as on average with respect to a collection of associated questions) would be more likely to be administered.

Finally, it should be pointed out that the above techniques for treatment type selection do not necessarily have to be used after testing and classification has been conducted. It is possible that teaching could be conducted in this fashion from the outset, as opposed to testing and classifying a student first. The administration of treatments and questions can be viewed as a dialogue between the student and the "intelligent" tutoring system. Reclassification techniques particularly could play an important role in appropriate treatment type selection. This treatment type selection system can be employed in medical and engineering applications as well, particularly within the framework of the classification system.

What is claimed is:

1. A method for remediation comprising the steps:
   (a) compiling a collection of one or more topics, a topic being a set of facts, a set of values, or a combination of a set of facts and a set of values that characterize knowledge and/or functionality, the set of facts that characterize knowledge being any set of facts, the set of facts that characterize functionality being a set of facts relating to the functionality of a test subject;
   (b) compiling a collection of one or more treatments for each topic, a treatment comprising materials intended to teach a test subject;
   (c) specifying a plurality of question blocks for each of the one or more treatments of step (b), a question block consisting of one or more questions, a response distribution being assigned to at least one of the questions in at least one of the question blocks;
   (d) selecting one or more topics from those in the collection of step (a) for remediation;
   (e) selecting one or more treatments from those specified in step (b) for the topics selected in step (d);
   (f) obtaining responses to one or more question blocks associated with the treatments selected in step (e) from a test subject after exposure to the one or more treatments of step (e);
   (g) obtaining a measure of the effectiveness of the treatments of step (e) and utilizing one or more of the response distributions assigned in step (c).

2. The method of claim 1 further comprising the steps:
   (h) repeating method from step (e) for one or more active topics, an active topic being a topic for which one or more treatment stopping rules have not been satisfied; otherwise:
   (i) repeating method from step (d) unless a method termination rule is satisfied.

3. The method of claim 2 wherein in step (h) a treatment stopping rule is one of the group consisting of (1) based on a function of one or more responses to question blocks, (2) that one of one or more predetermined sets of responses to question blocks have been obtained, (3) that a predetermined number of responses to question blocks have been obtained, (4) that a weighted treatment loss function value exceeds a predetermined value after hypothetical or actual administration of one or more treatments, (5) that a weighted treatment loss function value exceeds a predetermined value after hypothetical or actual administration of one or more questions, (6) that a weighted treatment loss function value exceeds a predetermined value after hypothetical or actual administration of one or more topics, (7) the combination of one or more treatment stopping rules, (8) based on one or more responses, (9) based on one or more response function values, (10) that a predetermined number of treatment types have been administered, and (11) that a predetermined number of treatments have been administered.

4. The method of claim 3 wherein a treatment loss function incorporates one or more of the group consisting of (1) a cost of administered treatment types, (2) a cost of administered treatments, (3) a cost of administered questions, (4) a cost of administered topics, and (5) response function values.

5. The method of claim 2 wherein step (a) includes the step:
(a1) specifying one or more topic-specific domains, each topic-specific domain comprising a plurality of states, the relationship between states in a topic-specific domain being characterized by a partial ordering, a test subject's relationship to a topic-specific domain being representable by an SPS (state probability set);
the treatment stopping rule in step (h) being based on a member of the group consisting of (1) a weighted loss function, (2) a weighted improvement measure, (3) an SPS corresponding to a topic-specific domain, (4) a weighted uncertainty measure of an SPS corresponding to a topic-specific domain, (5) a weighted distance measure between a first SPS and a second SPS, and (6) a weighted treatment loss function where the treatment loss function is a function of a state in a topic-specific domain.

6. The method of claim 1 wherein in step (i) a method termination rule consists of one or more treatment stopping rules.

7. The method of claim 1 wherein the treatments specified in step (b) can be classified as to treatment type, step (e) comprising the steps:
(e1) selecting one or more treatment types from a treatment-type pool for a topic selected in step (d), the number of treatment types in the treatment-type pool being limited to one if a treatment-type selection process (TSP) stopping rule is satisfied and;
(e2) selecting one or more treatments from each treatment type selected in step (e1).

8. The method of claim 7 wherein in step (g) the value of a treatment parameter is measure of effectiveness, a probability distribution being associated with the treatment parameter, the selection process of step (e1) utilizing the probability distributions associated with one or more treatment parameters.

9. The method of claim 7 wherein step (e1) is discontinued for a topic when a TSP stopping rule is satisfied.

10. The method of claim 9 wherein a TSP stopping rule is based on a member of the group consisting of (1) one or more responses to questions, (2) a weighted TSP loss function, (3) the number of treatments selected exceeding a predetermined number, (4) the number of responses to questions exceeding a predetermined number, (5) the number of topics selected exceeding a predetermined number, (6) one of a plurality of predetermined subsets of responses to questions are obtained, and (7) response function values.

11. The method of claim 10 wherein a TSP loss function incorporates one or more of the group consisting of (1) a cost of administered treatment types, (2) a cost of administered treatments, (3) a cost of administered questions, (4) a cost of administered topics, (5) response function values, (6) a determination rule, and (7) a treatment parameter value, a treatment parameter being a measure of effectiveness of a treatment type.

12. The method of claim 7 wherein the selection of treatments is from the one or more treatments of the most effective treatment type, the most effective treatment type being determined by means of a determination rule.

13. The method of claim 12 wherein a determination rule is based on one of the group consisting of (1) a function of probability distributions associated with one or more treatment parameters, a treatment parameter being a measure of effectiveness of a treatment in remediating a test subject, (2) one or more probability distributions associated with one or more hyperparameters, and (3) one or more hyperparameter values.

14. The method of claim 7 further comprising the step:
(j) defining a remediation strategy tree.

15. The method of claim 14 wherein one or more branches of a remediation strategy tree are removed if a treatment stopping rule or a TSP (treatment-type selection process) stopping rule is satisfied at one or more points along paths of the remediation strategy tree.

16. The method of claim 7 wherein a response distribution for a question is a function of one or more treatments or a treatment type.

17. The method of claim 7 wherein a probability distribution is associated with the treatment parameter, a treatment parameter being a measure of effectiveness, a TSP stopping rule being based on the probability distributions of one or more treatment parameters or the posterior variance of a probability distribution associated with a treatment parameter.

18. The method of claim 7 wherein a TSP stopping rule is based on one or more responses to question blocks.

19. The method of claim 7 wherein in step (e1) selection of treatment type is based on one or more response distributions for questions, the response distributions being functions of one or more treatments or a treatment type.

20. The method of claim 7 wherein in step (e1) selection of treatment type is based on a weighted objective function, the weighting being done with respect to one or more response distributions for questions, a response distribution being a function of one or more treatments or a treatment type.

21. The method of claim 7 wherein a TSP stopping rule is based on a function of one or more response distributions which are functions of one or more treatments or a treatment type.

22. The method of claim 7 wherein step (a) includes the step:
(a1) specifying one or more topic-specific domains, each topic-specific domain comprising a plurality of states, the relationship between states in a topic-specific domain being characterized by a partial ordering, a test subject's relationship to a topic-specific domain being representable by an SPS (state probability set);
the TSP stopping rule of step (e1) being based on a member of the group consisting of (1) a weighted loss function, (2) a weighted improvement measure, (3) an SPS corresponding to a topic-specific domain, (4) a weighted uncertainty measure of an SPS corresponding to a topic-specific domain, and (5) a weighted distance measure between a first SPS and a second SPS.

23. The method of claim 7 wherein a treatment type may include one or more treatments for a topic.

24. The method of claim 7 wherein step (g) includes the step:
   (g1) estimating the value of a treatment parameter associated with a treatment type utilizing one or more responses to question blocks, a treatment parameter being a measure of effectiveness.

25. The method of claim 7 wherein in step (e1) the selection of a treatment type is based on one of a group consisting of (1) a weighted response function, (2) a weighted reward function, and (3) a weighted treatment loss function.

26. The method of claim 25 wherein a treatment loss function incorporates one or more of the group consisting of (1) a cost of administered treatments, (2) a cost of administered questions, (3) a cost of administered topics, (4) cost of treatment types, and (5) response function values.

27. The method of claim 7 wherein in step (e1) a prior treatment type is selected if the prior treatment type resulted in a set of responses matching one of one or more predetermined sets of responses to question blocks.

28. The method of claim 7 wherein in step (e1) a treatment type is selected by a process selected from the group consisting of (1) a random process and (2) a process selected randomly from a plurality of treatment selection processes.

29. The method of claim 7 wherein in step (e1) a treatment type is tentatively selected using a predetermined treatment-type selection rule, a random decision being made either to confirm the selection of the treatment type or to select another treatment type.

30. The method of claim 7 wherein step (e1) includes the steps:
   (e1-1) creating a plurality of remediation strategies, a remediation strategy being representable by one or more remediation strategy trees;
   (e1-2) selecting a best remediation strategy based on a comparative evaluation of the remediation strategies utilizing one or more objective functions and;
   (e1-3) selecting a treatment type from the best remediation strategy.

31. The method of claim 7 wherein in step (e1) the treatment type selection process occurs in one or more stages, each of one or more treatment types being selected a predetermined number of times during a first stage.

32. The method of claim 7 wherein step (e1) can be accomplished using any one of a plurality of treatment-type selection processes, a particular treatment-type selection process being selected based on one of the group consisting of (1) a hybridized rule and (2) a relative ranking of treatment-type selection processes.

33. The method of claim 7 wherein a treatment type is deleted from the treatment type pool for a topic if a treatment-type deletion rule is satisfied.

34. The method of claim 33 wherein a treatment-type deletion rule is based on one of the group consisting of (1) an estimated value of a treatment parameter, the treatment parameter being a measure of effectiveness of a treatment and (2) a probability distribution associated with a treatment parameter, the probability distribution being a representation of the effectiveness of a treatment-type.

35. The method of claim 1 wherein in step (g) the value of a treatment parameter is a measure of effectiveness.

36. The method of claim 35 wherein a probability distribution is associated with the treatment parameter.

37. The method of claim 36 wherein the probability distribution associated with a treatment parameter is updated based on one or more responses.

38. The method of claim 36 wherein step (g) includes the step:
   (g1) updating a treatment parameter value utilizing one or more responses to question blocks.

39. The method of claim 36 wherein the probability distribution associated with a treatment parameter is one of the group consisting of (1) a function of one or more other treatment parameters, (2) a function of the probability distributions associated with one or more other treatment parameters, and (3) a function of one or more hyperparameters.

40. The method of claim 36 wherein the probability distribution associated with a treatment parameter is a function of one or more responses to question blocks.

41. The method of 36 wherein step (g) includes the steps:
   (g1) assigning a probability distribution to a hyperparameter and;
   (g2) updating the probability distribution of the hyperparameter based on responses to one or more question blocks, the response distribution associated with a question used to update the probability distribution of the hyperparameter being different from the response distribution associated with the same question used to update the probability distribution of a treatment parameter.

42. The method of claim 35 wherein a treatment parameter takes on a discrete set of values.

43. The method of claim 1 wherein in step (a) a plurality of topics are first identified and then one or more topics are selected in a random manner from the plurality of topics identified for inclusion in the collection.

44. The method of claim 1 wherein in step (a) a plurality of topics are first identified and then one or more of the easiest of the plurality of topics are selected for inclusion in the collection.

45. The method of claim 1 wherein the response distribution of step (c) is a function of one or more treatment parameters, a treatment parameter being a measure of effectiveness.

46. The method of claim 1 wherein step (g) includes the step:
   (g1) updating a probability distribution utilizing one or more responses to question blocks and an updating rule.

47. The method of claim 1 wherein in step (f) a plurality of question-block sequences are generated, the question-blocks to be used in obtaining responses from a test subject being selected from one of the plurality of sequences based on a question-block sequence selection rule, the question-block sequence selection rule being based on a comparative evaluation of the question-block sequences based on one or more objective functions.

48. The method of claim 1 wherein step (g) includes the step:
   (g1) applying a transformation function to a response distribution.

49. The method of claim 1 wherein step (g) includes the steps:
   (g1) assigning a probability distribution to a hyperparameter and;
   (g2) updating the probability distribution of the hyperparameter based on responses to one or more question blocks.

50. The method of claim 1 wherein the response distribution of a question is a function of the number of treatments administered to the test subject.

51. The method of claim 1 wherein the response distribution of a question is a function of one or more prior responses to question blocks.

52. The method of claim 1 wherein step (a) includes the step:
(a1) specifying one or more topic-specific domains, each topic-specific domain comprising a plurality of states, the relationship between states in a topic-specific domain being characterized by a partial ordering, a test subject's relationship to a topic-specific domain being representable by an SPS (state probability set).

53. The method of claim 52 wherein the probability distribution associated with a treatment parameter is a function of an SPS of the test subject.

54. The method of claim 52 wherein in step (a) the determination to include at least one topic in the collection of topics was made by a process involving an SPS of the test subject.

55. The method of claim 52 wherein in step (d) a topic is selected based on an SPS and one or more response distributions.

56. The method of claim 52 wherein in step (e1) the selection process is based on a weighted improvement measure, an improvement measure being a measure of the difference between a first and second knowledge representation associated respectively with a first and second state in a topic-specific domain, the relationship between states in a topic-specific domain being characterized by a partial ordering.

57. The method of claim 56 wherein an improvement measure is a function of the difference in the number of facts associated with the first and second states and/or a function of the difference in corresponding quality measure values.

58. The method of claim 56 wherein an improvement measure incorporates a cost component, the cost component including costs of treatment-types and/or costs of treatments and/or costs of questions and/or costs of topics.

59. The method of claim 52 wherein partitions of states in a topic-specific domain are determined by response distributions of questions which are a function of a state in a topic-specific domain, a partition being a subset of states for which the response distributions of a question are the same or the union of such subsets, step (a1) including the steps:
(a1-1) determining the intersection of partitions for a collection of questions and;
(a1-2) replacing a first topic-specific domain configuration of states with a second topic-specific domain configuration of states, the second topic-specific domain configuration being the intersection of partitions of the first topic-specific domain configuration, the partial ordering of the second topic-specific domain configuration being derived from the partial ordering of the first topic specific domain configuration.

60. The method of claim 52 wherein in step (e1) a treatment type is selected based on one of the group consisting of (1) an SPS and (2) one or more question response distributions.

61. The method of claim 52 wherein an SPS is associated with a topic-specific domain, the SPS being updated in accordance with one or more responses to question blocks.

62. The method of claim 52 wherein in step (c) a response distribution is a function of a state in a topic-specific domain.

63. The method of claim 62 wherein there is a one-to-one correspondence between a plurality of test items and a plurality of questions, a response distribution for a test item being the same as a response distribution for a corresponding question.

64. The method of claim 52 wherein step (g) includes the step:
(g1) classifying the test subject to a state in one or more topic-specific domains.

65. The method of claim 64 wherein in step (a) at least one topic in the collection of topics is the union of one or more subsets of states higher than the state to which the test subject is classified.

66. The method of claim 64 wherein the probability distribution associated with a treatment parameter is a function of the test subject's state in a topic-specific domain.

67. The method of claim 64 wherein the classification is based on one of the group consisting of (1) one or more responses to question blocks and (2) an SPS.

68. The method of claim 64 wherein the test subject is classified to one of the group consisting of (1) the state associated with the smallest value of a weighted loss function, (2) the state of a second topic-specific domain that is equivalent to the state to which the test subject has been classified in a first topic-specific domain, and (3) the state associated with the highest value in an SPS.

69. The method of claim 64 wherein step (d) is accomplished utilizing the results of step (g1).

70. The method of claim 64 wherein in step (g) the value of a treatment parameter is a measure of effectiveness, a probability distribution associated with a treatment parameter being based on the results of step (g1).

71. The method of claim 52 wherein in step (f) the selection of the one or more question blocks is based on one of the group consisting of (1) one or more item objective functions, (2) a weighted loss function, (3) a partition measure, (4) an uncertainty measure of an SPS, (5) a distance measure between two SPSs, (6) a discrepancy measure, and (7) a function based on a precision function.

72. The method of claim 52 wherein the treatments specified in step (b) can be classified as to treatment type, step (e) comprising the steps:
(e1) selecting one or more treatment types for each topic selected in step (d) based on one or more item objective functions and;
(e2) selecting one or more treatments from each treatment type selected in step (e1).

73. The method of claim 72 wherein step (e1) is based on one of the group consisting of (1) a weighted response function, (2) a weighted reward function, (3) the highest probability of success for an associated question, (4) the highest average probability of success for a collection of associated questions and (5) a weighted treatment loss function, the treatment loss function being a function of a state in a topic-specific domain.

74. The method of claim 72 wherein treatment type selection is based on one or more responses to question blocks.

75. The method of claim 72 wherein at least one of the item objective functions is one of the group consisting of (1) a weighted loss function, (2) a partition measure, (3) an uncertainty measure of an SPS, (4) a distance measure between two SPSs, (5) a discrepancy measure, and (6) a function based on a precision function.

76. The method of claim 72 wherein a determination rule is based on one of a group consisting of (1) one or more question response distributions that are functions of a state in a topic-specific domain, and (2) an SPS with respect to a topic-specific domain with states that represent values of a treatment parameter, a treatment parameter being a measure of effectiveness in remediating a test subject.

77. The method of claim 52 wherein the treatments specified in step (b) can be classified as to treatment type, step (e) comprising the steps:

(e1) selecting one or more treatment types from a treatment-type pool for a topic selected in step (d), the number of treatment types in the treatment-type pool being limited to one if a TSP stopping rule is satisfied, the TSP stopping rule being based on one of the group consisting of (1) an SPS, (2) whether an SPS value of a state in a topic-specific domain is greater than a predetermined threshold, (3) a weighted item objective function, (4) a loss function, (5) a distance measure between two SPSs, (6) an uncertainty measure, and (7) a TSP loss function, the TSP loss function being a function of; a state in a topic-specific domain; and (e2) selecting one or more treatments from each treatment type selected in step (e1).

78. The method of claim 52 wherein states in a topic-specific domain provide information about the effectiveness.

79. The method of claim 52 wherein at least one topic-specific domain comprises states which represent values of a treatment parameter, a treatment parameter providing a measure of effectiveness.

80. The method of claim 79 wherein a first state is higher than or equal to a second state if the treatment parameter value for the first state is greater than or equal to the treatment parameter value for the second state.

81. The method of claim 79 wherein a plurality of topic-specific domains are specified, at least one of the topic-specific domains having states corresponding to treatment parameter values.

82. The method of claim 79 wherein a topic-specific domain is generated by taking the product of a topic specific domain and a topic-specific domain consisting of states associated with treatment parameter values.

83. The method of claim 79 wherein a treatment type is deleted from the treatment type pool for a topic if a treatment-type deletion rule is satisfied, a treatment-type deletion rule being based on an SPS of a topic-specific domain.

84. The method of claim 52 wherein in step (d) a topic is selected based on one or more SPSs associated with topic-specific domains.

85. The method of claim 52 wherein a topic-specific domain has a finite number of states.

86. The method of claim 52 wherein an SPS is assigned to a first topic-specific domain based on the SPS obtained for a second topic-specific domain.

87. The method of claim 1 wherein gradations of treatments are treated as separate treatments.

88. The method of claim 1 wherein a response distribution for a question is a function of an extraneous variable.

* * * * *